US010802981B2

(12) United States Patent
Ware

(10) Patent No.: US 10,802,981 B2
(45) Date of Patent: Oct. 13, 2020

(54) TECHNIQUES FOR STORING DATA AND TAGS IN DIFFERENT MEMORY ARRAYS

(71) Applicant: Rambus Inc., Sunnyvale, CA (US)

(72) Inventor: Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 553 days.

(21) Appl. No.: 15/389,402

(22) Filed: Dec. 22, 2016

(65) Prior Publication Data
US 2017/0168950 A1 Jun. 15, 2017

Related U.S. Application Data

(63) Continuation of application No. 13/880,957, filed as application No. PCT/US2011/057386 on Oct. 21, 2011, now Pat. No. 9,563,556.

(60) Provisional application No. 61/410,335, filed on Nov. 4, 2010.

(51) Int. Cl.
G06F 12/08 (2016.01)
G06F 12/0895 (2016.01)
G06F 12/0846 (2016.01)
G11C 8/06 (2006.01)
G06F 12/1027 (2016.01)
G06F 12/0802 (2016.01)

(52) U.S. Cl.
CPC ...... *G06F 12/0895* (2013.01); *G06F 12/0802* (2013.01); *G06F 12/0851* (2013.01); *G06F 12/1027* (2013.01); *G11C 8/06* (2013.01); *G06F 2212/1044* (2013.01)

(58) Field of Classification Search
CPC ... G06F 12/0893–0895; G06F 12/0846; G06F 12/0851

USPC .......................................... 711/118, 156, 154
See application file for complete search history.

(56) References Cited

U.S. PATENT DOCUMENTS

| 5,535,359 A | 7/1996 | Hata et al. |
| 5,617,347 A | 4/1997 | Lauritzen |
| 5,900,011 A | 5/1999 | Saulsbury et al. |
| 5,905,996 A | 5/1999 | Pawlowski |
| 5,905,997 A | 5/1999 | Stiles |
| 6,131,143 A | 10/2000 | Sakai |
| 6,289,420 B1 | 9/2001 | Cypher |

(Continued)

OTHER PUBLICATIONS

International Search Report and Written Opinion dated Feb. 28, 2012 in Int'l Application No. PCT/US2011/05386. 10 pages.

*Primary Examiner* — Pierre Miche Bataille
(74) *Attorney, Agent, or Firm* — Lance Kreisman; Peninsula Patent Group

(57) ABSTRACT

A memory controller includes logic circuitry to generate a first data address identifying a location in a first external memory array for storing first data, a first tag address identifying a location in a second external memory array for storing a first tag, a second data address identifying a location in the second external memory array for storing second data, and a second tag address identifying a location in the first external memory array for storing a second tag. The memory controller includes an interface that transfers the first data address and the first tag address for a first set of memory operations in the first and the second external memory arrays. The interface transfers the second data address and the second tag address for a second set of memory operations in the first and the second external memory arrays.

20 Claims, 28 Drawing Sheets

(56) References Cited

U.S. PATENT DOCUMENTS

| | | |
|---|---|---|
| 6,594,728 B1 | 7/2003 | Yeager |
| 7,389,384 B2 | 6/2008 | Van Steenwijk et al. |
| 7,606,976 B2 | 10/2009 | Raghuvanshi |
| 2002/0032838 A1* | 3/2002 | Huffman ............ G06F 12/0895 711/118 |
| 2004/0181634 A1 | 9/2004 | Taylor et al. |
| 2006/0271723 A1 | 11/2006 | Visalli et al. |

* cited by examiner

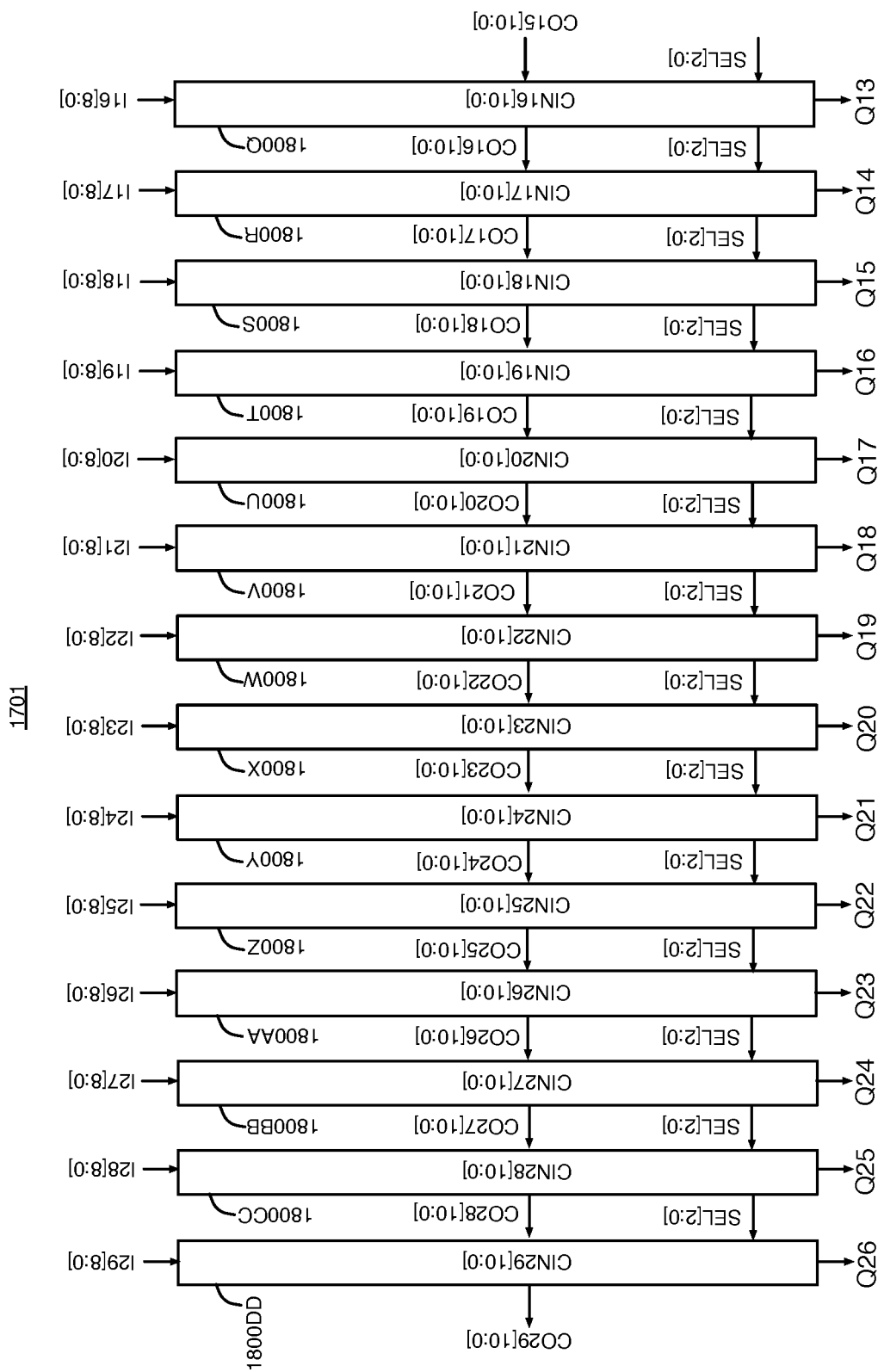

TECHNIQUES FOR STORING DATA AND TAGS IN DIFFERENT MEMORY ARRAYS

CROSS REFERENCE TO RELATED APPLICATION

This patent application is a Continuation of U.S. Ser. No. 13/880,957, filed Apr. 22, 2013, entitled "Techniques for Storing Data and Tags in Different Memory Arrays" which claims priority from International Application No. PCT/US2011/057386, which claims the benefit of U.S. provisional patent application 61/410,335, filed Nov. 4, 2010, all of which are incorporated by reference herein in their entireties.

BACKGROUND

This disclosure relates to electronic circuits, and more particularly, to techniques for storing data and tags in different memory arrays.

In some computing systems, a processor utilizes a memory hierarchy that includes one or more levels of cache memory and a main memory. In an example system, the cache memory stores copies of the data stored in the main memory that are most frequently used by the processor. If most of the memory accesses initiated by the processor are accesses to data stored in memory locations in the cache memory, the average latency of memory accesses is closer to the latency of the cache memory than to the latency of the main memory. When the processor issues a request to read data from a location in the main memory, the processor first determines if a copy of the data is stored in the cache memory. If a copy of the data is stored in the cache memory, the processor reads the data from the cache memory, which is typically faster than reading the data from the main memory.

Implementing a cache memory having a large storage capacity, may result in associated tag circuits for identifying data stored in the cache memory also having a relatively large storage capacity. Thus, the tag circuits may consume a significant amount of die area.

BRIEF DESCRIPTION OF THE DRAWINGS

FIGS. 20A-20C illustrate details of the divide by K circuit shown in FIG. 17.

DETAILED DESCRIPTION

According to some embodiments, a memory controller includes logic circuitry to generate a first data address identifying a location in a first external memory array for storing first data, a first tag address identifying a location in a second external memory array for storing a first tag, a second data address identifying a location in the second external memory array for storing second data, and a second tag address identifying a location in the first external memory array for storing a second tag. The memory controller includes an interface that transfers the first data address and the first tag address for a first set of memory operations in the first and the second external memory arrays. The interface transfers the second data address and the second tag address for a second set of memory operations in the first and the second external memory arrays.

The first and the second memory arrays may be in a single memory integrated circuit or in different memory integrated circuits. If the first and the second memory arrays are in a single memory integrated circuit, the memory integrated circuit includes an interface to receive the first data address identifying a location in the first memory array for storing the first data, the first tag address identifying a location in the second memory array for storing the first tag, the second data address identifying a location in the second memory array for storing the second data, and the second tag address identifying a location in the first memory array for storing the second tag. The memory integrated circuit accesses the first data and the first tag in a first set of memory operations. The memory integrated circuit accesses the second data and the second tag in a second set of memory operations.

Figure 1A:
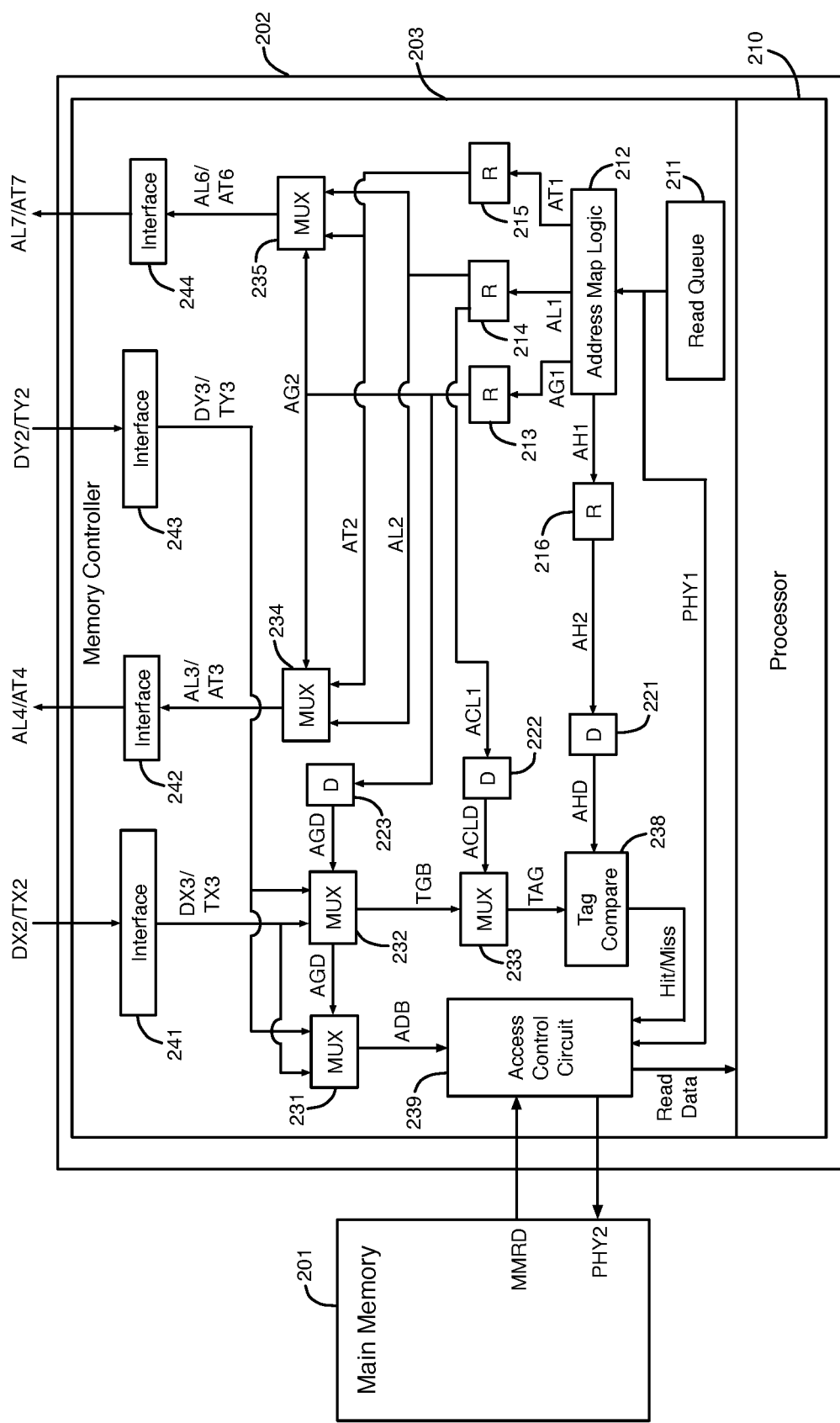
FIGS. 1A and 1B illustrate an example of a system that stores data and tags for the data in cache memory.
Figure 1B:
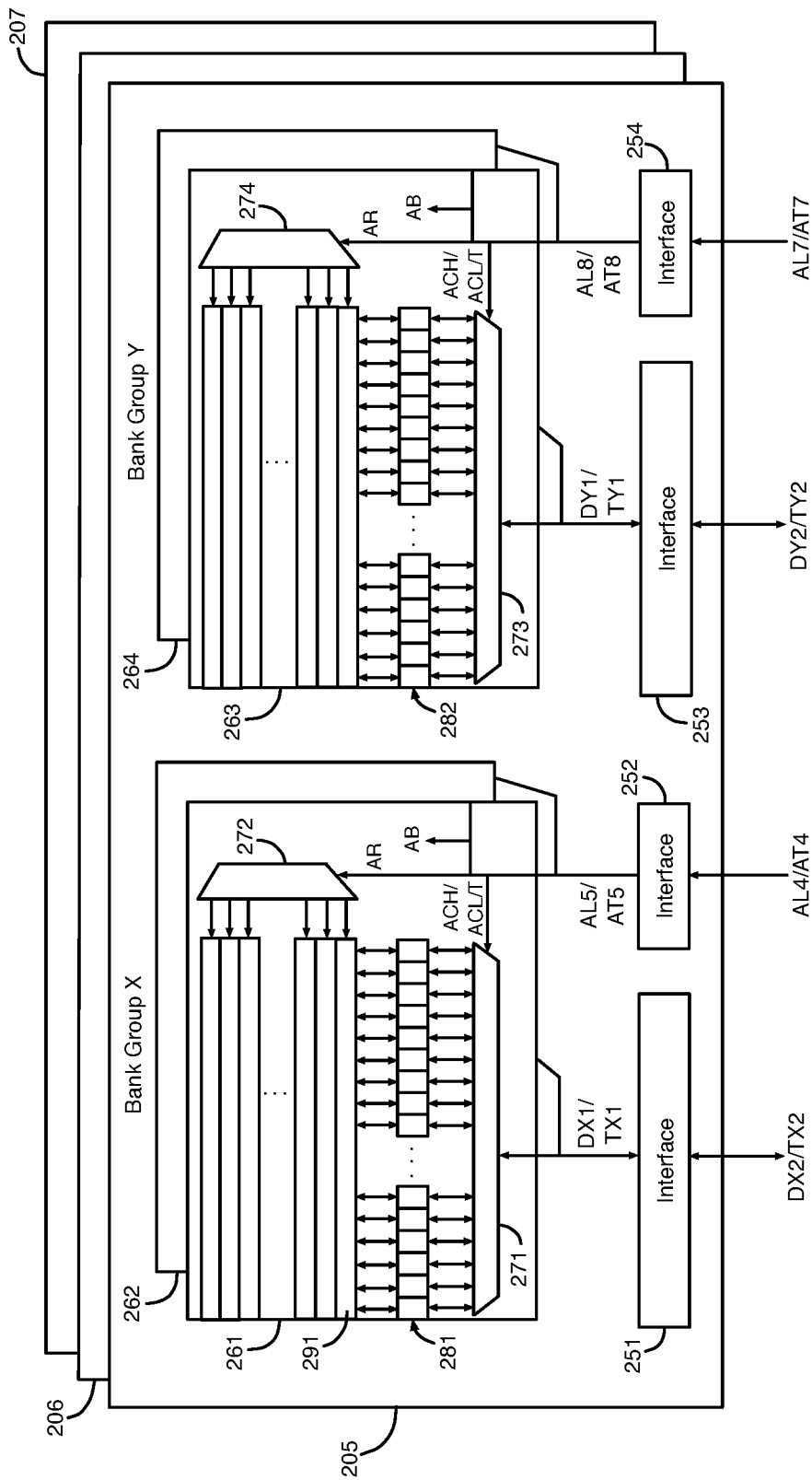

FIGS. 1A and 1B illustrate an example of a system that stores data and tags for the data in cache memory. Each of the tags identifies the location of a block of data (i.e., a data block) stored in main memory. In some embodiments, each data block and the tag associated with each data block are stored in different arrays of memory cells in cache memory.

Figure 2:
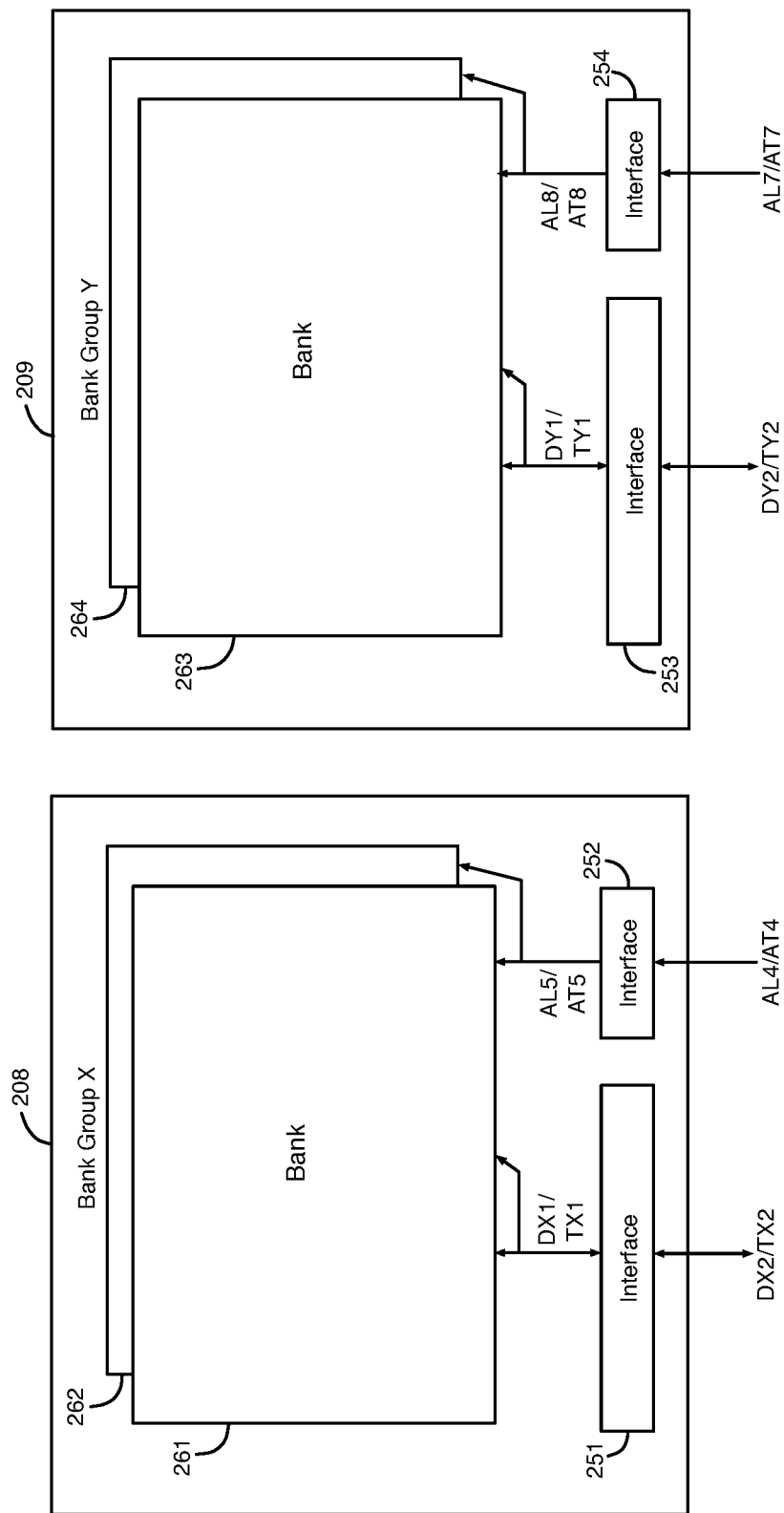
FIG. 2 illustrates an alternative embodiment in which bank groups of memory cells are located in two separate memory integrated circuits.

FIG. 1A illustrates a memory integrated circuit 201 and a processor integrated circuit 202. FIG. 1B illustrates 3 memory integrated circuits 205-207. Each of the memory integrated circuits 201 and 205-207 includes memory cells such as, volatile memory cells, non-volatile memory cells, or any combination of volatile and non-volatile memory cells. FIG. 2 illustrates an embodiment in which bank groups of memory cell circuits are located in two separate memory integrated circuits 208-209.

The memory cells may include any memory cell technology such as, for example, DRAM, SRAM, flash, etc. As more specific examples, the memory integrated circuits described herein may be DDR SDRAM, XDR, or Mobile XDR devices.

Memory integrated circuit 201 functions as main memory for processor integrated circuit 202. Memory integrated circuits 205-207 function as cache memory for processor integrated circuit 202. Processor integrated circuit 202 stores data in and accesses data from memory integrated circuits 201 and 205-207. Memory integrated circuits 205-207 store copies of the data stored in memory integrated circuit 201 that are most frequently used by processor integrated circuit 202.

In various embodiments described herein, data is transmitted between the processor integrated circuits and the cache memory integrated circuits in less time than data is transmitted between the processor integrated circuits and the main memory integrated circuits. The connections between the integrated circuits may support single-ended or differential signaling.

In an embodiment, processor integrated circuit 202 may be directly connected to memory integrated circuits 205-207 through solder bumps. Alternatively, processor integrated circuit 202 may be connected to memory integrated circuits 205-207 through wire bonds. Processor integrated circuit 202 may, for example, be connected to memory integrated circuit 201 through connections on a circuit board. Processor integrated circuit 202 accesses the most frequently used data from memory integrated circuits 205-207 to reduce data access times.

Processor integrated circuit 202 includes a processor core 210 and a memory controller circuit 203. For example, a system-on-chip (SoC) may include one or more processor cores, memory controller circuits, and other cores and interfaces, depending on the intended application. The functionality of memory controller circuit 203 may be implemented in an integrated circuit that does not include processor core 210, and may include an interface to a separate processor integrated circuit that includes one or more processor cores 210. As described herein, any integrated circuit device that controls the operation of and includes an interface to communicate with one or more memory integrated circuits (e.g., a processor chip or SoC) can be referred to as a memory controller (or controller device). For example, a processor or controller device is an integrated circuit that includes memory controller circuit 203. FIG. 1A illustrates circuitry in memory controller 203 that is utilized during read transactions. Each read transaction issued by processor integrated circuit 202 is a request to access data stored in one of memory integrated circuits 201 or 205-207.

Memory controller circuit 203 includes read queue circuit 211, address map logic 212, registers 213-216, delay circuits 221-223, multiplexer circuits 231-235, tag compare circuit 238, access control circuit 239, and interface circuits 241-244. Each of the interface circuits described herein may, for example, include one or multiple pins as well as buffers and storage circuits (e.g., flip-flops). The pins are external terminals of the integrated circuit. The storage circuits store signals transmitted through the pins by the buffers.

The memory cells in each of memory integrated circuits 205-207 are arranged in banks, and the banks of memory cells are arranged in bank groups. Each memory integrated circuit 205-207 has one or more bank groups. Each bank group operates independently and has separate address and data interfaces. Each bank group has multiple banks. A memory transaction occupies one bank group for a period of time, which operates in a pipelined fashion. A number of staggered data access operations can be in progress in a bank group at any time.

As an example, memory integrated circuit 205 includes banks 261-264 and interface circuits 251-254. Each of the banks 261-264 includes arrays of memory cells. The memory cells in the arrays are arranged in rows and columns. Bank 261, for example, includes row 291 of memory cells. In an embodiment, each of the rows has a memory capacity equal to a power-of-two number of bits. Banks 261-262 are arranged in bank group X, and banks 263-264 are arranged in bank group Y. Each of memory integrated circuits 205-207 can include any number of bank groups and any number of banks in each of the bank groups. Two bank groups X-Y and two banks in each of bank groups X-Y are shown in FIG. 1B merely as an example. According to an alternative embodiment, bank groups X and Y are each rotated 90 degrees on cache memory integrated circuit 205 and are oriented vertically relative to each other rather than horizontally as shown in FIG. 1B.

Examples of read transactions are illustrated with respect to FIGS. 1A-1B. After processor core 210 issues a read transaction, memory controller circuit 203, for example, determines that data is stored in one of memory integrated circuits 205-207. During a read transaction, processor core 210 provides a physical address for the read transaction to read queue circuit 211. The physical address for the read transaction corresponds to an address where the requested data is stored in main memory integrated circuit 201. The physical address is stored in read queue circuit 211 and is provided to address map logic circuit 212 as signals PHY1. Address map logic circuit 212 maps the physical address into a mapped address that includes an upper address ATH and a lower address ATL.

The lower address ATL includes multiple subsets of addresses. The lower address ATL includes addresses AD, AG, AB, AR, ACH, and ACL. Addresses AD, AG, AB, and AR identify the device, bank group, bank, and row, respectively, of memory cells in the cache memory. The device address AD identifies one of the cache memory integrated circuits 205-207. Addresses ACH and ACL identify a column in cache memory. Address ACH indicates a high column address, and address ACL indicates a low column address.

In an embodiment, the mapped addresses generated by address map logic circuit 212 also include an additional low column address T indicating where a tag block associated with the requested data is stored in cache memory. The tag block contains a tag that may or may not match the upper addresses ATH of the requested data. Addresses AD, AG, AB, AR, ACH, and T identify the device, bank group, bank, row, high column, and low column, respectively, where the tag block is stored in cache memory. Address T is selected to identify the low column address reserved for storing the tag block in cache memory. Address T has the same value regardless of the physical address of the requested data. As an example, the low column address T for the tag block is 7 or binary 111. Address T can have other values in other embodiments.

Address AG is provided to register 213 as signals AG1. Signals AG1 are stored in register 213. Addresses AD, AB, AR, ACH, and ACL are provided to register 214 as signals ALE Signals AL1 are stored in register 214. Addresses AD, AB, AR, ACH, and T are provided to register 215 as signals AT1. Signals AT1 are stored in register 215. The upper address ATH is provided to register 216 as signals AH1. Signals AH1 are stored in register 216.

Address AG is provided from register 213 to select inputs of multiplexer circuits 234-235 as signals AG2. Addresses AD, AB, AR, ACH, and ACL are provided from register 214 to a first set of multiplexing inputs of each of multiplexer circuits 234-235 as signals AL2. Addresses AD, AB, AR, ACH, and T are provided from register 215 to a second set of multiplexing inputs of each of multiplexer circuits 234-235 as signals AT2.

In the embodiments described herein, each data block and the tag associated with the data block are stored in different bank groups of memory cells within the cache memory. For example, the tags for the data blocks stored in bank group X in memory integrated circuit 205 are stored in bank group Y in memory integrated circuit 205, and the tags for the data blocks stored in bank group Y in memory integrated circuit 205 are stored in bank group X in memory integrated circuit 205.

Figure 3:
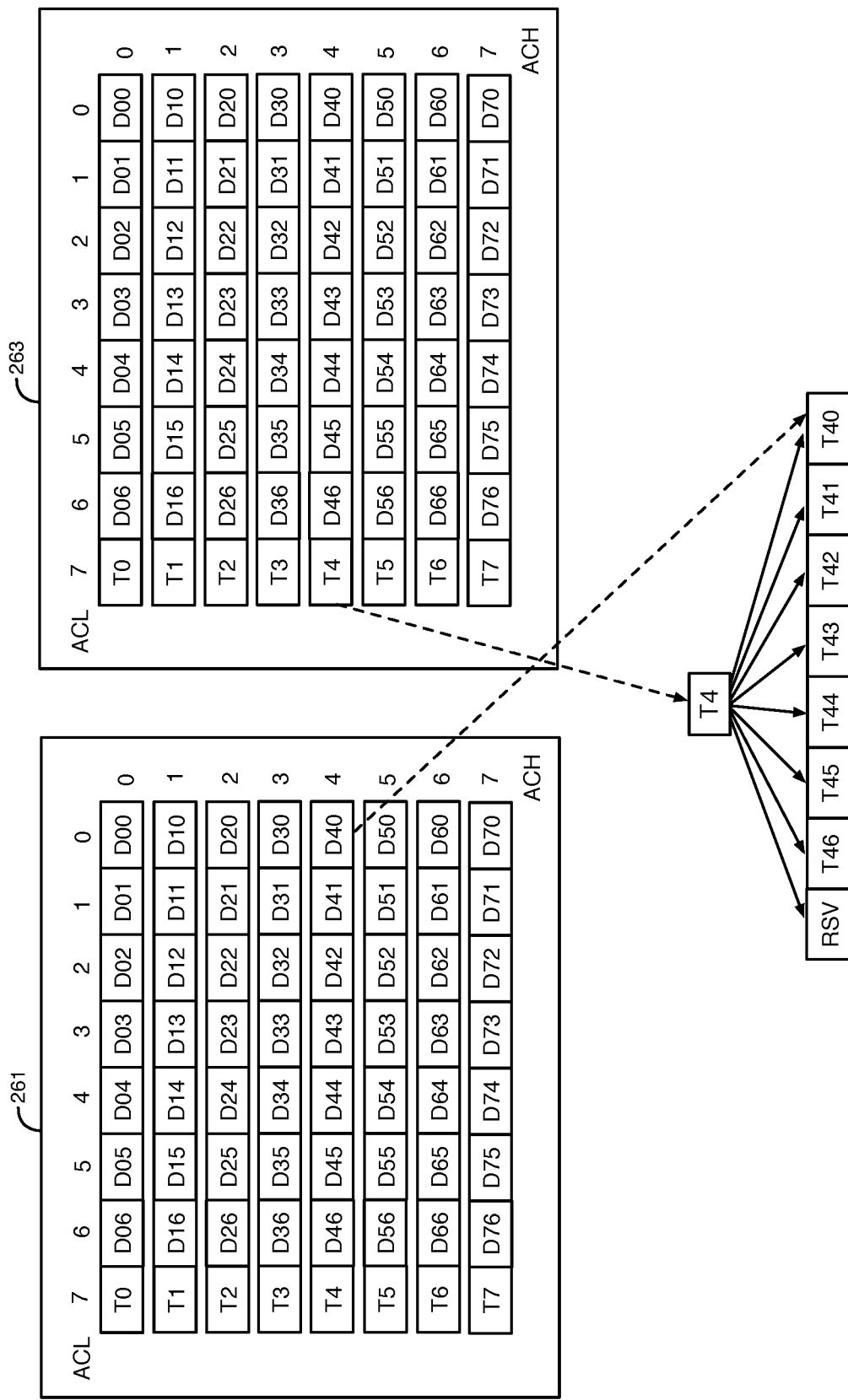
FIG. 3 illustrates an example of a technique for storing data blocks and tags in cache memory.

FIG. 3 illustrates an example of a technique for storing data blocks and tags in cache memory. FIG. 3 shows a portion of banks 261 and 263 in memory integrated circuit 205. Banks 261 and 263 each store 56 data blocks D00-D06, D10-D16, D20-D26, D30-D36, D40-D46, D50-D56, D60-D66, and D70-D76 and 8 tag blocks T0-T7. Values for the high column address ACH (0-7) and the low column address ACL (0-7) are shown in FIG. 3 for the data blocks. The data blocks in FIG. 3 are referred to by the notation DHL, where the first number H refers to the high column address ACH, and the second number L refers to the low column address ACL. For example, the high column address ACH for data block D53 has a value of 5, and the low column address ACL for data block D53 has a value of 3.

The tag blocks T0-T7 in bank 261 identify the upper addresses ATH for data blocks D00-D06, D10-D16, D20-D26, D30-D36, D40-D46, D50-D56, D60-D66, and D70-D76, respectively, in bank 263. The tag blocks T0-T7 in bank 263 identify the upper addresses ATH for data blocks D00-D06, D10-D16, D20-D26, D30-D36, D40-D46, D50-D56, D60-D66, and D70-D76, respectively, in bank 261. Each tag block identifies the upper addresses for 7 data blocks in the embodiment of FIG. 3. According to various embodiments, each tag block identifies upper addresses for any suitable number of data blocks, for example, 15, 31, or 63 data blocks.

Each of the tag blocks stored in cache memory includes multiple tags. Each of the tags in FIG. 3 is referred to by the notation THL, where the first number H refers to the high column address ACH for the data block corresponding to the tag, and the second number L refers to the low column address ACL for the data block corresponding to the tag.

Addresses AD, AB, and AR also indicate the device, the bank, and the row, respectively, where the tag for the requested data block is stored in cache memory. Addresses ACH and T indicate the high and low column addresses, respectively, where the tag for the requested data is stored in cache memory. In the embodiment of FIG. 3, address T has a value of 7, because the low column address indicating where the tag blocks are stored in each of the banks in the cache memory is 7 in this example.

Each of the 8 tag blocks T0-T7 in each bank 261 and 263 includes 7 tags that identify the upper addresses ATH for 7 data blocks. In the example of FIG. 3, tag block T4 includes 7 tags T40-T46 and reserved storage space RSV. The tags T40-T46 in bank 263 identify the upper addresses ATH for the data blocks D40-D46, respectively, in bank 261, as shown in FIG. 3. The tags T40-T46 in bank 261 identify the upper addresses ATH for the data blocks D40-D46, respectively, in bank 263.

It should be understood that FIG. 3 illustrates merely one example of a technique for storing data blocks and tags in cache memory. Other techniques for storing data blocks and tags in cache memory can be used with the embodiments described herein. In an alternative embodiment, the data blocks and the tags are located in two different banks in each bank group. For example, in a bank group having 16 banks numbered 0-15, banks 0-14 store data blocks (7/8 of the banks), and banks 14-15 store tags (1/8 of the banks). In another embodiment, the data blocks and the tags are stored in different rows of a bank. For example, in a bank having 1024 rows numbered 0-1023, rows 0-895 store data blocks (7/8 of the rows), and rows 896-1023 store tags (1/8 of the rows).

An example of how processor integrated circuit 202 accesses data from cache memory during a read transaction is now described. If address AG identifies bank group X, multiplexer circuits 234 provide the values of signals AL2 to interface circuit 242 as signals AL3. If address AD identifies memory integrated circuit 205, interface circuit 242 transmits addresses AB, AR, ACH, and ACL to interface circuit 252 in memory integrated circuit 205 as signals AL4. Interface circuit 252 provides the values of signals AL4 to bank group X as signals AL5. Bank group X accesses data from the memory cells identified by the addresses AB, AR, ACH, and ACL as indicated by signals AL5.

For example, if address AB indicates that the data is stored in bank 261 in bank group X, addresses ACH and ACL are provided to column decoder circuit 271 in bank 261, and address AR is provided to row decoder circuit 272 in bank 261. Row decoder circuit 272 selects the row of memory cells in bank 261 identified by address AR. Bank 261 contains sense amplifiers 281. Sense amplifiers 281 sense and latch data from the selected row of memory cells in bank 261. Column decoder 271 selects contents of the sense amplifiers 281, based on column addresses ACH and ACL for the read (or write) transaction. The data accessed from the memory cells in the selected row and the selected column is provided to interface circuit 251 as signals DX1.

In some embodiments, the interface circuits 241-244 perform serialization and deserialization of the data, tag, and address information transmitted between the circuitry in processor integrated circuit 202 and memory integrated circuits 205-207. The serialization ratio performed by interface circuits 241-244 on the data, tag, and address information can be adjusted independently without affecting the other portions of the system of FIGS. 1A-1B.

Interface circuit 251 transmits the accessed data block to interface circuit 241 in processor integrated circuit 202 as signals DX2. Interface circuit 241 provides the accessed data block to a first set of multiplexing inputs of each of multiplexer circuits 231-232 as signals DX3. Address AG is provided from register 213 to inputs of delay circuit 223 as signals AG2. Delay circuit 223 delays signals AG2 received from register 213 to generate delayed address signals AGD. The delay that delay circuit 223 provides to the delayed address signals AGD matches the delay to access a data block from memory integrated circuit 205 in response to addresses AB, AR, ACH, and ACL. The delayed address signals AGD have the same values as the signals AG2 stored in register 213. The delayed address signals AGD are provided to the select inputs of multiplexers 231-232. The delayed address signals AGD cause multiplexer circuits 231 to select signals DX3 and to provide the accessed data block from interface circuit 241 to inputs of access control circuit 239 as signals ADB.

If address AG identifies bank group X, multiplexer circuits 235 provide addresses AD, AB, AR, ACH, and T to interface circuit 244 as signals AT6. If address signals AD identify memory integrated circuit 205, interface circuit 244 transmits addresses AB, AR, ACH, and T to interface circuit 254 in memory integrated circuit 205 as signals AT7. Interface circuit 254 provides addresses AB, AR, ACH, and T to bank group Y as signals AT8. Bank group Y accesses the tag block from the memory cells that are identified by the addresses AB, AR, ACH, and T as indicated by signals AT8.

For example, if address AB identifies bank 263 in bank group Y, addresses ACH and T are provided to column decoder circuit 273 in bank 263, and address AR is provided to row decoder circuit 274 in bank 263. Row decoder circuit 274 selects the row of memory cells in bank 263 identified by address AR. Bank 263 contains sense amplifiers 282 that are associated with the columns of memory cells in bank 263. Sense amplifiers 282 sense and latch the tag block from the selected row of memory cells in bank 263. Column decoder 273 selects contents of the sense amplifiers 282, based on the column addresses ACH and T for the read transaction. Column decoder circuit 273 provides the tag block from the memory cells in the selected row and the selected column to interface circuit 253 as signals TY1.

Interface circuit 253 transmits the tag block to interface circuit 243 in processor integrated circuit 202 as signals TY2. Interface circuit 243 provides the tag block to a second set of multiplexing inputs of each of multiplexer circuits 231-232 as signals TY3. The delayed address signals AGD cause multiplexer circuits 232 to provide the tag block as indicated by signals TY3 to the multiplexing inputs of multiplexer circuits 233 as signals TGB.

Signals ACL1 that indicate the value of low address ACL are provided from register 214 to inputs of delay circuit 222. Delay circuit 222 delays signals ACL1 to generate delayed address signals ACLD. The delay that delay circuit 222 provides to the delayed address signals ACLD matches the delay to access the tag block from memory integrated circuit 205 in response to addresses AB, AR, ACH, and T. The delayed address signals ACLD have the same values as the low address ACL stored in register 214. Delayed address signals ACLD are provided to select inputs of multiplexer circuits 233. Multiplexer circuits 233 select the tag in the tag block represented by signals TGB that matches low column address ACL. Multiplexer circuits 233 provide the selected tag to inputs of tag compare circuit 238 as signals TAG.

Signals AH2 representing the upper address ATH of the requested data block are provided from register 216 to inputs of delay circuit 221. Delay circuit 221 delays signals AH2 to generate delayed address signals AHD. The delay that delay circuit 221 provides to the delayed address signals AHD matches the delay to access the tag from cache memory in response to addresses AB, AR, ACH, and T. The delayed address signals AHD have the same values as the upper address ATH stored in register 216. The delayed address signals AHD are provided to inputs of tag compare circuit 238.

Tag compare circuit 238 compares signals TAG representing the tag for the data block accessed from bank 261 to the delayed address signals AHD. If signals TAG match the delayed address signals AHD, tag compare circuit 238 generates a Hit state in a Hit/Miss signal indicating that the data block accessed from bank 261 in memory integrated circuit 205 matches the data block requested in the read transaction. The Hit/Miss signal is provided to an input of access control circuit 239. The signals PHY1 indicating the physical address of the requested data in the main memory are also provided to inputs of access control circuit 239 from read queue circuit 211. If access control circuit 239 receives the Hit state in the Hit/Miss signal after receiving a new set of signals PHY1, access control circuit 239 provides signals ADB that represent the data block accessed from memory integrated circuit 205 as the Read Data signals. The Read Data signals indicate the read data requested by processor core 210.

If the tag signals TAG do not match the delayed address signals AHD, tag compare circuit 238 generates a Miss state in the Hit/Miss signal indicating that the data block accessed from bank 261 in memory integrated circuit 205 does not match the data block requested by the read transaction. If access control circuit 239 receives the Miss state in the Hit/Miss signal after receiving a new set of physical address signals PHY1, access control circuit 239 provides the physical address to main memory integrated circuit 201 as signals PHY2. In response to receiving signals PHY2 from access control circuit 239, main memory integrated circuit 201 provides the requested data block to access control circuit 239 as signals MMRD. Access control circuit 239 then provides the data block received from main memory integrated circuit 201 as the Read Data signals.

Processor integrated circuit 202 also stores the data block received from main memory integrated circuit 201 as signals MMRD in memory integrated circuit 205 in a write transaction. Examples of write transactions are described below with respect to FIG. 5. If processor core 210 subsequently requests the same data block again, the data block is accessed from cache memory integrated circuit 205 in less time than the data block can be accessed from main memory integrated circuit 201.

Another example of processor integrated circuit 202 accessing data from cache memory is now described. In this example, address AG identifies bank group Y, and multiplexer circuits 235 provide addresses AD, AB, AR, ACH, and ACL as indicated by signals AL2 to interface circuit 244 as signals AL6. If address AD identifies memory integrated circuit 205, interface circuit 244 transmits addresses AB, AR, ACH, and ACL to interface circuit 254 in memory integrated circuit 205 as signals AL7. Addresses AB, AR, ACH, and ACL are provided from interface circuit 254 to bank group Y as signals AL8. Memory integrated circuit 205 accesses a data block from memory cells in bank group Y based on the addresses AB, AR, ACH, and ACL indicated by signals AL8 and provides the accessed data block to interface circuit 253 as signals DY1. The accessed data block is transmitted from interface circuit 253 to interface circuit 243 in processor integrated circuit 202 as signals DY2. Interface circuit 243 provides the accessed data block to the first sets of multiplexing inputs of multiplexer circuits 231-232 as signals DY3.

Multiplexer circuits 234 provide the addresses AD, AB, AR, ACH, and T indicated by signals AT2 to interface circuit 242 as signals AT3. Interface circuit 242 transmits addresses AB, AR, ACH, and T as signals AT4 to interface circuit 252 in memory integrated circuit 205 based on address AD. Interface circuit 252 provides the addresses AB, AR, ACH, and T indicated by signals AT4 to bank group X as signals AT5. Memory integrated circuit 205 accesses a tag block from bank group X at the memory address identified by signals AT5. The accessed tag block contains a tag for the data block accessed from bank group Y as signals DY1. Memory integrated circuit 205 provides the accessed tag block to interface circuit 251 as signals TX1. Interface circuit 251 transmits the accessed tag block to interface circuit 241 in processor integrated circuit 202 as signals TX2. Interface circuit 241 provides the accessed tag block to the second sets of multiplexing inputs of multiplexer circuits 231-232 as signals TX3.

Multiplexer circuits 231 select signals DY3 and provide the accessed data block from interface circuit 243 to access control circuit 239 as signals ADB in response to the delayed address signals AGD. Multiplexer circuits 232 select signals TX3 and provide the accessed tag block to multiplexer circuits 233 as signals TGB in response to the delayed address signals AGD. Multiplexer circuits 233 select signals TAG from among signals TGB based on the low column address indicated by the delayed address signals ACLD. Signals TAG represent the tag corresponding to the accessed data block indicated by signals DY3. As described above, tag compare circuit 238 compares signals TAG to signals AHD to generate the Hit/Miss signal. If access control circuit 239 receives the Hit state in the Hit/Miss signal after receiving a new set of signals PHY1, access control circuit 239 provides the data signals ADB accessed from cache memory integrated circuit 205 as the Read Data signals. If access control circuit 239 receives the Miss state in the Hit/Miss signal after receiving a new set of signals PHY1, access control circuit 239 accesses the requested read data from memory integrated circuit 201, as described above.

In an alternative embodiment, bank groups X and Y are in different memory integrated circuits 208-209, respectively, as shown in FIG. 2. In the embodiment of FIG. 2, banks 261-262 and interface circuits 251-252 are located in memory integrated circuit 208, and banks 263-264 and interface circuits 253-254 are located in memory integrated circuit 209. The circuitry in integrated circuits 208-209 functions as described above with respect to integrated circuit 205 in FIG. 1B.

Figure 4:
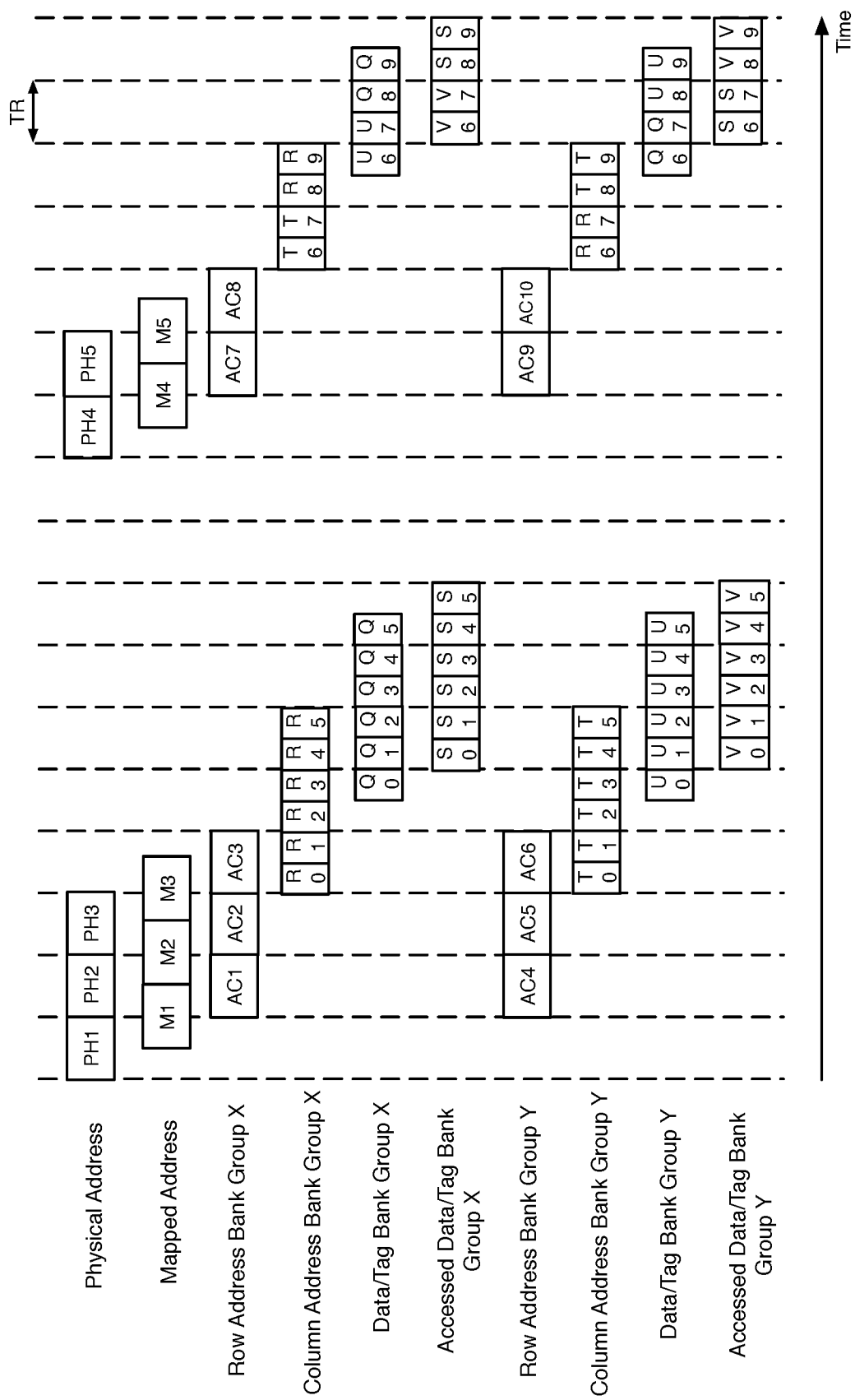
FIG. 4 is a diagram that illustrates examples of the timing of operations performed when the processor integrated circuit shown in FIG. 1A accesses data from one or more of the cache memory integrated circuits shown in FIG. 1B during read transactions.

FIG. 4 is a diagram that illustrates examples of the timing of operations performed when processor integrated circuit 202 shown in FIG. 1A accesses data from cache memory integrated circuit 205 shown in FIG. 1B during read transactions. FIG. 4 shows read transactions that are pipelined in the sense that additional read transactions are issued by processor core 210 before read transactions that were previously issued by processor core 210 have been completed.

The time intervals TR between the vertical dotted lines in FIG. 4 are defined by the periods of a clock signal. The time interval TR represents the minimum time interval between successive activate row commands directed to a bank group. An activate row command is issued to an idle bank that has been pre-charged.

The labels shown in each horizontal row of FIG. 4 are now described. The Physical Address is indicated by signals PHY1 in FIG. 1A. The Mapped Address is indicated by signals AG1, AL1, and AT1 in FIG. 1A. Row Address Bank Group X refers to the bank group, bank, and row addresses indicated by signals AL4/AT4 in FIGS. 1A-1B and 2. Column Address Bank Group X refers to the bank group, bank, high column, and low column addresses indicated by signals AL4/AT4 in FIGS. 1A-1B and 2. Data/Tag Bank Group X refers to data block or tag indicated by signals DX2/TX2 in FIGS. 1A-1B and 2. Accessed Data/Tag Bank Group X refers to the data block indicated by signals ADB or the tag indicated by signals TGB in FIG. 1A. Row Address Bank Group Y refers to the bank group, bank, and row addresses indicated by signals AL7/AT7 in FIGS. 1A-1B and 2. Column Address Bank Group Y refers to the bank group, bank, high column, and low column addresses indicated by signals AL7/AT7 in FIGS. 1A-1B and 2. Data/Tag Bank Group Y refers to the data block or tag indicated by signals DY2/TY2 in FIGS. 1A-1B and 2. Accessed Data/Tag Bank Group Y refers to the data block indicated by signals ADB or the tag indicated by signals TGB in FIG. 1A.

The operations shown in each horizontal row in FIG. 4 are pipelined. Operations in multiple horizontal rows are part of the same transactions. As an example, operations AC1, R0-R1, Q0-Q1, and S0-S1 are operations for a single column data read operation to bank group X. As another example, operations AC4, T0-T1, U0-U1, and V0-V1 are operations for a single column tag read operation to bank group Y.

In the example of FIG. 4, processor core 210 issues three consecutive read transactions 1-3 that each request data stored in bank group X in memory integrated circuit 205. Read queue circuit 211 provides physical addresses for read transactions 1-3 to address map logic 212 in operations PH1, PH2, and PH3, respectively. Map address logic 212 provides mapped addresses ATH, AD, AG, AB, AR, ACH, ACL, and T to registers 213-216 as described above with respect to FIGS. 1A-1B for read transactions 1-3 in operations M1, M2, and M3 in response to the physical addresses provided in operations PH1, PH2, and PH3, respectively.

When the bank in bank group X identified by the bank address AB receives the lower address ATL, the bank performs an activate function for the row indicated by row address AR. The banks in bank group X perform the activate functions to access data blocks for read transactions 1-3 in operations AC1, AC2, and AC3 in response to receiving the mapped addresses generated during operations M1-M3, respectively.

The banks in bank group X select the columns where the stored data blocks will be accessed in operations R0-R1, R2-R3, and R4-R5 in response to the column addresses ACH and ACL generated during operations M1-M3, respectively. In the embodiment of FIG. 4, each bank of memory cells accesses data or tags from two different columns in each read transaction. In each operation R0-R5, a different column is selected. As an example, the first column address accessed in each read transaction may be indicated by column addresses ACH and ACL, and the second column address accessed in each read transaction may be indicated by column addresses ACH and ACL+1.

The data blocks for read transactions 1-3 are accessed from bank group X in operations Q0-Q1, Q2-Q3, and Q4-Q5, respectively. In each of the 6 operations Q0-Q5, data is accessed from a different column. The data blocks accessed in operations Q0-Q1, Q2-Q3, and Q4-Q5 are provided to processor integrated circuit 202 in operations S0-S1, S2-S3, and S4-S5, respectively.

The banks in bank group Y identified by bank addresses AB perform the activate functions to access the tag blocks for the three read transactions 1-3 in operations AC4, AC5, and AC6 in response to receiving the mapped addresses generated during operations M1-M3, respectively. The banks in bank group Y select the columns where the tag blocks will be accessed in operations T0-T1, T2-T3, and T4-T5 in response to the column addresses ACH and T generated during operations M1-M3, respectively. In each of the 6 operations T0-T5, a different column is selected. The tag blocks for read transactions 1-3 are accessed from bank group Y in operations U0-U1, U2-U3, and U4-U5, respectively. In each operation U0-U5, a tag block is accessed from a different column. The tag blocks accessed in operations U0-U1, U2-U3, and U4-U5 are provided to processor integrated circuit 202 in operations V0-V1, V2-V3, and V4-V5, respectively.

In the example of FIG. 4, processor integrated circuit 202 issues two additional consecutive read transactions 4-5. During read transactions 4-5, data stored in bank groups Y and X, respectively, are accessed from memory integrated circuit 205. Read queue circuit 211 provides physical addresses for read transactions 4-5 to address map logic 212 in operations PH4-PH5, respectively. Map address logic 212 provides mapped addresses ATH, AD, AG, AB, AR, ACH, ACL, and T to registers 213-216 as described above with respect to FIGS. 1A-1B for read transactions 4-5 in operations M4-M5 in response to the physical addresses provided in operations PH4-PH5, respectively.

The banks in bank groups Y and X identified by bank addresses AB perform the activate functions to access data blocks for read transactions 4-5 in operations AC9 and AC8 in response to receiving the mapped addresses generated during operations M4-M5, respectively. The banks in bank groups Y and X select the columns where the stored data blocks will be accessed in operations R6-R7 and R8-R9 in response to the column addresses ACH and ACL generated during operations M4-M5, respectively. The data blocks for read transactions 4-5 are accessed from bank groups Y and X in operations Q6-Q7 and Q8-Q9, respectively. The data blocks accessed in operations Q6-Q7 and Q8-Q9 are provided to processor integrated circuit 202 in operations S6-S7 and S8-S9, respectively.

The banks in bank groups X and Y identified by bank addresses AB perform the activate functions to access the tag blocks for read transactions 4-5 in operations AC7 and AC10 in response to receiving the mapped addresses generated during operations M4-M5, respectively. The banks in bank groups X and Y select the columns where the stored tag blocks will be accessed in operations T6-T7 and T8-T9 in response to the column addresses ACH and T generated during operations M4-M5, respectively. The tag blocks for read transactions 4-5 are accessed from bank groups X and Y in operations U6-U7 and U8-U9, respectively. The tag blocks accessed in operations U6-U7 and U8-U9 are provided to processor integrated circuit 202 in operations V6-V7 and V8-V9, respectively.

Figure 5:
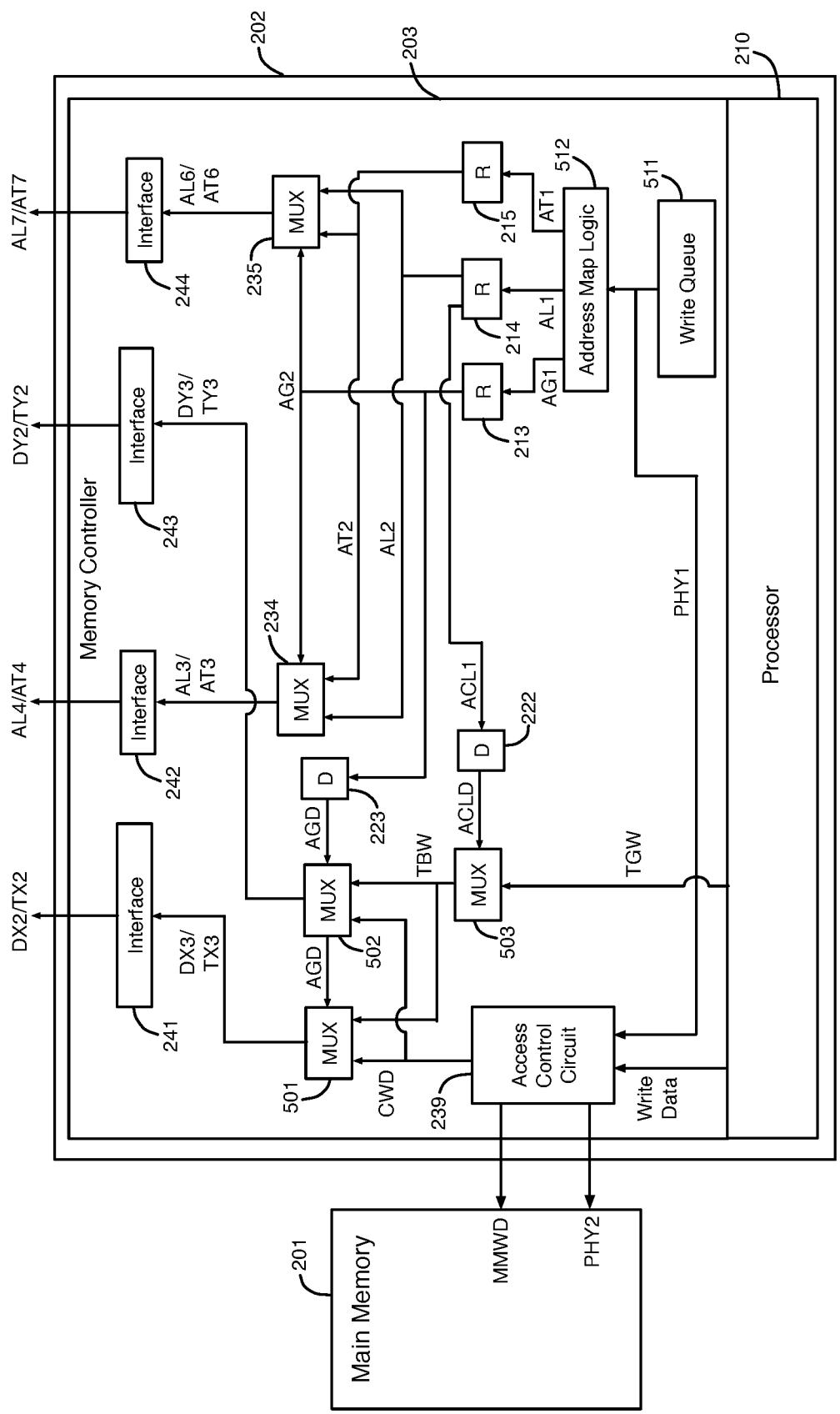
FIG. 5 illustrates an example of circuitry in a processor integrated circuit that is used to write data to an external cache memory during write transactions according to a write through policy.

FIG. 5 illustrates an example of circuitry in processor integrated circuit 202 that is used to write data to an external cache memory during write transactions according to a write through policy. In the example of FIG. 5, processor integrated circuit 202 includes multiplexer circuits 501-503, write queue circuit 511, and address map logic 512 in addition to the circuitry shown in FIG. 1A. Some of the circuits shown in FIG. 1A are not shown in FIG. 5.

Examples of write transactions performed according to a write through policy are now discussed in connection with FIG. 5. When implementing write transactions using a write through policy, memory controller circuit 203 stores each data block for a write transaction in main memory integrated circuit 201 and in cache memory in one of memory integrated circuits 205-207. Data blocks stored in the cache memory that are erased during write transactions are maintained in storage in main memory integrated circuit 201.

After processor core 210 issues a write transaction, processor core 210 provides a physical address for the write transaction to write queue circuit 511. The physical address is an address in main memory integrated circuit 201 where the data block for the write transaction will be stored. Signals PHY1 identifying the physical address are provided to access control circuit 239. Access control circuit 239 provides the physical address to memory integrated circuit 201 as signals PHY2. Access control circuit 239 receives Write Data signals for the write transaction from processor core 210. The Write Data signals identify a data block that will be stored in the main and cache memory integrated circuits. Access control circuit 239 provides the data block to memory integrated circuit 201 as signals MMWD. Memory integrated circuit 201 stores the data block based on signals MMWD at the physical address identified by signals PHY2 that are received from access control circuit 239. Access control circuit 239 provides the data block and a data mask to first multiplexing inputs of multiplexer circuits 501-502 as signals CWD. The data mask indicates that all of the bits in the data block are to be stored in cache memory.

Signals PHY1 identifying the physical address stored in write queue circuit 511 are also provided to address map logic circuit 512. Address map logic circuit 512 maps the physical address into mapped addresses that include an upper address ATH and a lower address ATL and provides the mapped addresses to registers 213-216 and multiplexer circuits 234-235, as described above with respect to FIG. 1A.

Processor core 210 generates a tag for the data block identified by the Write Data signals and a tag mask for the tag. The tag and the tag mask are provided to multiplexing inputs of multiplexer circuits 503 as signals TGW. Multiplexer circuits 503 provide the tag for the data block and the tag mask to the locations in signals TBW that are indicated by the delayed address signals ACLD. Multiplexer circuits 503 set each of the remaining signals TBW to a predefined value (e.g., 0). The tag mask indicates which of the signals TBW identify the tag for the data block being written to cache memory in the write transaction. The tag mask indicates to the cache memory integrated circuit that the tag in signals TBW will be stored in cache memory and the remaining signals TBW that are set to predefined values will not be stored in cache memory. In some embodiments, the tag requires much less space than the data block that the tag is associated with. For example, the tag may be 8-32 times smaller than the data block. When the tag is written into the cache memory integrated circuit, control signals identifying the tag mask ensure that the tag is written to the correct column of the cache memory and that the adjacent tags are left unchanged.

Processor integrated circuit 202 generates several more signals TBW than signals TGW. For example, processor core 210 may generate 18 signals TGW, and multiplexer circuits 503 may generate 144 signals TBW. Signals TBW are provided to second multiplexing inputs of multiplexer circuits 501-502. The ratio of the number of TBW signals to the number of TGW signals equals the ratio of the number of bits in the data block to the number of bits in the tag (e.g., in the range of 8-32).

As an example, if bank group address AG indicates that the data block will be stored in bank group X, multiplexer circuits 501 provide the data block and data mask identified by signals CWD to interface circuit 241 as signals DX3, and multiplexer circuits 502 provide the tag and tag mask indicated by signals TBW to interface circuit 243 as signals TY3 based on delayed address signals AGD. Interface circuit 241 provides the data block and data mask as signals DX2 to bank group X in memory integrated circuit 205, and interface circuit 243 provides the tag and tag mask as signals TY2 to bank group Y in integrated circuit 205.

Multiplexer circuits 234 provide addresses AD, AB, AR, ACH, and ACL indicated by signals AL2 to interface circuit 242 as signals AL3, and multiplexer circuits 235 provide addresses AD, AB, AR, ACH, and T indicated by signals AT2 to interface circuit 244 as signals AT6. Interface circuit 242 transmits addresses AB, AR, ACH, and ACL to interface circuit 252 in integrated circuit 205 as signals AL4, and interface circuit 244 transmits addresses AB, AR, ACH, and T to interface circuit 254 in integrated circuit 205 as signals AT7 if address AD identifies memory integrated circuit 205.

Referring to FIG. 1B, memory integrated circuit 205 receives the data block and data mask indicated by signals DX2 at interface circuit 251, the addresses indicated by signals AL4 at interface circuit 252, the tag and tag mask indicated by signals TY2 at interface circuit 253, and the addresses indicated by signals AT7 at interface circuit 254. Interface 251 provides the data block and data mask to bank group X as signals DX1, and interface circuit 252 provides the address indicated by signals AL4 to bank group X as signals AL5. Memory integrated circuit 205 stores the data block indicated by signals DX1 in bank group X at addresses indicated by signals AL5 based on the data mask. Interface circuit 253 provides the tag and the tag mask to bank group Y as signals TY1, and interface circuit 254 provides the address indicated by signals AT7 to bank group Y as signals AT8. Memory integrated circuit 205 stores the tag in signals TY1 that are identified by the tag mask in bank group Y at addresses indicated by signals AT8.

Referring again to FIG. 5, as another example, if bank group address AG indicates that the data block will be stored in bank group Y, multiplexer circuits 502 provide the data block and data mask indicated by signals CWD to interface circuit 243 as signals DY3, and multiplexer circuits 501 provide the tag and tag mask indicated by signals TBW to interface circuit 241 as signals TX3. Interface circuit 243 provides the data block and data mask as signals DY2 to memory integrated circuit 205, and interface circuit 241 provides the tag and tag mask as signals TX2 to integrated circuit 205.

Multiplexer circuits 234 provide addresses AB, AR, ACH, and T indicated by signals AT2 to interface circuit 242 as signals AT3, and multiplexer circuits 235 provide addresses AB, AR, ACH, and ACL indicated by signals AL2 to interface circuit 244 as signals AL6. Interface circuit 242 transmits addresses AB, AR, ACH, and T to integrated circuit 205 as signals AT4, and interface circuit 244 transmits addresses AB, AR, ACH, and ACL to integrated circuit 205 as signals AL7.

Referring to FIG. 1B, memory integrated circuit 205 receives the tag and tag mask indicated by signals TX2 at interface circuit 251, the addresses indicated by signals AT4 at interface circuit 252, the data block and data mask indicated by signals DY2 at interface circuit 253, and the addresses indicated by signals AL7 at interface circuit 254. Interface 253 provides the data block and data mask to bank group Y as signals DY1, and interface circuit 254 provides the address indicated by signals AL7 to bank group Y as signals AL8. Memory integrated circuit 205 stores the data block in signals DY1 in bank group Y based on the data mask at addresses indicated by signals AL8. Interface circuit 251 provides the tag and tag mask to bank group X as signals TX1, and interface circuit 252 provides the address indicated by signals AT4 to bank group X as signals AT5. Memory integrated circuit 205 stores the tag in signals TX1 identified by the tag mask in bank group X at addresses indicated by signals AT5.

Figure 6:
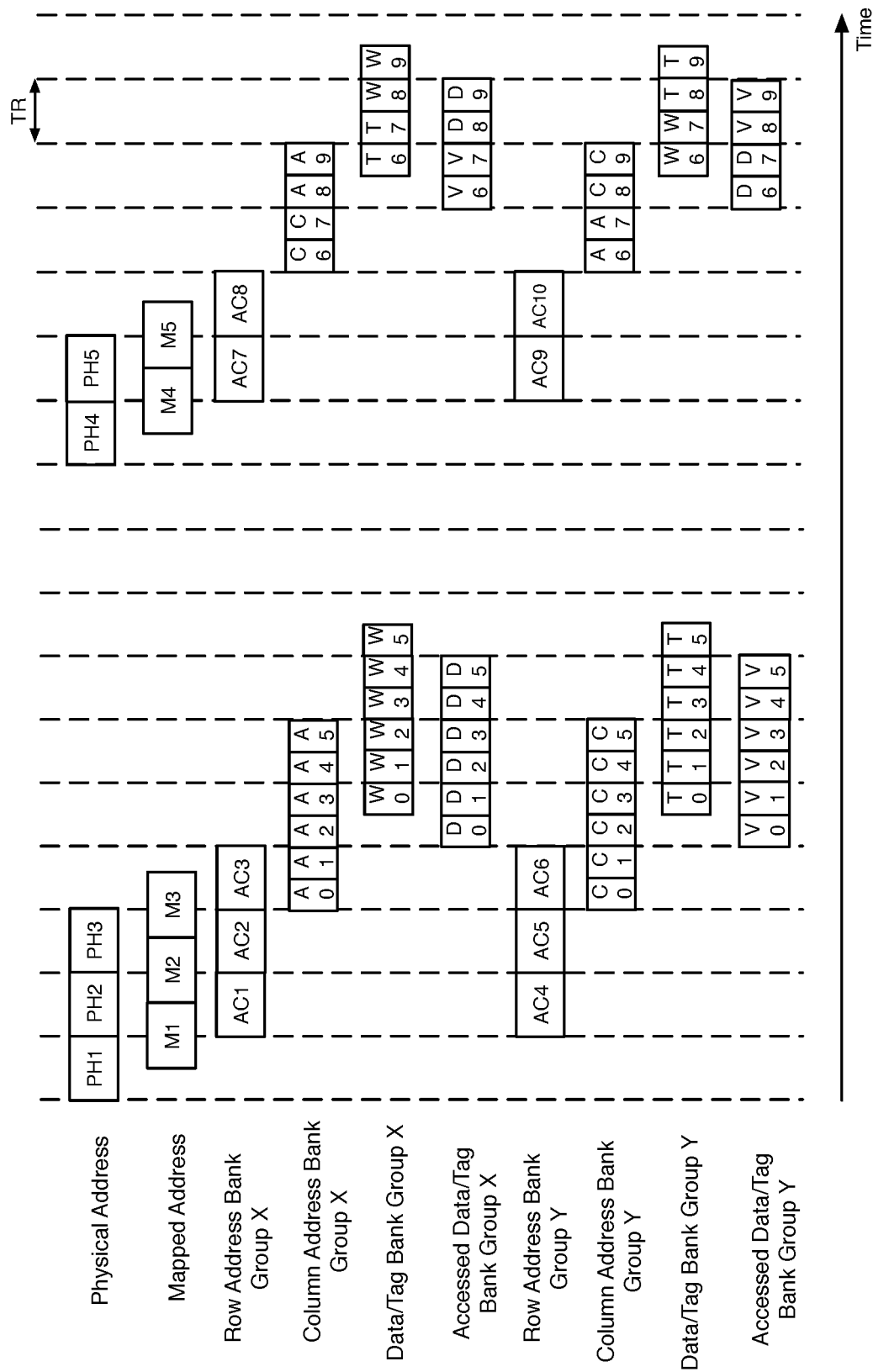
FIG. 6 is a diagram that illustrates examples of the timing of operations performed when the processor integrated circuit as shown in FIG. 5 writes data to one or more of the cache memory integrated circuits shown in FIG. 1B during write transactions.

FIG. 6 is a diagram that illustrates examples of the timing of operations performed when processor integrated circuit 202 as shown in FIG. 5 writes data to cache memory integrated circuit 205 shown in FIG. 1B during write transactions. FIG. 6 shows write transactions that are pipelined in the sense that additional write transactions are issued by processor core 210 before write transactions that were previously issued by processor core 210 have been completed. The time intervals TR between the vertical dotted lines in FIG. 6 are defined by the periods of a clock signal. The labels shown in each horizontal row of FIG. 6 are described above with respect to FIG. 4.

In the example of FIG. 6, processor core 210 issues three consecutive pipelined write transactions 1-3 that each store data in bank group X in memory integrated circuit 205. Write queue circuit 511 provides physical addresses for write transactions 1-3 to address map logic 512 in operations PH1, PH2, and PH3, respectively. Map address logic 512 provides addresses ATH, AD, AG, AB, AR, ACH, ACL, and T to registers 213-216 as described above with respect to FIGS. 1A and 5 for write transactions 1-3 in operations M1, M2, and M3 in response to the physical addresses provided in operations PH1, PH2, and PH3, respectively.

The banks in bank group X identified by bank addresses AB perform the activate functions for write transactions 1-3 in operations AC1, AC2, and AC3 in response to receiving the mapped addresses generated during operations M1-M3, respectively. The banks in bank group X select the columns of the memory cells where the data blocks will be stored in operations A0-A1, A2-A3, and A4-A5 in response to receiving the column addresses ACH and ACL generated during operations M1-M3, respectively. In the embodiment of FIG. 6, each bank of memory cells stores data or tags from two different columns in each write transaction. In each operation A0-A5, a different column is selected.

Processor integrated circuit 202 provides the data blocks for write transactions 1-3 to memory integrated circuit 205 in operations D0-D1, D2-D3, and D4-D5, respectively. The data blocks for write transactions 1-3 are stored in memory cells in bank group X in operations W0-W1, W2-W3, and W4-W5, respectively. In each operation W0-W5, data is stored in a different column.

The banks in bank group Y identified by bank addresses AB perform the activate functions for write transactions 1-3 in operations AC4, AC5, and AC6 in response to receiving the mapped addresses generated during operations M1-M3, respectively. The banks in bank group Y select the columns where the tags will be stored in operations C0-C1, C2-C3, and C4-05 in response to the column addresses ACH and T generated during operations M1-M3, respectively. Processor integrated circuit 202 provides the tags for write transactions 1-3 to memory integrated circuit 205 in operations V0-V1, V2-V3, and V4-V5, respectively. The tags for write transactions 1-3 are stored in the selected banks in bank group Y in operations T0-T1, T2-T3, and T4-T5, respectively. In each operation T0-T5, a tag is stored in a different column.

In FIG. 6, processor core 210 issues two additional pipelined write transactions 4-5. Write transactions 4-5 store data in bank groups Y and X, respectively, in memory integrated circuit 205. Write queue circuit 511 provides physical addresses for write transactions 4-5 to address map logic 512 in operations PH4-PH5, respectively. Map address logic 512 provides addresses ATH, AD, AG, AB, AR, ACH, ACL, and T to registers 213-216 as described above with respect to FIGS. 1A and 5 for write transactions 4-5 in operations M4-M5 in response to the physical addresses provided in operations PH4-PH5, respectively.

The banks in bank groups Y and X identified by bank addresses AB perform the activate functions for write transactions 4-5 in operations AC9 and AC8 in response to receiving the mapped addresses generated during operations M4-M5, respectively. The banks in bank groups Y and X select the columns of the memory cells where the data blocks will be stored in operations A6-A7 and A8-A9 in response to the column addresses ACH and ACL generated during operations M4-M5, respectively. Processor integrated circuit 202 provides the data blocks for write transactions 4-5 to memory integrated circuit 205 in operations D6-D7 and D8-D9, respectively. The data blocks for write transactions 4-5 are stored in memory cells in bank groups Y and X in operations W6-W7 and W8-W9, respectively.

The banks in bank groups X and Y identified by bank addresses AB perform the activate functions for write transactions 4-5 in operations AC7 and AC10 in response to receiving the addresses generated during operations M4-M5, respectively. The banks in bank groups X and Y select the columns where the tags will be stored in operations C6-C7 and C8-C9 in response to the column addresses ACH and T generated during operations M4-M5, respectively. Processor integrated circuit 202 provides the tags for write transactions 4-5 to memory integrated circuit 205 in operations V6-V7 and V8-V9, respectively. The tags for write transactions 4-5 are stored in the selected banks in bank groups X and Y in operations T6-T7 and T8-T9, respectively.

Figure 7A:
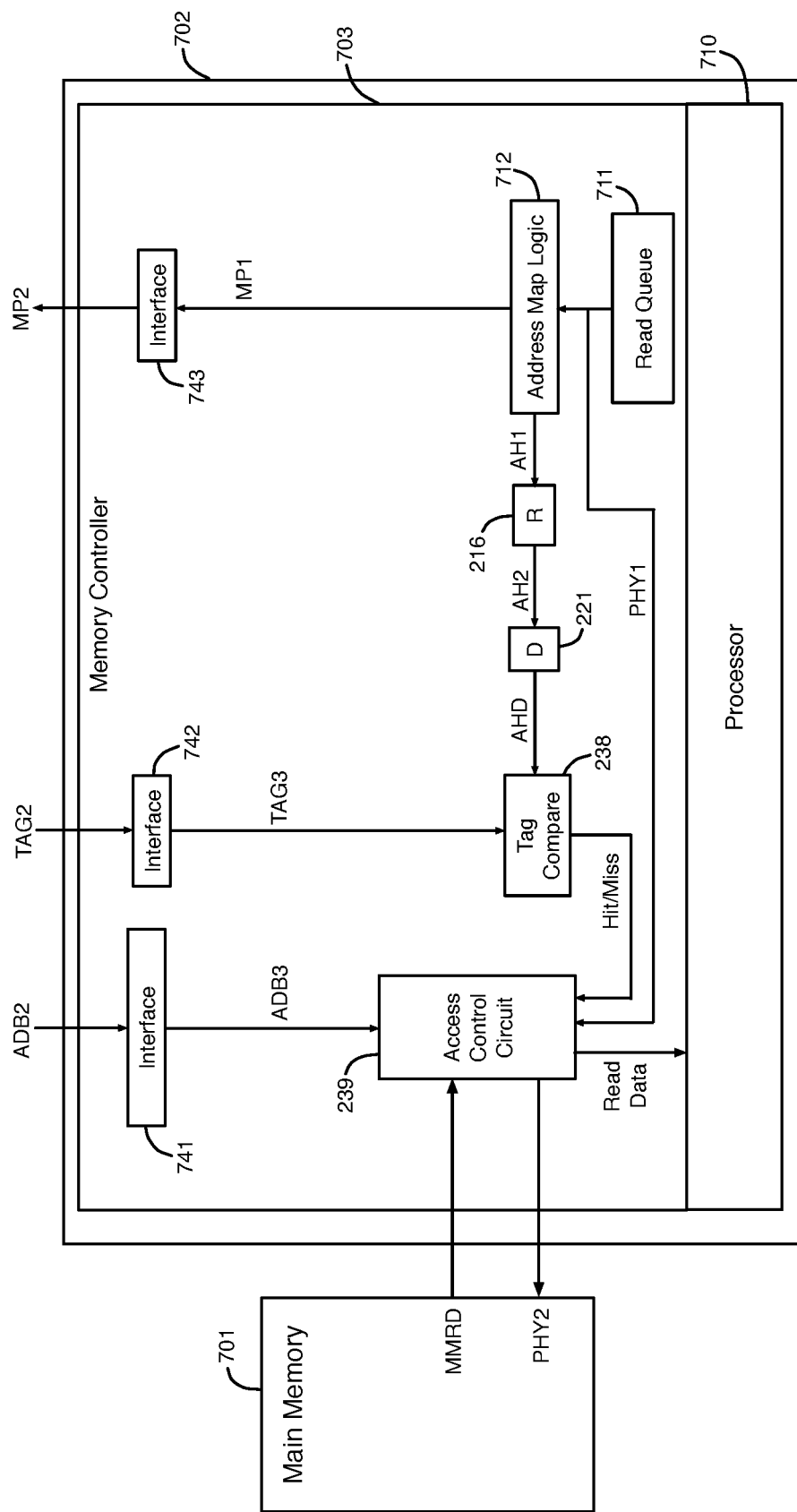
FIGS. 7A and 7B illustrate another example of a system that stores data and tags for the data in different bank groups of memory cells in cache memory.
Figure 7B:
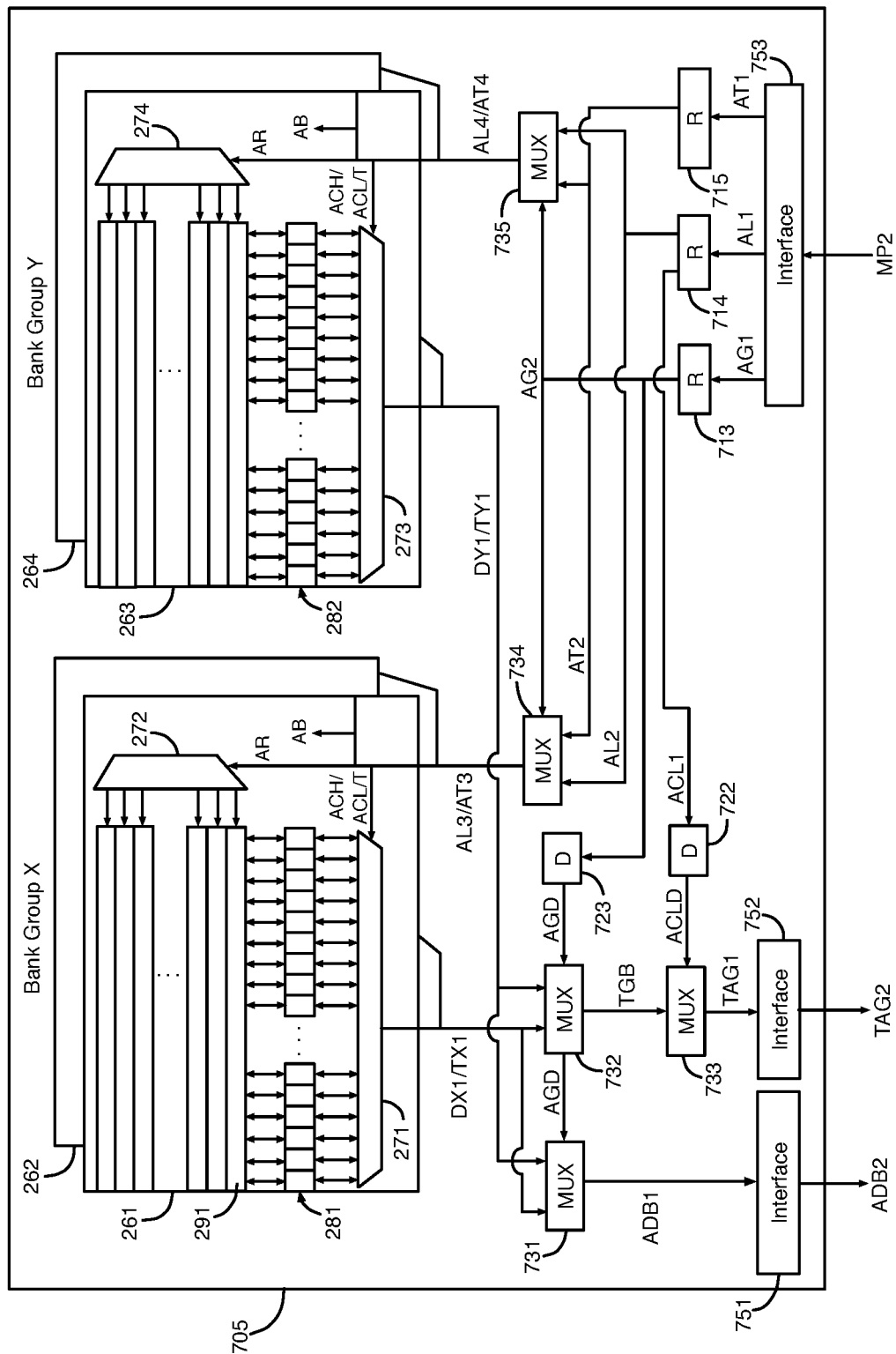

FIGS. 7A and 7B illustrate another example of a system that stores data and tags for the data in different bank groups of memory cells in cache memory. Each block of data is stored in a different bank group of memory cells in the cache memory relative to the tag associated with the data. In the embodiments of FIGS. 7A-7B, the selection circuitry that selects between the data blocks and the tag blocks is located in the cache memory integrated circuit.

FIG. 7A illustrates a memory integrated circuit 701 and a processor integrated circuit 702. FIG. 7B illustrates a memory integrated circuit 705. Memory integrated circuits 701 and 705 and other memory integrated circuits shown and described herein include memory cells such as, volatile memory cells, non-volatile memory cells, or any combination of volatile and non-volatile memory cells.

Some of the differences between memory integrated circuit 205 shown in FIG. 1B and memory integrated circuit 705 shown in FIG. 7B are now described. Memory integrated circuit 205 has data/tag and address interface circuits that are dedicated for a particular bank group X and Y. Memory integrated circuit 705 has interface circuits 751-753 that are dedicated for data, tag, and address signals, respectively. Multiplexer circuits 731-735 in memory integrated circuit 705 provide signals between interface circuits 751-753 and bank groups X and Y. Memory integrated circuit 705 reduces the number of interface signals, but has additional circuitry including multiplexer circuits 731-735 compared to memory integrated circuit 205.

Memory integrated circuit 701 is the main memory for processor integrated circuit 702. Memory integrated circuit 705 is a cache memory for processor integrated circuit 702. Memory integrated circuit 705 stores copies of data stored in memory integrated circuit 701 that are most frequently used by processor integrated circuit 702.

Processor integrated circuit 702 includes a processor core 710 and a memory controller circuit 703. FIG. 7A illustrates circuitry in memory controller circuit 703 that is utilized during read transactions. Each read transaction issued by processor integrated circuit 702 is a request to access data stored in memory integrated circuit 705.

Memory controller circuit 703 includes read queue circuit 711, address map logic 712, register 216, delay circuit 221, tag compare circuit 238, access control circuit 239, and interface circuits 741-743. Memory integrated circuit 705 includes banks 261-264, which have the same structure as banks 261-264 in memory integrated circuit 205 that are shown in and described above with respect to FIG. 1B. Memory integrated circuit 705 can include any number of bank groups and any number of banks in each of the bank groups. Two bank groups X-Y and two banks in each of bank groups X-Y are shown in FIG. 7B merely as an example. Memory integrated circuit 705 also includes registers 713-715, delay circuits 722-723, multiplexer circuits 731-735, and interface circuits 751-753.

Details of read transactions are now discussed with respect to FIGS. 7A-7B. After processor core 710 issues a read transaction, processor core 710 stores a physical address for the read transaction in read queue circuit 711. The physical address stored in read queue circuit 711 is provided to address map logic circuit 712 as signals PHY1. Address map logic circuit 712 maps the physical address into mapped addresses that include upper address ATH and lower address ATL. The upper address ATH is provided to register 216 as signals AH1. Signals AH1 are stored in register 216. In the embodiment of FIGS. 7A-7B, the lower address ATL includes addresses AG, AB, AR, ACH, ACL, and T.

The mapped addresses are provided to interface circuit 743 as signals MP1. The mapped addresses are transmitted from interface circuit 743 to interface circuit 753 in memory integrated circuit 705 as signals MP2. Interface circuit 753 provides address AG to register 713 as signals AG1. Signals AG1 are stored in register 713. Interface circuit 753 provides addresses AB, AR, ACH, and ACL to register 714 as signals ALE Signals AL1 are stored in register 714. Interface circuit 753 provides addresses AB, AR, ACH, and T to register 715 as signals AT1. Signals AT1 are stored in register 715.

Address AG is provided from register 713 to select inputs of multiplexer circuits 734-735 as signals AG2. Addresses AB, AR, ACH, and ACL are provided from register 714 to a first set of multiplexing inputs of each of multiplexer circuits 734-735 as signals AL2. Addresses AB, AR, ACH, and T are provided from register 715 to a second set of multiplexing inputs of each of multiplexer circuits 734-735 as signals AT2.

When address AG identifies bank group X, multiplexer circuits 734 provide addresses AB, AR, ACH, and ACL to bank group X as signals AL3, and multiplexer circuits 735 provide addresses AB, AR, ACH, and T to bank group Y as signals AT4. Bank group X accesses a data block from the memory cells identified by the addresses AB, AR, ACH, and ACL indicated by signals AL3. The accessed data block is provided to first multiplexing inputs of multiplexer circuits 731-732 as signals DX1. Bank group Y accesses a tag block from the memory cells identified by the addresses AB, AR, ACH, and T indicated by signals AT4. The accessed tag block is provided to second multiplexing inputs of multiplexer circuits 731-732 as signals TY1.

Delay circuit 723 delays signals AG2 to generate delayed signals AGD. Delayed signals AGD are provided to select inputs of multiplexer circuits 731-732. When delayed signals AGD identify bank group X, multiplexer circuits 731 select signals DX1 and provide the data block accessed from bank group X to its outputs as selected signals ADB1, and multiplexer circuits 732 select signals TY1 and provide the tag block accessed from bank group Y to its outputs as selected signals TGB. Selected signals ADB1 are provided to interface circuit 751, and selected signals TGB are provided to multiplexing inputs of multiplexer circuits 733.

Signals ACL1 that identify the low column address ACL are provided from register 714 to delay circuit 722. Delay circuit 722 delays signals ACL1 to generate delayed signals ACLD. Delayed signals ACLD are provided to select inputs of multiplexer circuits 733. Multiplexer circuits 733 select the tag in signals TGB indicated by the low column address ACL. The tag selected by multiplexer circuits 733 is provided to interface circuit 752 as signals TAG1.

Interface circuit 751 transmits the data block accessed from bank group X to interface circuit 741 in processor integrated circuit 702 as signals ADB2, and interface circuit 752 transmits the tag accessed from bank group Y and selected by multiplexer circuits 733 to interface circuit 742 in processor integrated circuit 702 as signals TAG2. Interface circuit 741 provides the data block accessed from bank group X to access control circuit 239 as signals ADB3, and interface circuit 742 provides the tag accessed from bank group Y and selected by multiplexer circuits 733 to tag compare circuit 238 as signals TAG3. Tag compare circuit 238 compares the tag identified by signals TAG3 to the upper address ATH identified by delayed signals AHD to generate the Hit/Miss signal, as described above with respect to FIG. 1A. Access control circuit 239 provides either the data block accessed from memory integrated circuit 705 as signals ADB3 or a data block accessed from main memory integrated circuit 701 as the Read Data signals depending on the state of the Hit/Miss signal, as described above with respect to FIG. 1A.

When address AG identifies bank group Y, multiplexer circuits 735 provide addresses AB, AR, ACH, and ACL to bank group Y as signals AL4, and multiplexer circuits 734 provide addresses AB, AR, ACH, and T to bank group X as signals AT3. Bank group Y accesses a data block from the memory cells identified by the addresses AB, AR, ACH, and ACL indicated by signals AL4. The accessed data block is provided to the second multiplexing inputs of multiplexer circuits 731-732 as signals DY1. Bank group X accesses a tag block from the memory cells identified by the addresses AB, AR, ACH, and T indicated by signals AT3. The accessed tag block is provided to the first multiplexing inputs of multiplexer circuits 731-732 as signals TX1.

When delayed signals AGD identify bank group Y, multiplexer circuits 731 select signals DY1 and provide the data block accessed from bank group Y to its outputs as selected signals ADB1, and multiplexer circuits 732 select signals TX1 and provide the tag block accessed from bank group X to its outputs as selected signals TGB. Selected signals ADB1 are provided to interface circuit 751, and selected signals TGB are provided to multiplexer circuits 733. Multiplexer circuits 733 select the tag in signals TGB that corresponds to the low column address ACL indicated by signals ACLD. The tag selected by multiplexer circuits 733 is provided to interface circuit 752 as signals TAG1.

Interface circuit 751 transmits the data block accessed from bank group Y to interface circuit 741 in processor integrated circuit 702 as signals ADB2, and interface circuit 752 transmits the tag accessed from bank group X and selected by multiplexer circuits 733 to interface circuit 742 in processor integrated circuit 702 as signals TAG2. Interface circuit 741 provides the data block accessed from bank group Y to access control circuit 239 as signals ADB3, and interface circuit 742 provides the tag accessed from bank group X and selected by multiplexer circuits 733 to tag compare circuit 238 as signals TAGS. Tag compare circuit 238 and access control circuit 239 function as described above.

Figure 8A:
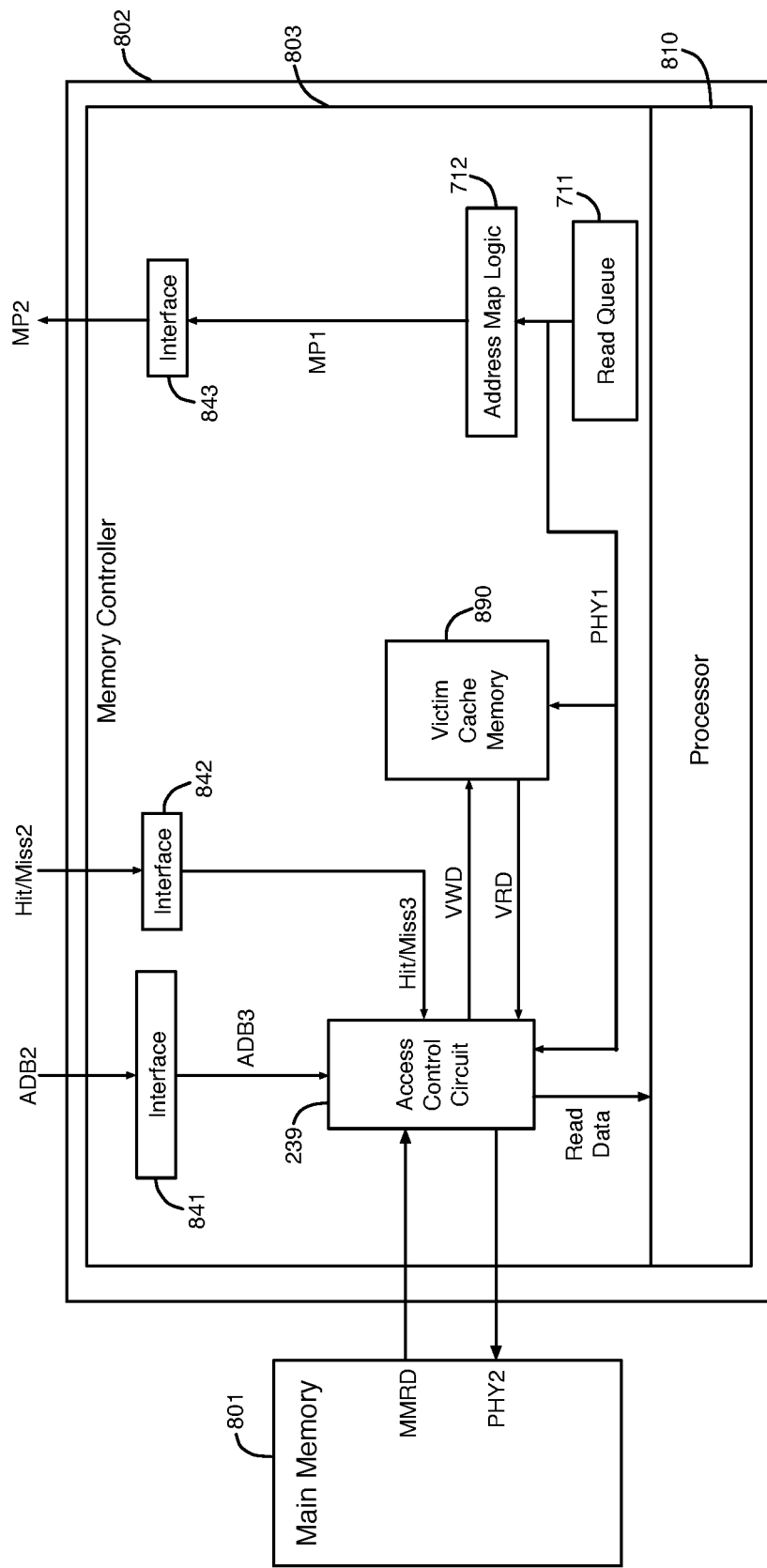
FIGS. 8A and 8B illustrate yet another example of a system that stores data and tags for the data in different bank groups of memory cells in cache memory.
Figure 8B:
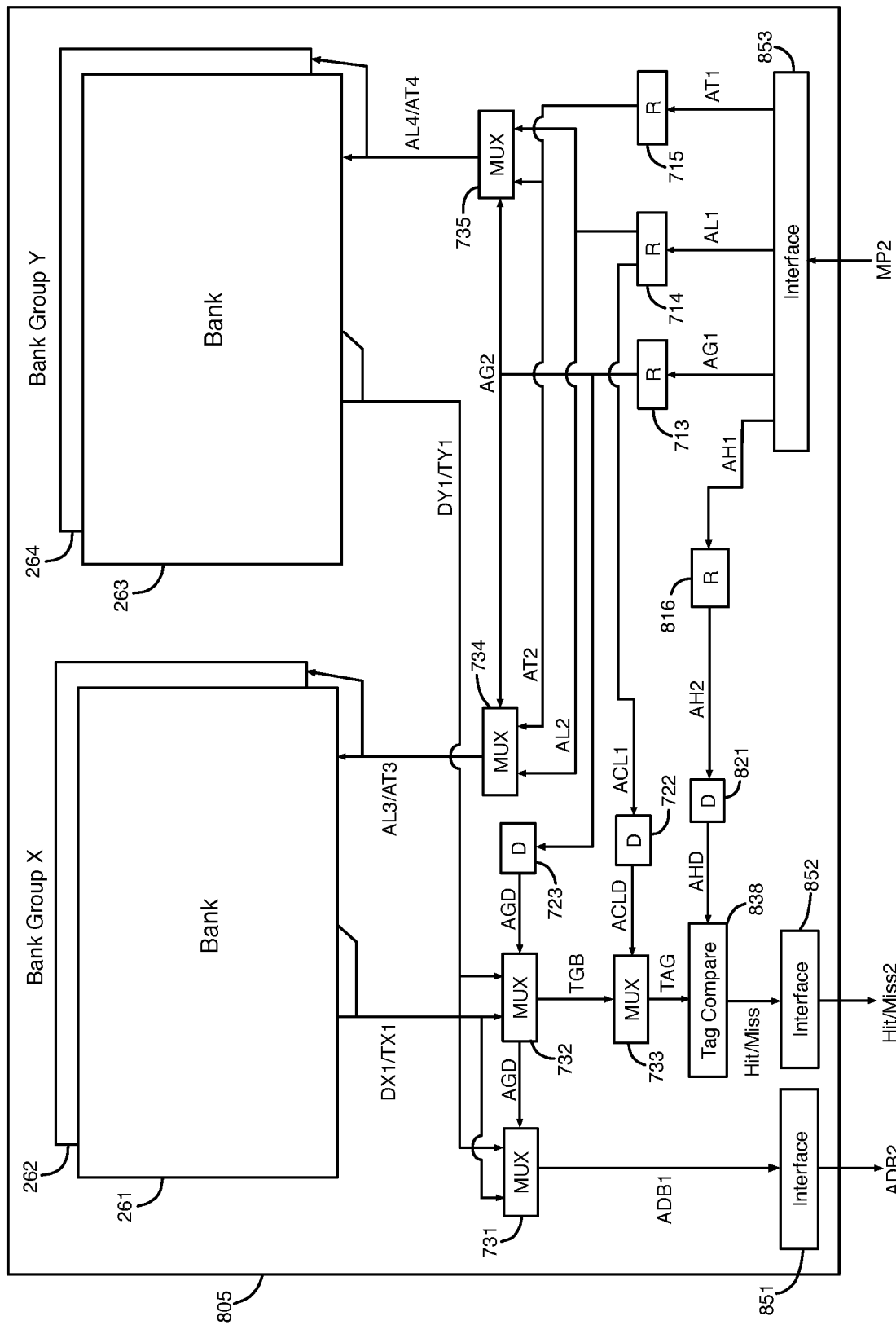

FIGS. 8A and 8B illustrate yet another example of a system that stores data and tags for the data in different bank groups of memory cells in cache memory. In the embodiment of FIGS. 8A-8B, the tag compare circuit and the selection circuitry that selects between the data blocks and the tag blocks are located in the cache memory integrated circuit.

FIG. 8A illustrates a main memory integrated circuit 801 and a processor integrated circuit 802. FIG. 8B illustrates a cache memory integrated circuit 805. Memory integrated circuit 805 stores copies of data stored in memory integrated circuit 801 that are most frequently used by processor integrated circuit 802.

Processor integrated circuit 802 includes a processor core 810 and a memory controller circuit 803. FIG. 8A illustrates circuitry in memory controller 803 that is utilized during read transactions. Memory controller circuit 803 includes read queue circuit 711, address map logic 712, access control circuit 239, interface circuits 841-843, and victim cache memory circuit 890.

Memory integrated circuit 805 includes banks 261-264, which have the same structure as banks 261-264 in memory integrated circuit 205 that are shown in and described above with respect to FIG. 1B. Memory integrated circuit 805 also includes registers 713-715 and 816, delay circuits 722-723 and 821, multiplexer circuits 731-735, interface circuits 851-853, and tag compare circuit 838.

Thus, memory integrated circuit 805 includes a tag compare circuit 838 that is not in memory integrated circuit 705 in FIG. 7B. The tag interface circuit 752 in memory integrated circuit 705 is replaced with a tag comparison interface circuit 852. Memory integrated circuit 805 has less interface signals than memory integrated circuit 705, but memory integrated circuit 805 has additional circuitry including tag compare circuit 838, delay circuit 821, and register 816 that is not in memory integrated circuit 705.

Details of read transactions are now discussed with respect to FIGS. 8A-8B. After processor core 810 issues a read transaction, processor core 810 stores a physical address for the read transaction in read queue circuit 711. The physical address stored in read queue circuit 711 is provided to address map logic circuit 712 as signals PHY1. Address map logic circuit 712 maps the physical address into mapped addresses, as described above with respect to FIG. 7A. The mapped addresses are provided to interface circuit 843 as signals MP1. Interface circuit 843 transmits the mapped addresses as signals MP2 to interface circuit 853 in memory integrated circuit 805. Interface circuit 853 provides the upper address ATH as signals AH1 to register circuit 816, address AG to register circuit 713 as signals AG1, addresses AB, AR, ACH, and ACL to register circuit 714 as signals AL1, and addresses AB, AR, ACH, and T to register circuit 715 as signals AT1. Bank groups X and Y access the requested data block and the tag for the requested data block from memory cells, as described above with respect to FIG. 7B.

Multiplexer circuits 733 provide the tag as signals TAG to tag compare circuit 838 on memory integrated circuit 805. Register 816 provides the upper address ATH to delay circuit 821 as signals AH2. Delay circuit 821 delays signals AH2 to generate delayed signals AHD. Delayed signals AHD are provided to tag compare circuit 838. Tag compare circuit 838 compares the tag indicated by signals TAG with the upper address ATH indicated by signals AHD to generate a Hit/Miss signal. The Hit/Miss signal is provided to interface circuit 852. Interface circuit 852 transmits the state of the Hit/Miss signal to interface circuit 842 in processor integrated circuit 802 in signal Hit/Miss2. Interface circuit 842 provides the state of the Hit/Miss2 signal to access control circuit 239 in signal Hit/Miss3.

Multiplexer circuits 731 provide the accessed data block to interface circuit 851 as signals ADB1. Interface circuit 851 provides the accessed data block to interface circuit 841 in processor integrated circuit 802 as signal ADB2. Interface circuit 841 provides the accessed data block to access control circuit 239 as signal ADB3. If the Hit/Miss3 signal indicates that the upper address ATH matches the tag corresponding to the data block accessed from memory integrated circuit 805, access control circuit 239 provides the data block as the Read Data signals.

If the Hit/Miss3 signal indicates that the upper address ATH does not match the tag corresponding to the data block accessed from memory integrated circuit 805, access control circuit 239 accesses the requested data block from memory integrated circuit 801 at the physical address indicated by signals PHY2. Memory integrated circuit 801 provides the requested data block to access control circuit 239 as signals MMRD. Access control circuit 239 provides the requested data block as the Read Data signals.

Victim cache memory circuit 890 stores a data block and its associated tag when cache memory integrated circuit 805 does not store a copy of the data block requested during a read transaction. When the Hit/Miss3 signal indicates that the tag does not match the upper address ATH during a read transaction, access control circuit 239 provides the data block and its associated tag that are received from main memory integrated circuit 801 to victim cache memory circuit 890 as signals VWD. Victim cache memory circuit 890 receives signals PHY1 indicating the physical address. Victim cache memory circuit 890 stores the data block and the tag at an address that is based on the physical address. Memory controller circuit 803 accesses the data blocks and the tags stored in victim cache memory circuit 890 as signals VRD in response to read transactions issued by processor core 810. If the requested data block is not stored in victim cache memory circuit 890, memory controller circuit 803 accesses the requested data block from cache memory integrated circuit 805 or from main memory integrated circuit 801, as described above.

Storing data and tags in victim cache memory circuit 890 avoids misses to the cache memory integrated circuit when the physical addresses of read transactions access the same address indicated by signals AG1/AL1 and different addresses indicated by signals AH1. Victim cache memory circuit 890 can, for example, provide storage for the data blocks that have been most recently deleted from the cache memory integrated circuit 805.

Figure 9A:
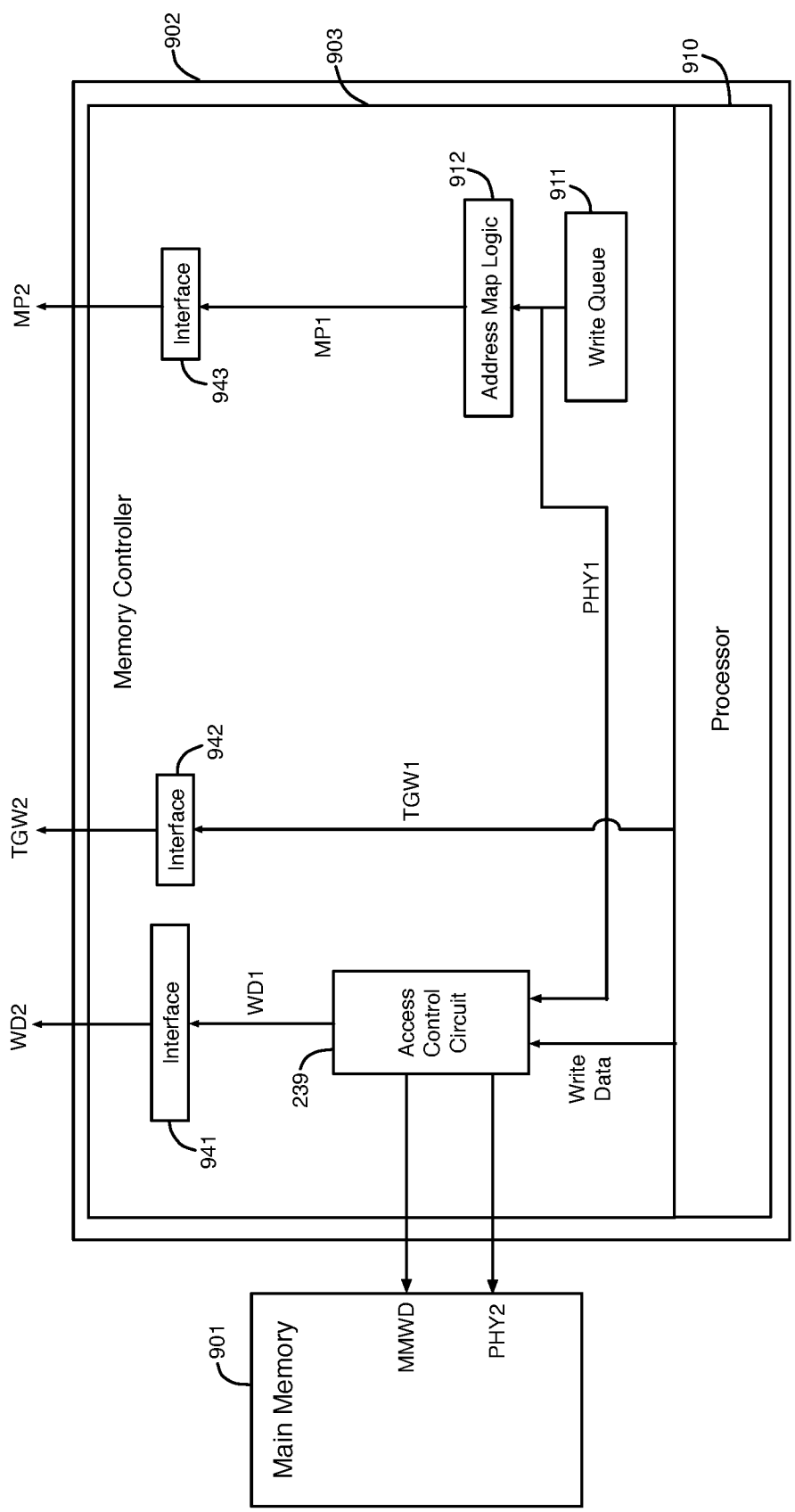
FIGS. 9A-9B illustrate another example of a system that is used to write data to cache memory during write transactions.
Figure 9B:
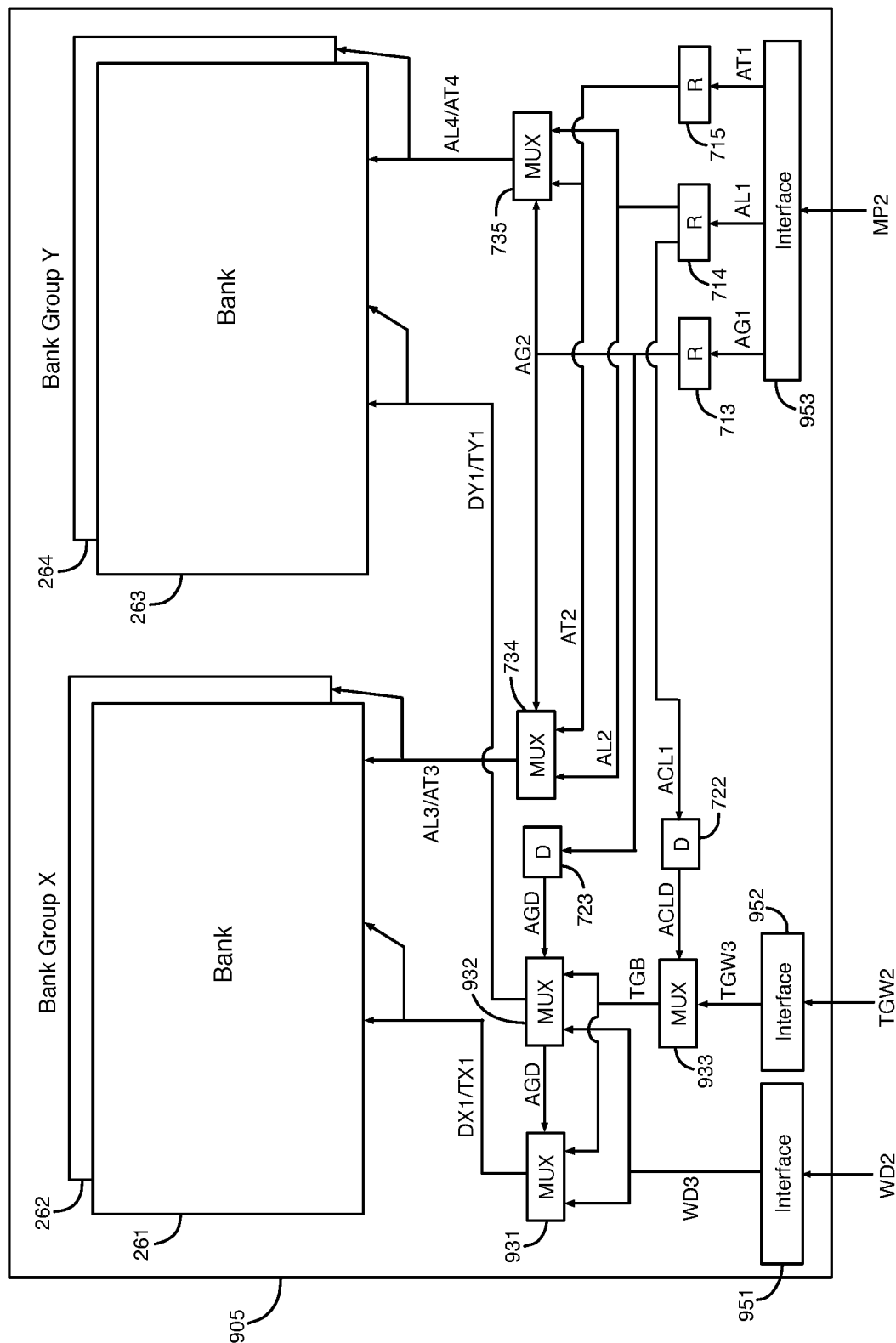

FIGS. 9A-9B illustrate another example of a system that is used to write data to cache memory during write transactions. In the embodiment of FIGS. 9A-9B, the selection circuitry that selects between the data blocks and the tags is located in the cache memory integrated circuit.

The system of FIGS. 9A-9B includes main memory integrated circuit 901 and processor integrated circuit 902 as shown in FIG. 9A. The system of FIGS. 9A-9B also includes cache memory integrated circuit 905 shown in FIG. 9B. Processor integrated circuit 902 includes processor core 910 and memory controller circuit 903. Memory controller circuit 903 includes write queue circuit 911, address map logic circuit 912, access control circuit 239, and interface circuits 941-943.

Memory integrated circuit 905 includes banks 261-264, which have the same structure as banks 261-264 in memory integrated circuit 205 that are shown in and described above with respect to FIG. 1B. Memory integrated circuit 905 also includes registers 713-715, delay circuits 722-723, multiplexer circuits 931-933 and 734-735, and interface circuits 951-953.

Examples of write transactions performed according to a write through policy are now discussed in connection with FIGS. 9A-9B. After processor core 910 issues a write transaction, processor core 910 stores a physical address for the write transaction in write queue circuit 911. The physical address is the address in main memory integrated circuit 901 where the write data will be stored for the write transaction. Signals PHY1 identifying the physical address are provided from write queue circuit 911 to access control circuit 239. Access control circuit 239 provides the physical address to memory integrated circuit 901 as signals PHY2. Access control circuit 239 receives Write Data signals for the write transaction from other circuitry in processor core 910. The Write Data signals represent a data block that will be stored in memory integrated circuits 901 and 905. Access control circuit 239 provides the data block to memory integrated circuit 901 as signals MMWD. Memory integrated circuit 901 stores the data block based on signals MMWD at the physical address indicated by signals PHY2. Access control circuit 239 also provides the data block and a data mask to interface circuit 941 as signal WD1. The data mask indicates that all of the bits in the data block in signals WD1 are to be stored in cache memory during the write transaction. Interface circuit 941 transmits the data block and the data mask to interface circuit 951 in memory integrated circuit 905 as signals WD2.

Processor core 910 provides the tag for the data block to be stored in cache memory during the write transaction and a tag mask for the tag to interface circuit 942 as signals TGW1. Interface circuit 942 transmits the tag and the tag mask to interface circuit 952 in memory integrated circuit 905 as signals TGW2. The signals PHY1 indicating the physical address stored in write queue circuit 911 are also provided to address map logic circuit 912. Address map logic circuit 912 maps the physical address into mapped addresses and provides the mapped addresses to interface circuit 943 as signals MP1. Interface circuit 943 transmits the mapped addresses to interface circuit 953 in memory integrated circuit 905 as signals MP2. Interface circuit 953 provides the mapped addresses to registers 713-715, as described above with respect to FIG. 7B. Multiplexers 734-735 and delay circuits 722-723 function as described above with respect to FIG. 7B.

Interface circuit 951 provides the data block and the data mask for the write transaction to first multiplexing inputs of multiplexer circuits 931-932 as signals WD3. Interface circuit 952 provides the tag and the tag mask for the data block to multiplexing inputs of multiplexer circuits 933 as signals TGW3. Delayed signals ACLD are provided to select inputs of multiplexer circuits 933. Multiplexer circuits 933 provide the tag and the tag mask for the data block to locations in signals TGB that are indicated by the delayed address signals ACLD. The remaining signals TGB are set to predefined values (e.g., 0). Signals TGB are provided to second multiplexing inputs of multiplexer circuits 931-932.

Multiplexer circuits 931 provide the data block and the data mask or the tag and the tag mask for the write transaction to bank group X as signals DX1 or TX1, respectively, depending on the states of the delayed signals AGD that indicate the bank group address. Multiplexer circuits 932 provide the data block and the data mask or the tag and tag mask for the write transaction to bank group Y as signals DY1 or TY1, respectively, depending on the states of the delayed signals AGD. The data block and the tag for the write transaction are stored in memory cells in the selected bank groups X and Y based on the data mask and the tag mask at the addresses indicated by signals AL3 and AT4 or signals AT3 and AL4.

According to alternative embodiments, the systems of FIGS. 5 and 9A-9B can be implemented using a write back policy. In a write back policy, the system accesses a tag from the cache memory integrated circuit prior to implementing each write transaction that corresponds to the location of the data block to be written during the write transaction. The tag compare circuit compares the tag to the upper address ATH. If the tag matches the upper address ATH, the data block for the write transaction is stored in the cache memory integrated circuit overwriting the data stored at the same address, and a dirty bit for the data block is set. The dirty bit is stored with the tag for the data block. The data block is not stored in the main memory integrated circuit. If the tag does not match the upper address ATH, and the dirty bit for the tag is set, the data block stored in the cache memory integrated circuit prior to the write transaction is transferred to storage in the main memory integrated circuit, and then the data block for the write transaction is stored in the cache memory integrated circuit.

Figure 10A:
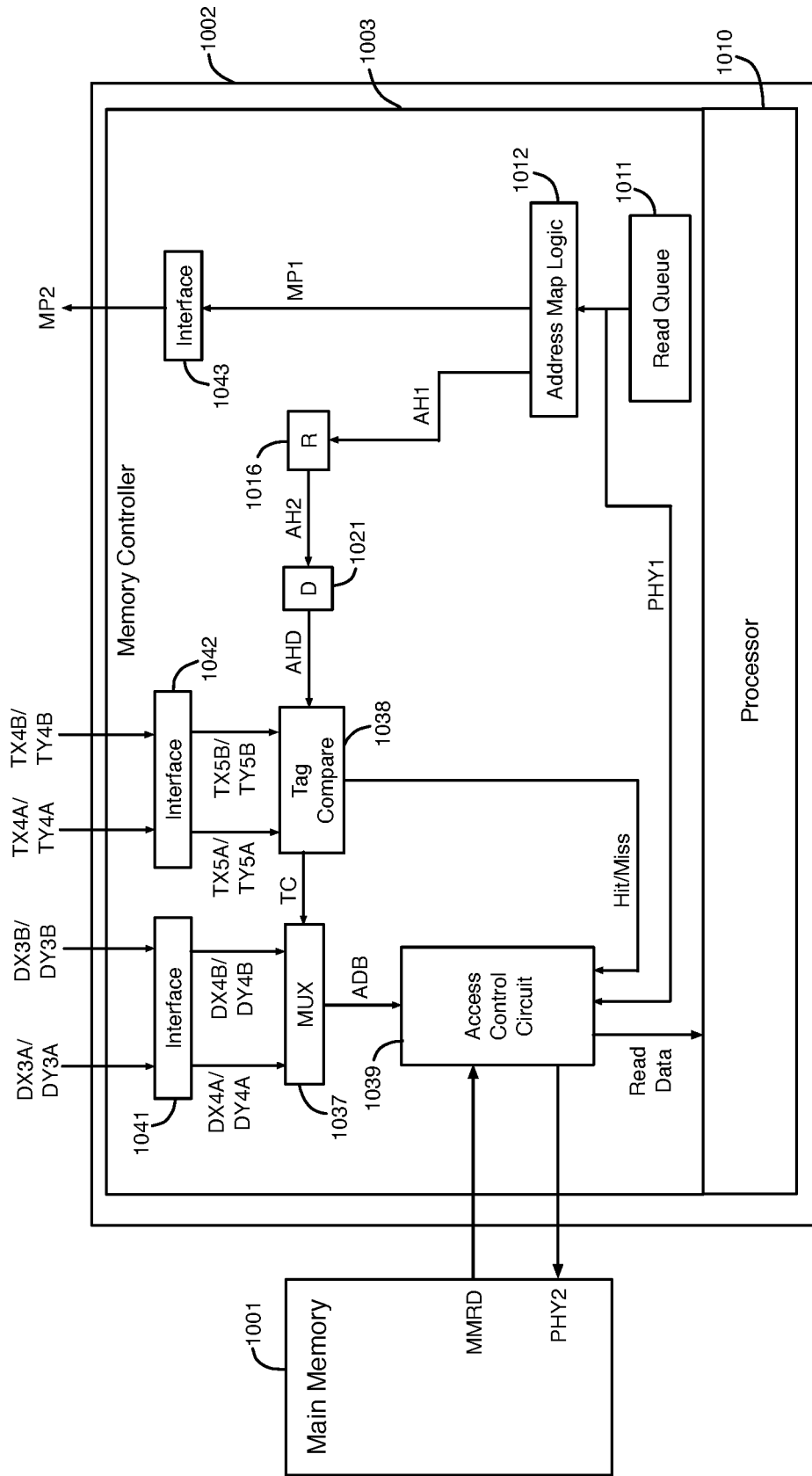
FIGS. 10A-10B illustrate an example of a system that accesses two data blocks stored at two different column addresses in cache memory during each read transaction.
Figure 10B:
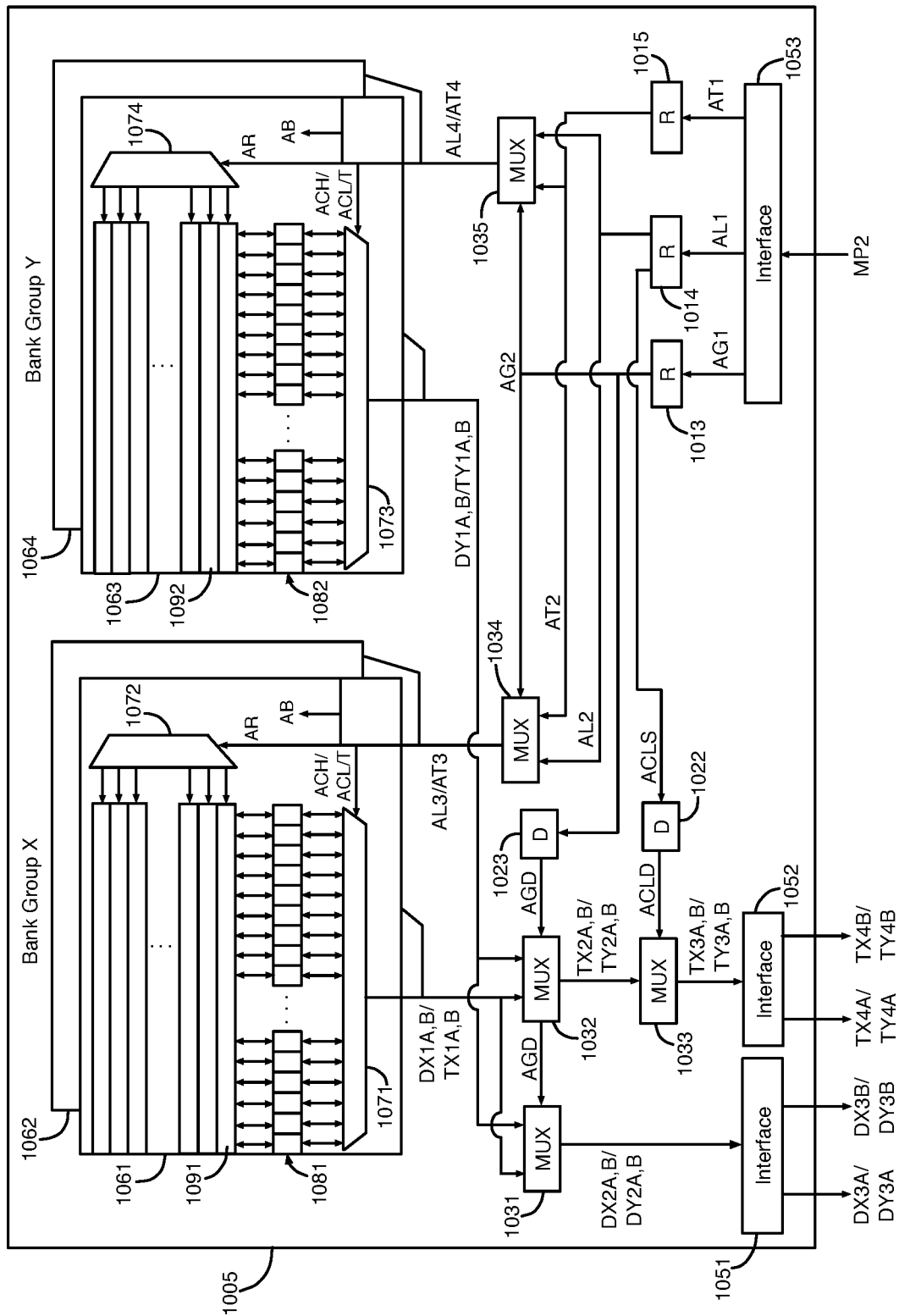

FIGS. 10A-10B illustrate an example of a system that accesses two data blocks stored at two different column addresses in cache memory during each read transaction. Each data block and the tag associated with the data block are stored in different bank groups of memory cells in the cache memory. The system of FIGS. 10A-10B includes main memory integrated circuit 1001 shown in FIG. 10A, processor integrated circuit 1002 shown in FIG. 10A, and cache memory integrated circuit 1005 shown in FIG. 10B.

Processor integrated circuit 1002 includes processor core 1010 and memory controller circuit 1003. Memory controller circuit 1003 includes read queue circuit 1011, address map logic 1012, register circuit 1016, delay circuit 1021, access control circuit 1039, multiplexer circuits 1037, tag compare circuit 1038, and interface circuits 1041-1043. Cache memory integrated circuit 1005 includes interface circuits 1051-1053, register circuits 1013-1015, multiplexer circuits 1031-1035, delay circuits 1022-1023, banks 1061-1062 arranged in bank group X, and banks 1063-1064 arranged in bank group Y. Each of the banks 1061-1064 includes arrays of memory cells. The memory cells in the arrays are arranged in rows and columns.

In an embodiment, one difference between memory integrated circuit 1005 and memory integrated circuit 705 in FIG. 7B is that interface circuits 1051-1053 transmit or receive two times as many signals as interface circuits 751-753, respectively. Interface circuits 1051-1053 can, for example, have twice as many pins and twice as many storage and buffer circuits as interface circuits 751-753, respectively, that transmit and receive twice as many signals. Memory integrated circuit 1005 also provides twice as many signals in parallel between interface circuits 1051-1053 and bank groups X and Y. Memory integrated circuit 1005 allows two data blocks and two tags to be accessed simultaneously from memory integrated circuit 1005 by memory controller circuit 1003.

Memory integrated circuit 1005 implements a two set cache that has a lower miss rate than the one set cache in memory integrated circuit 705. A two set cache places a data block in either one of two cache sets in a memory cell. The tag contains the upper address ATH to indicate which of the two cache sets stores the data block requested by the read transaction. If neither one of the two cache sets stores the requested data block, then the read transaction is identified as a miss. In a one set cache, two different data blocks may be repeatedly accessed, in which the addresses for both data blocks map to the same location in cache memory, and the memory controller circuit alternately stores each data block into the cache memory at the same location after each read transaction is identified as a miss. A two set cache can store both data blocks simultaneously (i.e., one data block in each cache set), preventing alternate misses to cache memory.

Details of read transactions are now discussed with respect to FIGS. 10A-10B. After processor core 1010 issues a read transaction, processor core 1010 stores a physical address for the read transaction in read queue circuit 1011. The physical address stored in read queue circuit 1011 is provided to address map logic circuit 1012 as signals PHY1. Address map logic circuit 1012 maps the physical address into mapped addresses.

The mapped addresses include an upper address ATH and a lower address ATL for the data block. The lower address ATL indicates where the data block is stored in cache memory integrated circuit 1005. Lower address ATL includes addresses AG, AB, AR, ACH, and ACL that identify the bank group, bank, row, high column, and low column, respectively, for the data block.

The mapped addresses generated by address map logic circuit 1012 include an additional low column address T indicating where the tag block associated with the requested data block is stored in cache memory integrated circuit 1005. The tag block contains a tag for the data block stored at address ATL in cache memory integrated circuit 1005. The address for the tag block is AG, AB, AR, ACH, and T. Address T is selected to identify the low column address of the memory cell reserved for storing the tag block in cache memory integrated circuit 1005. Address T has the same value regardless of the physical address of the requested data block.

The upper address ATH is provided as signals AH1 from address map logic 1012 to register circuit 1016 and as signals AH2 from register circuit 1016 to delay circuit 1021. Delay circuit 1021 delays signals AH2 received from register 1016 to generate delayed signals AHD, which are provided to inputs of tag compare circuit 1038.

Mapped addresses AG, AB, AR, ACH, ACL, and T are provided to interface circuit 1043 as signals MP1. Interface circuit 1043 transmits the mapped addresses as signals MP2 to interface circuit 1053 in memory integrated circuit 1005. Interface circuit 1053 provides address AG to register circuit 1013 as signals AG1, addresses AB, AR, ACH, and ACL to register circuit 1014 as signals AL1, and addresses AB, AR, ACH, and T to register circuit 1015 as signals AT1.

The bank group address AG is provided from register 1013 to select inputs of multiplexer circuits 1034-1035 as signals AG2. Addresses AB, AR, ACH, and ACL are provided from register 1014 to first multiplexing inputs of multiplexer circuits 1034-1035 as signals AL2. Addresses AB, AR, ACH, and T are provided from register 1015 to second multiplexing inputs of multiplexer circuits 1034-1035 as signals AT2.

Multiplexer circuits 1034 provide either addresses AB, AR, ACH, and ACL to bank group X as signals AL3 or addresses AB, AR, ACH, and T to bank group X as signals AT3, depending on the bank group indicated by signals AG2. Multiplexer circuits 1035 provide either addresses AB, AR, ACH, and ACL to bank group Y as signals AL4 or addresses AB, AR, ACH, and T to bank group Y as signals AT4, depending on the bank group indicated by signals AG2.

The bank of memory cells indicated by the bank group and bank addresses AG and AB accesses the data block stored in its memory cells having addresses AR, ACH, and ACL. In addition, that bank accesses a second data block stored in its memory cells having addresses AR, ACH, and ACL+Z. For example, the bank may access a second data block stored in its memory cells having an address of AR, ACH, and ACL+1, where Z equals 1.

The bank of memory cells indicated by the bank address AB in the bank group not indicated by the bank group address AG accesses the tag block in its memory cells having the addresses AR, ACH, and T. In addition, that bank accesses a second tag block stored in its memory cells having the addresses AR, ACH, and T+Z. For example, the bank may access a second tag block stored in its memory cell having an address of AR, ACH, and T+1, where Z equals 1.

Bank 1061 in bank group X includes column decoder circuit 1071, row decoder circuit 1072, sense amplifiers 1081, and rows of memory cells including row 1091. If bank 1061 is the bank indicated by bank address AB, row decoder circuit 1072 selects the row of memory cells in bank 1061 identified by address AR. Sense amplifiers 1081 sense and latch data from the selected row of memory cells in bank 1061. Column decoder 1071 selects contents of the sense amplifiers 1081 based on column addresses ACH and ACL/T for the read transaction. Column decoder 1071 provides the data blocks or tag blocks accessed from the memory cells in the selected row and column to first multiplexing inputs of multiplexer circuits 1031-1032 as signals DX1A,B or signals TX1A,B, respectively.

Bank 1063 in bank group Y includes column decoder circuit 1073, row decoder circuit 1074, sense amplifiers 1082, and rows of memory cells including row 1092. If bank address AB identifies bank 1063, row decoder circuit 1074 selects the row of memory cells in bank 1063 identified by address AR. Sense amplifiers 1082 are associated with the columns of memory cells in bank 1063. Sense amplifiers 1082 sense and latch data from the selected row of memory cells in bank 1063. Column decoder 1073 selects contents of the sense amplifiers 1082 based on column addresses ACH and ACL/T for the read transaction. Column decoder 1073 provides the accessed data blocks or tag blocks from the memory cells in the selected row and the selected columns to second multiplexing inputs of multiplexer circuits 1031-1032 as signals DY1A,B or TY1A,B.

Bank group X provides the two data blocks as signals DX1A,B or the two tag blocks as signals TX1A,B to the first multiplexing inputs of multiplexer circuits 1031-1032, depending on the bank group indicated by signals AG2. Bank group Y provides the two data blocks as signals DY1A,B or the two tag blocks as signals TY1A,B to the second multiplexing inputs of multiplexer circuits 1031-1032, depending on the bank group indicated by signals AG2. Delay circuit 1023 delays signals AG2 to generate delayed signals AGD, which are provided to select inputs of multiplexer circuits 1031-1032.

Multiplexer circuits 1031 provide the two data blocks accessed from bank group X or bank group Y to interface circuit 1051 as signals DX2A,B or signals DY2A,B, respectively. Multiplexer circuits 1032 provide the two tag blocks accessed from bank group X or bank group Y to multiplexing inputs of multiplexer circuits 1033 as signals TX2A,B or signals TY2A,B, respectively.

The low column address ACL is provided to delay circuit 1022 as signals ACLS from register 1014. Delay circuit 1022 delays signals ACLS to generate delayed signals ACLD, which are provided to select inputs of multiplexer circuits 1033. Multiplexer circuits 1033 select two tags from signals TX2A,B or TY2A,B that are associated with the two data blocks identified by signals DX2A,B or DY2A,B, respectively, based on the low column address ACL identified by signals ACLD. The two tags selected by multiplexer circuits 1033 from signals TX2A,B or TY2A,B are provided to interface circuit 1052 as signals TX3A,B or TY3A,B, respectively.

Interface circuit 1051 transmits signals DX2A,B or signals DY2A,B to interface circuit 1041 in processor integrated circuit 1002 as signals DX3A and DX3B or signals DY3A and DY3B, respectively. Interface circuit 1041 provides signals DX3A and DX3B or signals DY3A and DY3B to multiplexing inputs of multiplexer circuits 1037 as signals DX4A and DX4B or signals DY4A or DY4B, respectively. If the data blocks are accessed from bank group X, signals DX4A identify the first data block, and signals DX4B identify the second data block. If the data blocks are accessed from bank group Y, signals DY4A identify the first data block, and signals DY4B identify the second data block.

Interface circuit 1052 provides signals TX3A,B or TY3A,B to interface circuit 1042 in processor integrated circuit 1002 as signals TX4A and TX4B or signals TY4A and TY4B, respectively. Interface circuit 1042 provides signals TX4A and TX4B or signals TY4A and TY4B to inputs of tag compare circuit 1038 as signals TX5A and TX5B or TY5A and TY5B, respectively.

If the tag blocks are accessed from bank group X, signals TX5A indicate the tag for the first data block, and signals TX5B indicate the tag for the second data block. If the tag blocks are accessed from bank group Y, signals TY5A indicate the tag for the first data block, and signals TY5B indicate the tag for the second data block. Tag compare circuit 1038 compares the upper address ATH of the data block requested by the read transaction and identified by delayed signals AHD to the two tags indicated by signals TX5A and TX5B or TY5A and TY5B.

Tag compare circuit 1038 generates a Hit/Miss signal indicating if one of the two tags indicated by signals TX5A and TX5B or TY5A and TY5B matches the upper address ATH indicated by signals AHD. The Hit/Miss signal is provided to an input of access control circuit 1039.

If one of the two tags indicated by signals TX5A and TX5B or TY5A and TY5B matches the upper address ATH indicated by signals AHD, tag compare circuit 1038 generates a TC signal (or TC signals) indicating which of the two tags indicated by signals TX5A and TX5B or TY5A and TY5B matches the upper address ATH indicated by signals AHD. The TC signal is provided to select inputs of multiplexer circuits 1037. If the TC signal indicates that the tag identified by signals TX5A or TY5A matches upper address ATH, multiplexer circuits 1037 provide the data block identified by signals DY4A or DX4A, respectively, to inputs of access control circuit 1039 as signals ADB. If the TC signal indicates that the tag identified by signals TX5B or TY5B matches upper address ATH, multiplexer circuits 1037 provide the data block identified by signals DY4B or DX4B, respectively, to inputs of access control circuit 1039 as signals ADB.

Signals PHY1 are provided to inputs of access control circuit 1039. If access control circuit 1039 receives a Hit state in the Hit/Miss signal indicating one of the two tags matches the upper address ATH after receiving a new set of signals PHY1, access control circuit 1039 provides the data block identified by signals ADB as the Read Data signals to additional circuitry in processor core 1010. The Read Data signals indicate the read data requested by processor core 1010.

If access control circuit 1039 receives a Miss state in the Hit/Miss signal indicating that neither one of the two tags matches the upper address ATH after receiving a new set of signals PHY1, access control circuit 1039 provides the physical address to main memory integrated circuit 1001 as signals PHY2. In response to receiving signals PHY2 from access control circuit 1039, main memory integrated circuit 1001 provides the requested data block to access control circuit 1039 as signals MMRD. Access control circuit 1039 then provides the data block received from main memory integrated circuit 1001 as the Read Data signals. Processor integrated circuit 1002 also stores the data block received from main memory integrated circuit 1001 as signals MMRD in memory integrated circuit 1005 in a subsequent write transaction.

Figure 11:
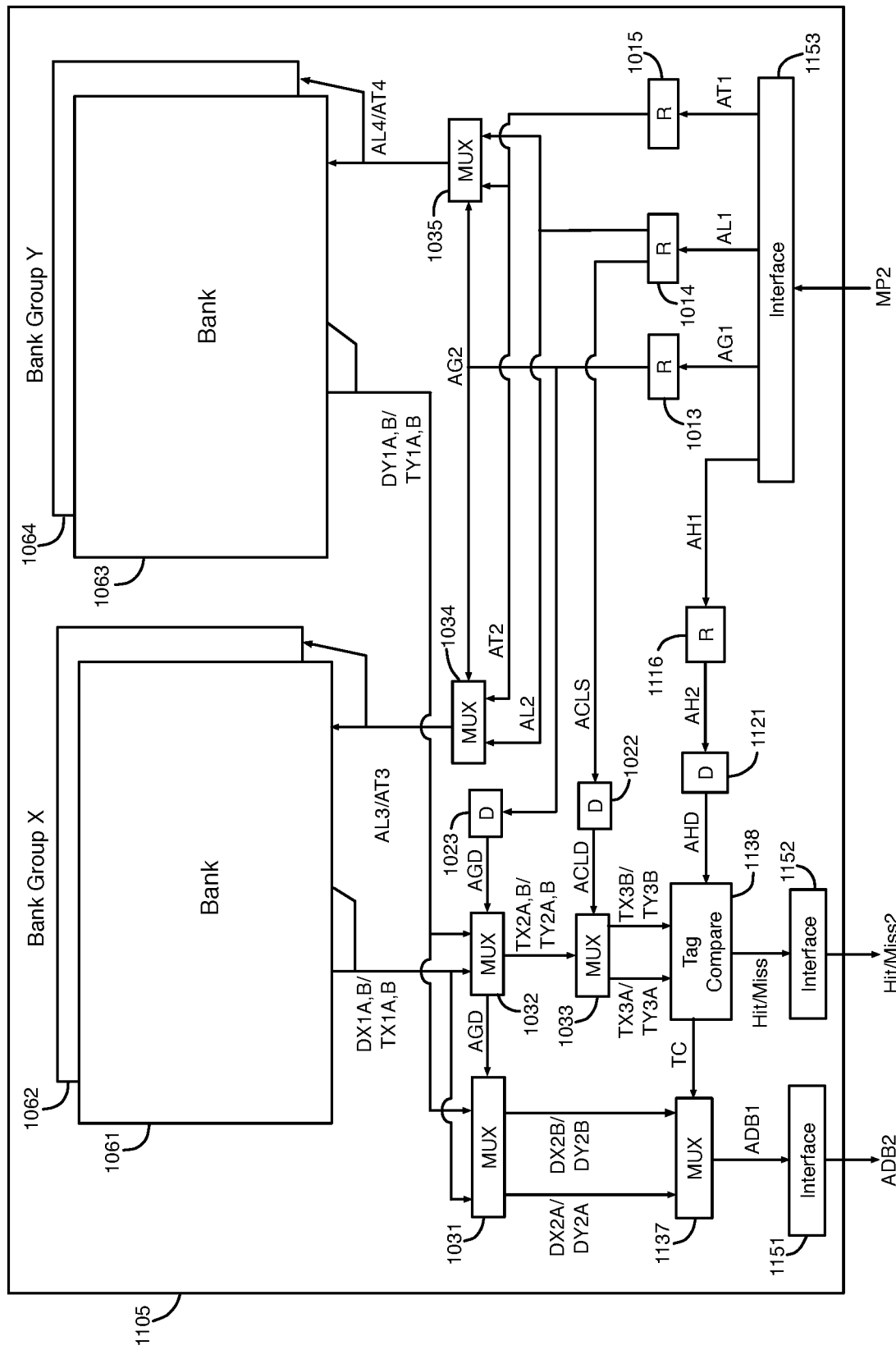
FIG. 11 illustrates another example of a cache memory integrated circuit that accesses two data blocks stored at two different column addresses during each read transaction.

FIG. 11 illustrates another example of a cache memory integrated circuit that accesses two data blocks stored at two different column addresses during each read transaction. In the embodiment of FIG. 11, the tag compare circuit 1138 is in cache memory integrated circuit 1105, instead of in the processor integrated circuit. Memory integrated circuit 1105 includes tag compare circuit 1138 and a multiplexer circuit 1137 that are not in memory integrated circuit 1005. Multiplexer circuit 1137 selects one of two data blocks accessed from memory according to an output signal generated based on two tag comparisons performed by tag compare circuit 1138. Memory integrated circuit 1105 has less interface signals than memory integrated circuit 1005.

The upper address ATH and addresses AG, AB, AR, ACH, ACL, and T are provided from the processor integrated circuit to interface circuit 1153 in cache memory integrated circuit 1105 in signals MP2. Interface circuit 1153 provides the upper address ATH as signals AH1 to register circuit 1116, which stores signals AH1. The upper address ATH is provided from register circuit 1116 to delay circuit 1121 as signals AH2. Delay circuit 1121 delays signals AH2 to generate delayed signals AHD. Delayed signals AHD are provided to inputs of tag compare circuit 1138.

Tag compare circuit 1138 compares the upper address ATH identified by signals AHD to the tags identified by signals TX3A and TX3B or by signals TY3A and TY3B to generate the Hit/Miss signal and the TC signal. Interface circuit 1152 transmits the Hit/Miss signal to the processor integrated circuit as signal Hit/Miss2. The TC signal is provided to the select inputs of multiplexer circuits 1137. The TC signal indicates which of the two data blocks corresponds to the upper address ATH. If the TC signal indicates that the tag identified by signals TX3A or TY3A matches upper address ATH, multiplexer circuits 1137 provide the data block identified by signals DY2A or DX2A, respectively, to interface circuit 1151 as signals ADB1. If the TC signal indicates that the tag identified by signals TX3B or TY3B matches upper address ATH, multiplexer circuits 1137 provide the data block identified by signals DY2B or DX2B, respectively, to inputs of interface circuit 1151 as signals ADB1.

Interface circuit 1151 transmits the data block selected by multiplexer circuits 1137 to the processor integrated circuit as signals ADB2. The processor integrated circuit either provides the data block identified by signals ADB2 as the Read Data signals or accesses the requested data from the main memory integrated circuit based on the state of the Hit/Miss2 signal, as described above, e.g., with respect to FIG. 8A.

Figure 12A:
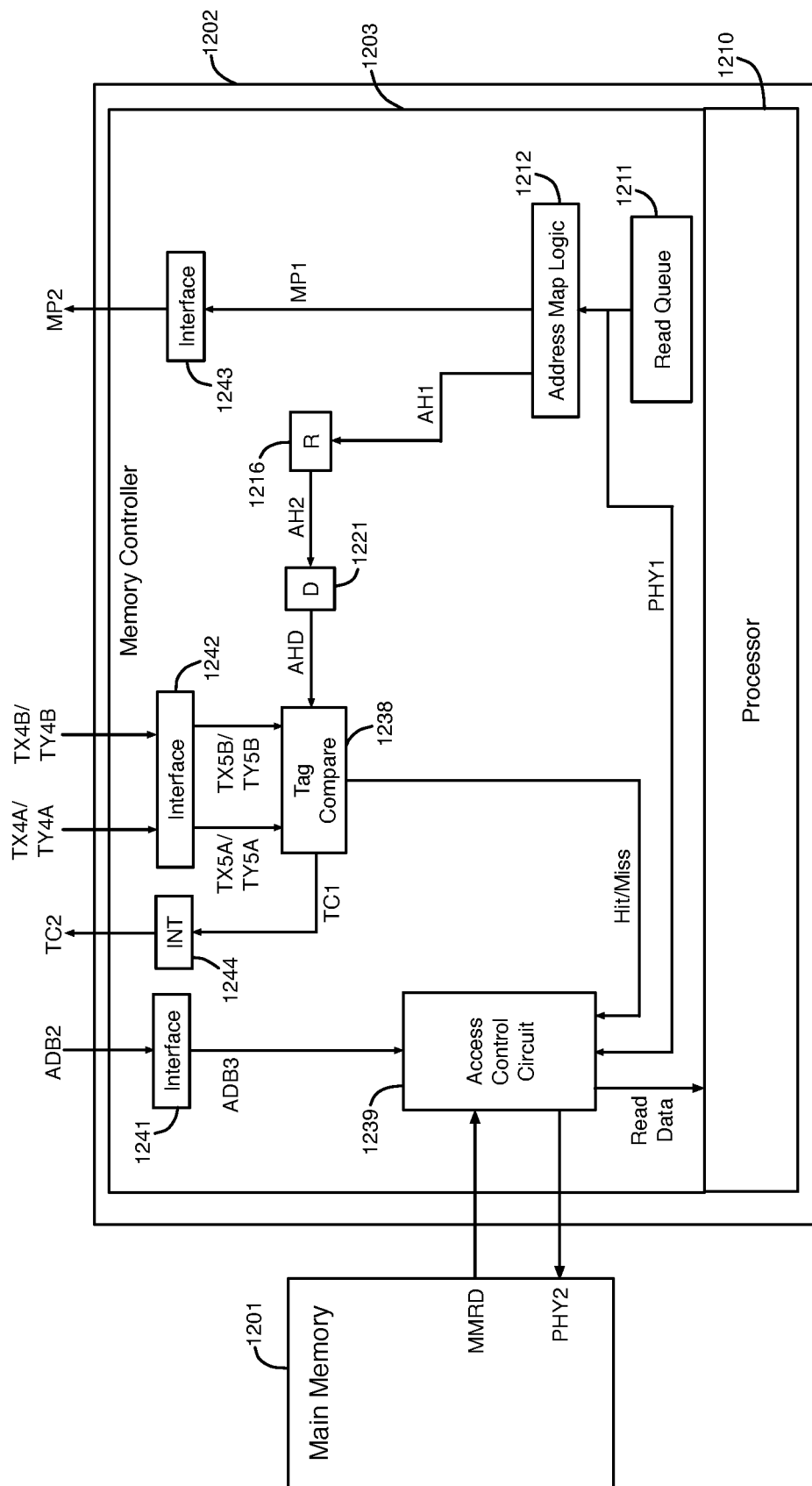
FIGS. 12A-12B illustrate an example of a system that accesses one of two data blocks stored at two different column addresses in cache memory during each read transaction.
Figure 12B:
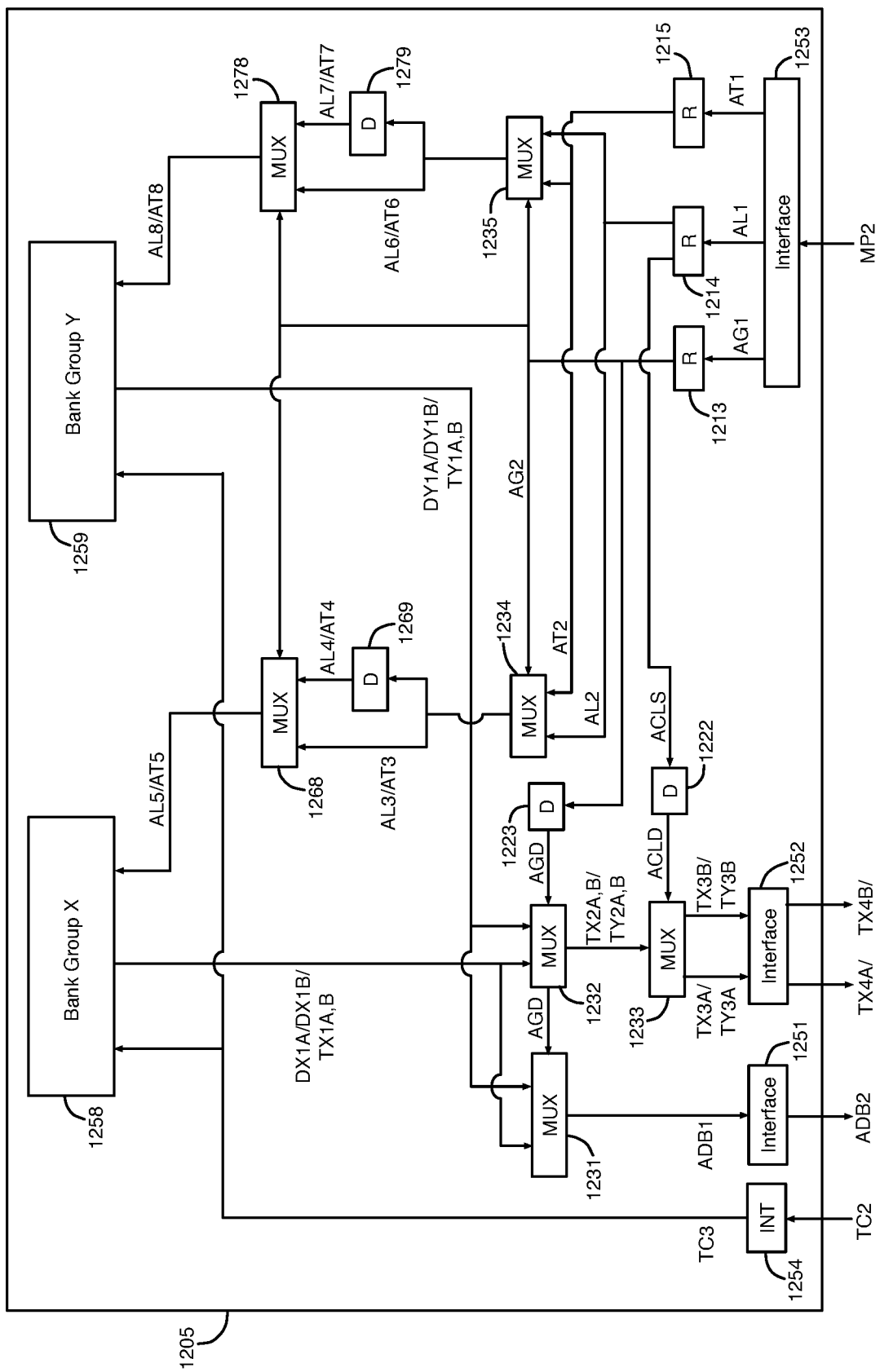

FIGS. 12A-12B illustrate an example of a system that accesses one of two data blocks stored at two different column addresses in cache memory during each read transaction. The data block requested in each read transaction and the tag for the data block are stored in different bank groups of memory cells in cache memory, as described above with respect to previous embodiments. In the embodiment of FIGS. 12A-12B, the cache memory integrated circuit accesses two tags during each read transaction. The processor integrated circuit compares the two tags to the upper address ATH for the read transaction. The cache memory integrated circuit accesses the data block corresponding to the tag that matches the upper address ATH and transmits the accessed data block to the processor integrated circuit.

In the embodiment of FIGS. 12A-12B, the tag access and data access operations are performed at different times. Two tags are accessed from the cache memory integrated circuit and returned to the memory controller circuit for comparison. A selection signal TC2 is transmitted to the cache memory integrated circuit to select one of two data blocks by adjusting the column address for the data access. The embodiment of FIGS. 12A-12B has less circuitry that implements access paths between the bank groups of memory cells and the interface circuits on the cache memory integrated circuit compared to the embodiment of FIG. 10B. The embodiment of FIGS. 12A-12B introduces a time offset between the tag access and the data access, as described below.

The system of FIGS. 12A-12B includes main memory integrated circuit 1201 shown in FIG. 12A, processor integrated circuit 1202 shown in FIG. 12A, and cache memory integrated circuit 1205 shown in FIG. 12B. Processor integrated circuit 1202 includes processor core 1210 and memory controller circuit 1203. Memory controller circuit 1203 includes read queue circuit 1211, address map logic 1212, register circuit 1216, delay circuit 1221, access control circuit 1239, tag compare circuit 1238, and interface circuits 1241-1244. Cache memory integrated circuit 1205 includes interface circuits 1251-1254, register circuits 1213-1215, multiplexer circuits 1231-1235, delay circuits 1222-1223, bank group X 1258 of memory cells, and bank group Y 1259 of memory cells. Each of bank groups 1258-1259 has one or more banks of memory cells. The banks of memory cells in bank groups 1258-1259 may have, for example, the structure shown in and described above with respect to banks 1061 and 1063 in FIG. 10B.

Details of read transactions are now discussed with respect to FIGS. 12A-12B. After processor core 1210 issues a read transaction, processor core 1210 stores a physical address for the read transaction in read queue circuit 1211.

The physical address stored in read queue circuit 1211 is provided to address map logic circuit 1212 and to access control circuit 1239 as signals PHY1. Address map logic circuit 1212 maps the physical address to mapped addresses represented by signals MP1 and AH1. Signals MP1 identify the lower address ATL for the read transaction and address T. Lower address ATL includes addresses AG, AB, AR, ACH, and ACL. Signals AH1 identify the upper address ATH for the read transaction.

Signals AH1 are stored in register circuit 1216. Register 1216 provides the upper address ATH to delay circuit 1221 as signals AH2. Delay circuit 1221 delays signals AH2 from register 1216 to generate delayed signals AHD. Delayed signals AHD are provided to inputs of tag compare circuit 1238. The delay that delay circuit 1221 provides to signals AHD matches the delay to access data from cache memory integrated circuit 1205.

Mapped addresses AG, AB, AR, ACH, ACL, and T are provided to interface circuit 1243 as signals MP1. Interface circuit 1243 transmits the mapped address as signals MP2 to interface circuit 1253 in cache memory integrated circuit 1205. Interface circuit 1253 provides address AG to register circuit 1213 as signals AG1, addresses AB, AR, ACH, and ACL to register circuit 1214 as signals AL1, and addresses AB, AR, ACH, and T to register circuit 1215 as signals AT1. The bank group address AG is provided from register circuit 1213 to select inputs of multiplexer circuits 1234-1235, 1268, and 1278 as signals AG2. Addresses AB, AR, ACH, and ACL are provided from register circuit 1214 to first multiplexing inputs of multiplexer circuits 1234-1235 as signals AL2. Addresses AB, AR, ACH, and T are provided from register circuit 1215 to second multiplexing inputs of multiplexer circuits 1234-1235 as signals AT2.

Multiplexer circuits 1234 provide either addresses AB, AR, ACH, and ACL as signals AL3 or addresses AB, AR, ACH, and T as signals AT3 to first multiplexing inputs of multiplexer circuits 1268 and inputs of delay circuit 1269, depending on the bank group indicated by signals AG2. Multiplexer circuits 1235 provide either addresses AB, AR, ACH, and ACL as signals AL6 or addresses AB, AR, ACH, and T as signals AT6 to first multiplexing inputs of multiplexer circuits 1278 and inputs of delay circuit 1279, depending on the bank group indicated by signals AG2.

Delay circuit 1269 delays signals AL3/AT3 to generate delayed signals AL4/AT4. The delay that delay circuit 1269 provides to delayed signals AL4/AT4 relative to signals AL3/AT3 matches the delay to access the tag from bank group Y 1259, compare the tag to the upper address ATH, and provide a signal indicating the result of the comparison to bank group X 1258. Delayed signals AL4/AT4 are provided to second multiplexing inputs of multiplexer circuits 1268. Multiplexer circuits 1268 select either signals AT3 or delayed signals AL4 as signals AL5/AT5 based on the bank group address AG indicated by signals AG2. Signals AL5/AT5 are provided to inputs of bank group X 1258.

Delay circuit 1279 delays signals AL6/AT6 to generate delayed signals AL7/AT7. The delay that delay circuit 1279 provides to delayed signals AL7/AT7 relative to signals AL6/AT6 matches the delay to access the tag from bank group X 1258, compare the tag to the upper address ATH, and provide a signal indicating the result of the comparison to bank group Y 1259. Delayed signals AL7/AT7 are provided to second multiplexing inputs of multiplexer circuits 1278. Multiplexer circuits 1278 select either signals AT6 or delayed signals AL7 as signals AL8/AT8 based on the bank group address AG indicated by signals AG2. Signals AL8/AT8 are provided to inputs of bank group Y 1259.

If the bank group address AG indicates that the data block requested by the read transaction is stored in bank group X 1258, then multiplexer circuits 1268 select delayed signals AL4 as signals AL5, and multiplexer circuits 1278 select signals AT6 as signals AT8. The bank of memory cells indicated by the bank address AB in bank group Y 1259 then accesses a first tag block stored at addresses AR, ACH, and T and a second tag block stored at addresses AR, ACH, and T+Z based on signals AT8. Bank group Y 1259 provides the two accessed tag blocks to first multiplexing inputs of multiplexer circuits 1231-1232 as signals TY1A,B.

If the bank group address AG indicates that the data block requested by the read transaction is stored in bank group Y 1259, then multiplexer circuits 1268 select signals AT3 as signals AT5, and multiplexer circuits 1278 select delayed signals AL7 as signals AL8. The bank of memory cells indicated by the bank address AB in bank group X 1258 then accesses a first tag block stored at addresses AR, ACH, and T and a second tag block stored at addresses AR, ACH, and T+Z based on signals AT5. Bank group X 1258 provides the two accessed tag blocks to second multiplexing inputs of multiplexer circuits 1231-1232 as signals TX1A,B.

Delay circuit 1223 delays signals AG2 to generate delayed signals AGD. Delayed signals AG2 are provided to select inputs of multiplexer circuits 1231-1232. If the bank group address AG indicates that the data block requested by the read transaction is stored in bank group X 1258, then multiplexer circuits 1232 select signals TY1A,B as signals TY2A,B at the outputs of multiplexer circuits 1232. If the bank group address AG indicates that the data block requested by the read transaction is stored in bank group Y 1259, then multiplexer circuits 1232 select signals TX1A,B as signals TX2A,B at the outputs of multiplexer circuits 1232.

Delay circuit 1222 receives signals ACLS from register 1214 indicating the low column address ACL. Delay circuit 1222 delays signals ACLS to generate delayed signals ACLD. Delayed signals ACLD are provided to select inputs of multiplexer circuits 1233. Multiplexer circuits 1233 select the tags in the tag blocks represented by signals TX2A,B or signals TY2A,B as signals TX3A-TX3B or as signals TY3A-TY3B, respectively, based on the low column address ACL indicated by delayed signals ACLD. Interface circuit 1252 transmits the tags selected by multiplexer circuits 1233 to interface circuit 1242 in processor integrated circuit 1202 as signals TX4A and TX4B or as signals TY4A and TY4B. Interface circuit 1242 provides signals TX4A and TX4B or signals TY4A and TY4B to inputs of tag compare circuit 1238 as signals TX5A and TX5B or signals TY5A and TY5B, respectively.

If the tag blocks are accessed from bank group X, signals TX5A indicate the tag for the first data block, and signals TX5B indicate the tag for the second data block. If the tag blocks are accessed from bank group Y, signals TY5A indicate the tag for the first data block, and signals TY5B indicate the tag for the second data block. Tag compare circuit 1238 compares the upper address ATH identified by delayed signals AHD to the two tags indicated by signals TX5A and TX5B or TY5A and TY5B.

Tag compare circuit 1238 generates a Hit/Miss signal indicating if one of the two tags in signals TX5A and TX5B or TY5A and TY5B matches the upper address ATH in signals AHD. The Hit/Miss signal is provided to an input of access control circuit 1239.

If one of the two tags in signals TX5A and TX5B or TY5A and TY5B matches the upper address ATH in signals AHD, tag compare circuit 1238 generates a signal TC1 (or signals TC1) indicating which of the two tags in signals TX5A and TX5B or TY5A and TY5B matches the upper address ATH in signals AHD. Signal TC1 is provided to interface circuit 1244. Interface circuit 1244 transmits the state of the TC1 signal to interface circuit 1254 in cache memory integrated circuit 1205 in signal TC2. Interface circuit 1254 provides the state of the TC2 signal to bank groups 1258-1259 in signal TC3, as shown in FIG. 12B.

If signal TC3 indicates that the tag identified by signals TX5A or TY5A matches upper address ATH, and the bank group address AG indicates that the data block requested by the read transaction is stored in bank group X 1258, then bank group X 1258 access the data block stored at addresses AB, AR, ACH, and ACL. Bank group 1258 receives the addresses as signals AL5 from multiplexer circuits 1268, which generate signals AL5 based on delayed signals AL4. Bank group 1258 provides the accessed data block to the second multiplexing inputs of multiplexer circuits 1231-1232 as signals DX1A.

If signal TC3 indicates that the tag identified by signals TX5B or TY5B matches upper address ATH, and the bank group address AG indicates that the data block requested by the read transaction is stored in bank group X 1258, then bank group X 1258 access the data block at addresses AB, AR, ACH, and ACL+Z based on signals AL5, and provides the accessed data block to the second multiplexing inputs of multiplexer circuits 1231-1232 as signals DX1B. Parameter Z is an offset address value (e.g., +1 or −1) that indicates a modification to the low column address ACL for accessing a data block.

If signal TC3 indicates that the tag identified by signals TX5A or TY5A matches upper address ATH, and the bank group address AG indicates that the data block requested by the read transaction is stored in bank group Y 1259, then bank group Y 1259 access the data block stored at addresses AB, AR, ACH, and ACL. Bank group 1259 receives the addresses as signals AL8 from multiplexer circuits 1278, which select signals AL8 based on delayed signals AL7. Bank group 1259 provides the accessed data block to the first multiplexing inputs of multiplexer circuits 1231-1232 as signals DY1A.

If signal TC3 indicates that the tag identified by signals TX5B or TY5B matches upper address ATH, and the bank group address AG indicates that the data block requested by the read transaction is stored in bank group Y 1259, then bank group Y 1259 access the data block at addresses AB, AR, ACH, and ACL+Z based on signals AL8, and provides the accessed data block to the first multiplexing inputs of multiplexer circuits 1231-1232 as signals DY1B.

Multiplexer circuits 1231 provide either signals DX1A/DX1B or signals DY1A/DY1B to inputs of interface circuit 1251 based on the bank group address AG indicated by the delayed signals AGD. If bank group address AG indicates that the data block requested by the read transaction is stored in bank group X 1258, and bank group X 1258 accesses signals DX1A, then multiplexer circuits 1231 provide the data block in signals DX1A to inputs of interface circuit 1251 as signals ADB1. If bank group address AG indicates that the data block is stored in bank group X 1258, and bank group X 1258 accesses signals DX1B, then multiplexer circuits 1231 provide the data block in signals DX1B to inputs of interface circuit 1251 as signals ADB1. If bank group address AG indicates that the data block is stored in bank group Y 1259, and bank group Y 1259 accesses signals DY1A, then multiplexer circuits 1231 provide the data block in signals DY1A to inputs of interface circuit 1251 as signals ADB1. If bank group address AG indicates that the data block is stored in bank group Y 1259, and bank group Y 1259 accesses signals DY1B, then multiplexer circuits 1231 provide the data block in signals DY1B to inputs of interface circuit 1251 as signals ADB1.

Interface circuit 1251 provides the accessed data block to interface circuit 1241 in processor integrated circuit 1202 as signals ADB2. Interface circuit 1241 provides the accessed data block to access control circuit 1239 as signals ADB3. If the Hit/Miss signal indicates that one of the accessed tags matches upper address ATH, access control circuit 1239 provides the data block in signals ADB3 to other circuitry in processor core 1210 as the Read Data signals. If the Hit/Miss signal indicates that neither one of the accessed tags matches upper address ATH, access control circuit 1239 provides the physical address as signals PHY2 to main memory integrated circuit 1201. Main memory integrated circuit 1201 accesses a data block stored at the physical address indicated by signals PHY2. Main memory integrated circuit 1201 provides the data block as signals MMRD to processor integrated circuit 1202. Access control circuit 1239 provides the data block received from main memory integrated circuit 1201 to other circuitry in processor core 1210 as the Read Data signals.

Figure 13:
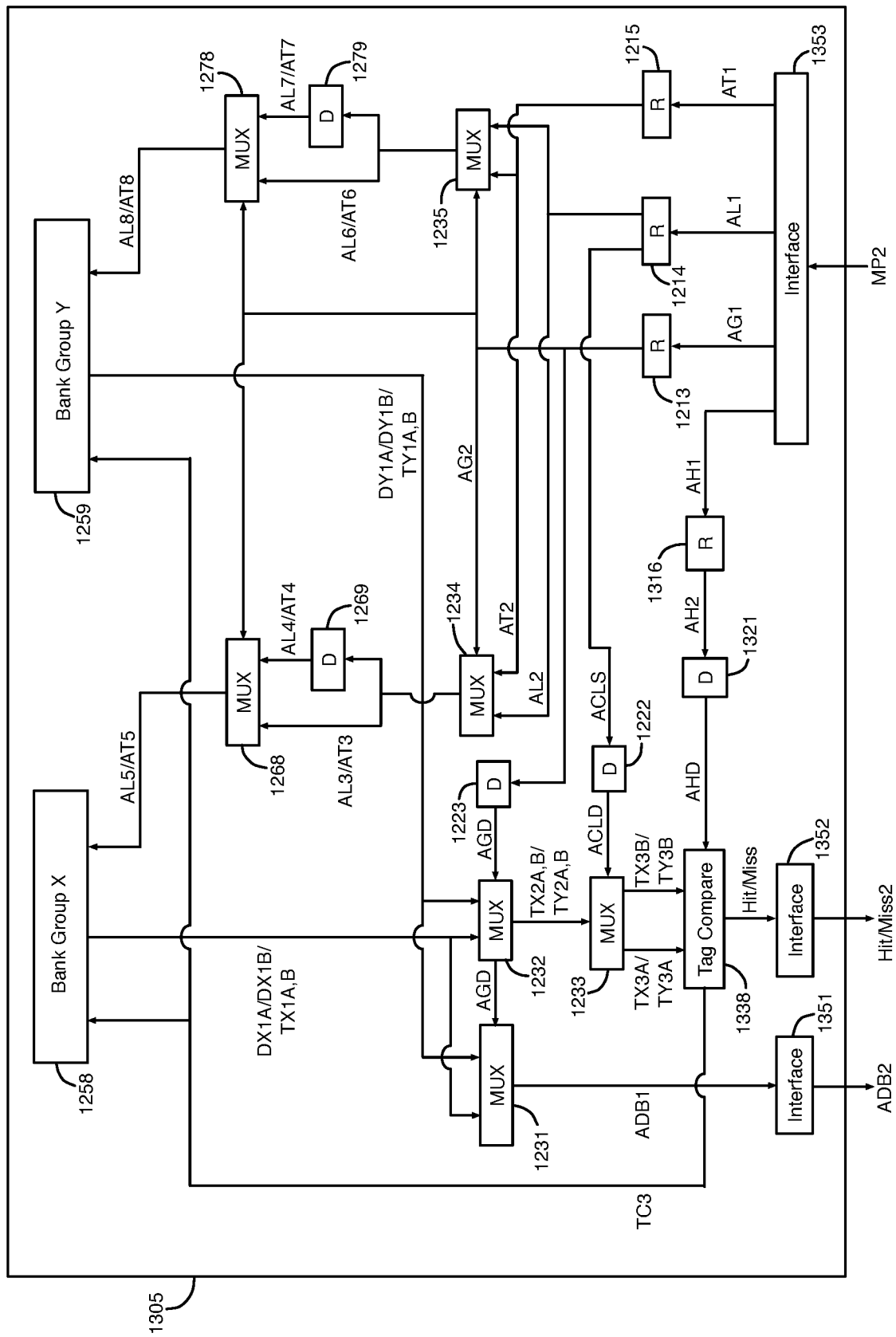
FIG. 13 illustrates another example of a cache memory integrated circuit that accesses one of two data blocks stored at two different column addresses during each read transaction.

FIG. 13 illustrates another example of a cache memory integrated circuit 1305 that accesses one of two data blocks stored at two different column addresses during each read transaction. The data block requested in each read transaction and the tag for the data block are stored in different bank groups of memory cells in cache memory. In the embodiment of FIG. 13, the tag compare circuit 1338 is in cache memory integrated circuit 1305.

In the embodiment of FIG. 13, the tag comparison is performed by tag compare circuit 1338 on cache memory integrated circuit 1305, instead of by the memory controller circuit. Performing the tag comparison in cache memory integrated circuit 1305 reduces the time offset between the tag access and the data access, and retains the benefit of reducing the access paths between the interface circuits and the bank groups of memory cells on cache memory integrated circuit 1305.

The upper address ATH and addresses AB, AR, ACH, ACL, and T are provided from the processor integrated circuit to interface circuit 1353 in cache memory integrated circuit 1305 in signals MP2. Interface circuit 1353 provides the upper address ATH as signals AH1 to register circuit 1316, which stores signals AH1. The upper address ATH is provided from register circuit 1316 to delay circuit 1321 as signals AH2. Delay circuit 1321 delays signals AH2 to generate delayed signals AHD. Delayed signals AHD are provided to inputs of tag compare circuit 1338. Interface circuit 1353 provides signals AG1 to register circuit 1213, signals AL1 to register circuit 1214, and signals AT1 to register circuit 1215.

Tag compare circuit 1338 compares the upper address ATH identified by signals AHD to the tags identified by signals TX3A and TX3B or by signals TY3A and TY3B to generate signals Hit/Miss and TC3. Interface circuit 1352 transmits the state of the Hit/Miss signal to the processor integrated circuit in signal Hit/Miss2. Signal TC3 is provided to inputs of bank groups 1258-1259. Bank group 1258 or 1259 accesses a data block based on addresses received as signals AL5 or AL8, respectively, and based on signal TC3, as described above with respect to FIG. 12B.

Interface circuit 1351 transmits the data block selected by multiplexer circuits 1231 as signals ADB1 to the processor integrated circuit as signals ADB2. The memory controller circuit provides either the data block in signals ADB2 or data accessed from the main memory integrated circuit to other circuitry in the processor core based on the state of the Hit/Miss2 signal, as described above, e.g., with respect to FIG. 8A.

Figure 14:
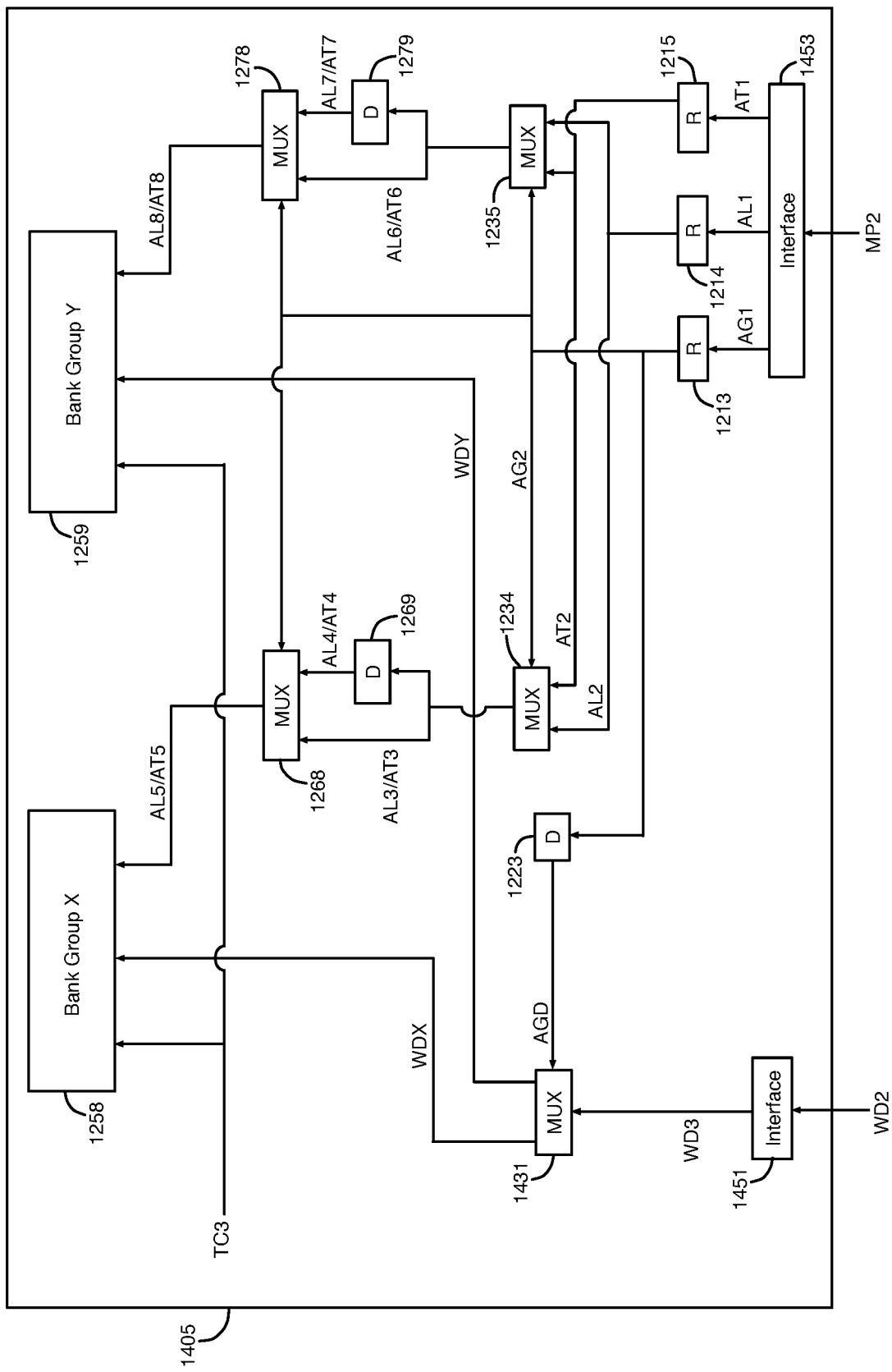
FIG. 14 illustrates an example of a cache memory integrated circuit that selects one of two different column addresses for each write transaction based on a tag that matches an upper address and stores a data block at the selected column address for the write transaction.

FIG. 14 illustrates an example of a cache memory integrated circuit 1405 that selects one of two different column addresses for each write transaction based on a tag that matches the upper address ATH and stores a data block at the selected column address for the write transaction. In the embodiment of FIG. 14, the tag compare circuit may be located in cache memory integrated circuit 1405 as shown in FIG. 13 or in the processor integrated circuit as shown in FIG. 12A. The tag compare circuit is not shown in FIG. 14.

Cache memory integrated circuit 1405 includes interface circuits 1451 and 1453, registers 1213-1215, multiplexer circuits 1234-1235, 1431, 1268, and 1278, delay circuits 1223, 1269, and 1279, and bank groups 1258-1259. The processor integrated circuit provides the mapped addresses for each write transaction to interface circuit 1453 as signals MP2. The bank group address AG is provided from interface circuit 1453 to register circuit 1213 as signals AG1. Addresses AB, AR, ACH, and ACL are provided from interface circuit 1453 to register circuit 1214 as signals ALE Addresses AB, AR, ACH, and T are provided from interface circuit 1453 to register circuit 1215 as signals AT1. Register circuits 1213-1215, multiplexer circuits 1234-1235, delay circuits 1269 and 1279, and multiplexer circuits 1268 and 1278 function as described above with respect to FIG. 12B.

Bank group 1258 or 1259 accesses two tag blocks based on signals AT5 or AT8, respectively, as described above with respect to FIGS. 12B and 13. Multiplexer circuits 1233 (not shown in FIG. 14) select two tags from among the accessed tag blocks, as described above with respect to FIGS. 12B and 13. The tag compare circuit (not shown in FIG. 14) compares the two tags to the upper address ATH to generate the TC3 and Hit/Miss signals, as described above with respect to FIGS. 12B and 13.

The processor integrated circuit provides the data block for the write transaction to interface circuit 1451 as signals WD2. Interface circuit 1451 provides the data block to multiplexing inputs of multiplexer circuits 1431 as signals WD3. Delay circuit 1223 delays signals AG2 to generate delayed signals AGD, which are provided to select inputs of multiplexer circuits 1431.

If delayed signals AGD indicate that the data block is requested to be stored in bank group X, multiplexer circuits 1431 select signals WD3 to be provided to bank group 1258 as signals WDX. Bank group 1258 stores the data block in signals WDX based on the addresses indicated by signals AL5 and TC3. The addresses indicated by signals AL5 and TC3 are either AB, AR, ACH, and ACL or AB, AR, ACH, and ACL+Z, depending on the state of signal TC3.

If delayed signals AGD indicate that the data block is requested to be stored in bank group Y, multiplexer circuits 1431 select signals WD3 to be provided to bank group 1259 as signals WDY. Bank group 1259 stores the data block in signals WDY based on the addresses indicated by signals AL8 and TC3. The addresses indicated by signals AL8 and TC3 are either AB, AR, ACH, and ACL or AB, AR, ACH, and ACL+Z, depending on the state of signal TC3.

Figure 15:
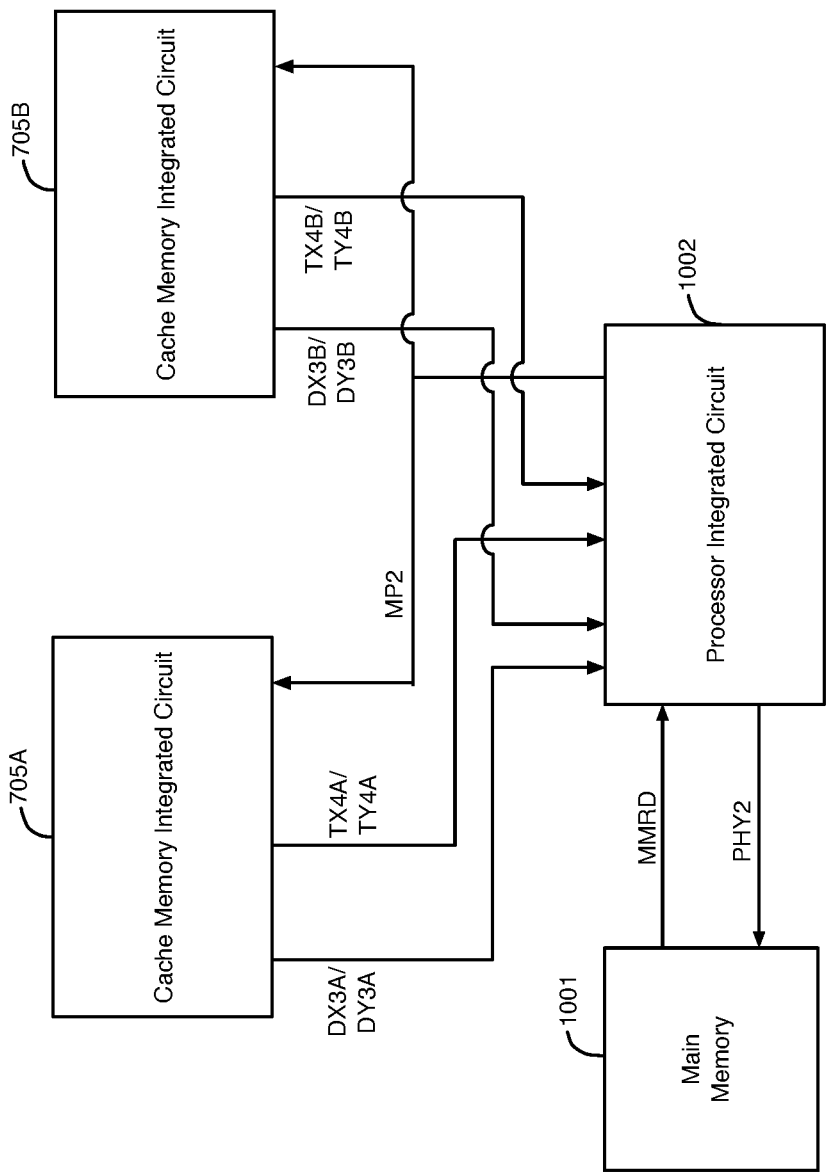
FIG. 15 illustrates an example of a system that includes two cache memory integrated circuits, a processor integrated circuit, and a main memory integrated circuit.

FIG. 15 illustrates an example of a system that includes two cache memory integrated circuits 705A-705B, a processor integrated circuit 1002, and a main memory integrated circuit 1001. Cache memory integrated circuits 705A-705B each have the structure shown in FIG. 7B and the functionality described above with respect to cache memory integrated circuit 705. The structures and functions of processor integrated circuit 1002 and main memory integrated circuit 1001 are described above with respect to FIG. 10A.

In the embodiment of FIG. 15, the tag for each data block accessed during a read transaction is stored in the same cache memory integrated circuit as the data block. In an alternative embodiment, the tag for each data block accessed during a read transaction is stored in a different cache memory integrated circuit than the cache memory integrated circuit storing the data block.

In the embodiment of FIG. 15, processor integrated circuit 1002 transmits mapped addresses for each read transaction as signals MP2 to both cache memory integrated circuits 705A-705B. The mapped addresses include a bank group address that identifies one of the bank groups of memory cells in each of the two cache memory integrated circuits 705A-705B where data is accessed during each read transaction.

In response to receiving the mapped addresses in signals MP2 for each read transaction, cache memory integrated circuit 705A accesses a first data block stored at the mapped addresses AG, AB, AR, ACH, and ACL, and cache memory integrated circuit 705B accesses a second data block stored at the mapped addresses AG, AB, AR, ACH, and ACL. Cache memory integrated circuit 705A provides the first accessed data block as signals DX3A/DY3A to processor integrated circuit 1002 and the tag for the first accessed data block as signals TX4A/TY4A to processor integrated circuit 1002. Cache memory integrated circuit 705B provides the second accessed data block as signals DX3B/DY3B to processor integrated circuit 1002 and the tag for the second accessed data block as signals TX4B/TY4B to processor integrated circuit 1002.

Signals ADB2 in FIG. 7B correspond to signals DX3A/DY3A in cache memory integrated circuit 705A and signals DX3B/DY3B in cache memory integrated circuit 705B. Signals TAG2 in FIG. 7B correspond to signals TX4A/TY4A in cache memory integrated circuit 705A and signals TX4B/TY4B in cache memory integrated circuit 705B. Processor integrated circuit 1002 selects one of the first and second data blocks accessed from cache memory integrated circuits 705A-705B based on which of the tags received from cache memory integrated circuits 705A-705B matches the upper address ATH for the read transaction, as described above with respect to FIG. 10A.

Figure 16:
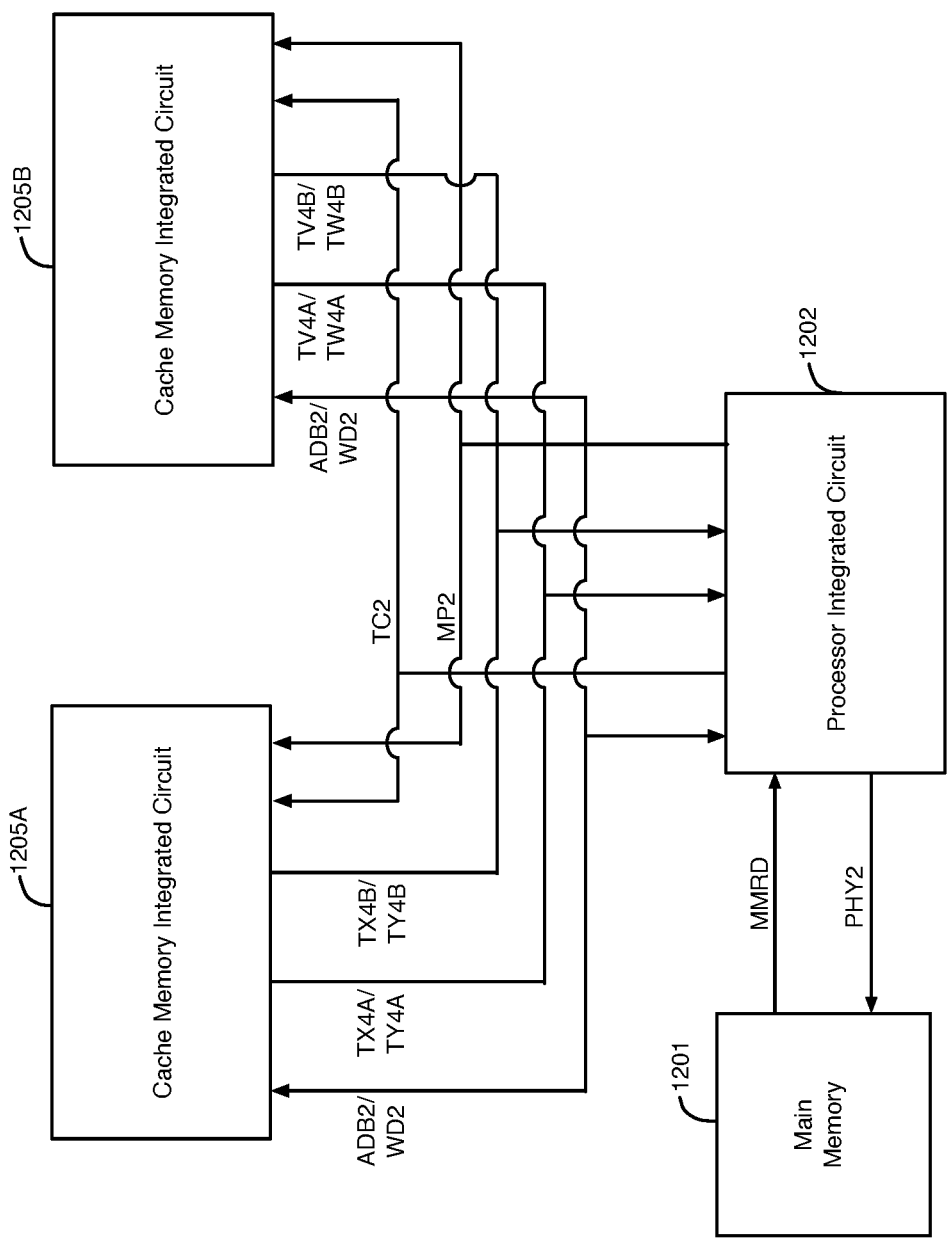
FIG. 16 illustrates an example of a system that includes two cache memory integrated circuits, a processor integrated circuit, and a main memory integrated circuit.

FIG. 16 illustrates an example of a system that includes two cache memory integrated circuits 1205A-1205B, a processor integrated circuit 1202, and a main memory integrated circuit 1201. Cache memory integrated circuits 1205A-1205B each have the structure shown in FIG. 12B and the functionality described above with respect to cache memory integrated circuit 1205. The structures and functions of processor integrated circuit 1202 and main memory integrated circuit 1201 are shown in and described above with respect to FIG. 12A.

In the embodiment of FIG. 16, processor integrated circuit 1202 transmits mapped addresses as signals MP2 to both cache memory integrated circuits 1205A-1205B. Each of the bank groups of memory cells in cache memory integrated circuits 1205A-1205B is identified by a unique bank group address AG. The mapped addresses generated for each read transaction include a bank group address that identifies one bank group of memory cells in only one of cache memory integrated circuits 1205A-1205B where data is accessed during the read transaction.

In response to receiving the mapped addresses in signals MP2 for each read transaction, one of the cache memory integrated circuits 1205A-1205B accesses a first tag stored at the mapped addresses AB, AR, ACH, and T and a second tag stored at the mapped addresses AB, AR, ACH, and T+Z in a bank group (other than the bank group identified by address AG). If the tags are accessed from a bank group of memory cells in cache memory integrated circuit 1205A, the two accessed tags are transmitted to processor integrated circuit 1202 as signals TX4A/TY4A and TX4B/TY4B. If the tags are accessed from a bank group of memory cells in cache memory integrated circuit 1205B, the two accessed tags are transmitted to processor integrated circuit 1202 as signals TV4A/TW4A and TV4B/TW4B. Signals TV4A/TV4B and TW4A/TW4B are accessed from bank groups 1258-1259, respectively, in cache memory integrated circuit 1205B in the embodiment of FIG. 16.

Signals TX4A/TY4A and TX4B/TY4B or signals TV4A/TW4A and TV4B/TW4B are received at interface 1242 in processor integrated circuit 1202 and provided to inputs of tag compare circuit 1238 as signals TX5A/TY5A and TX5B/TY5B, respectively. Processor integrated circuit 1202 generates signal TC2 based on signals TX5A/TY5A, TX5B/TY5B, and AHD, as described above with respect to FIG. 12A. Signal TC2 is provided to cache memory integrated circuits 1205A-1205B. Cache memory integrated circuit 1205A or 1205B accesses the data block stored at addresses AG, AB, AR, ACH, and ACL or addresses AG, AB, AR, ACH, and ACL+Z based on the state of the TC2 signal, as described above with respect to FIG. 12B. Cache memory integrated circuit 1205A or 1205B transmits the accessed data block to processor integrated circuit 1202 as signals ADB2.

Cache memory integrated circuits 1205A-1205B each include the circuitry shown in FIG. 14 for write transactions. During each write transaction, mapped addresses are transmitted from processor integrated circuit 1202 to cache memory integrated circuits 1205A-1205B as signals MP2, and write data is transmitted from processor integrated circuit 1202 to cache memory integrated circuits 1205A-1205B as signals WD2. One of cache memory integrated circuits 1205A-1205B stores the write data after accessing two tags and comparing the tags to the upper address ATH to select a low column address for storing the write data, as described above with respect to FIG. 14.

Figure 17:
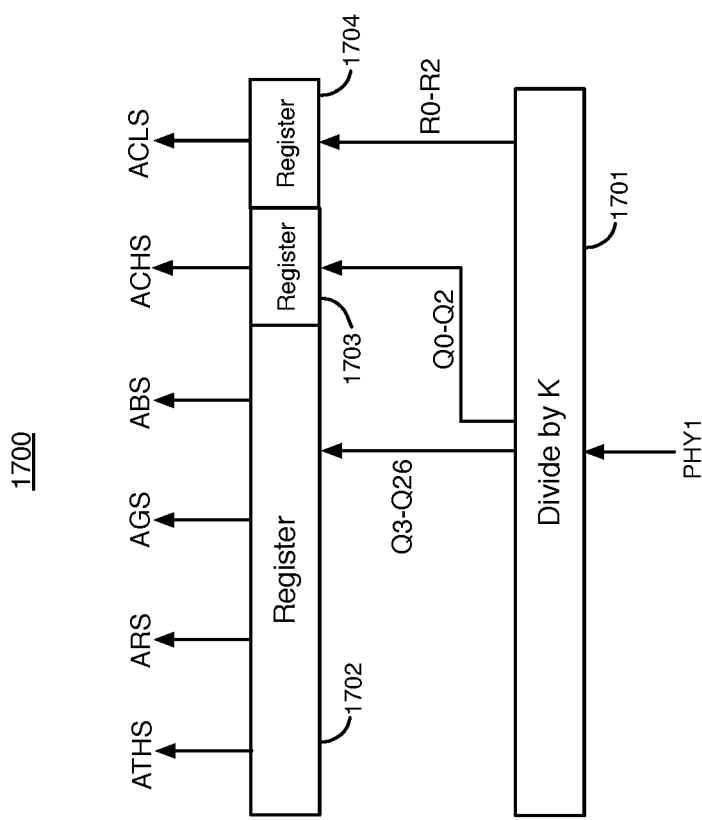
FIG. 17 illustrates an address map logic circuit.

FIG. 17 illustrates an address map logic circuit 1700. Address map logic circuit 1700 is an example of each of the address map logic circuits 212, 512, 712, 912, 1012, and 1212. Address map logic circuit 1700 includes divide by K circuit 1701 and register circuits 1702-1704. A physical address for a read or write transaction is provided to inputs of divide by K circuit 1701 as signals PHY1. According to an example that is described herein with respect to FIG. 17, but is not intended to be limiting, signals PHY1 have 27 parallel signals. Divide by K circuit 1701 divides the physical address by K to generate a quotient and a remainder.

K is a positive non-zero integer. The low column addresses where the tag blocks are stored in the cache memory integrated circuit are equal to K or multiples of K. For example, in the embodiment of FIG. 3, K equals 7, because the tag blocks are stored at a low column address of 7.

The quotient of the division performed by divide by K circuit 1701 is provided to register circuits 1702-1703 as signals Q0-Q26, respectively. Signals Q3-Q26 indicate the most significant bits in the quotient (i.e., 23 bits), and signals Q0-Q2 indicate the least significant bits in the quotient (i.e., 3 bits). Signals Q3-Q26 and Q0-Q2 are stored in register circuits 1702-1703, respectively. The remainder of the division performed by divide by K circuit 1701 is provided to register circuit 1704 as signals R0-R2. Signals R0-R2 are stored in register circuit 1704.

Register circuit 1702 outputs mapped address signals ATHS, ARS, AGS, and ABS. Mapped address signals ATHS, ARS, AGS, and ABS identify mapped addresses ATH, AR, AG, and AB, respectively. Mapped address signals ATHS, ARS, AGS, and ABS have the same values as signals Q3-Q26.

Register circuit 1703 outputs mapped address signals ACHS, which identify mapped address ACH. Mapped address signals ACHS have the same values as signals Q0-Q2. Register circuit 1704 outputs mapped address signals ACLS, which identify mapped address ACL. Mapped address signals ACLS have the same values as signals R0-R2.

Figure 18:
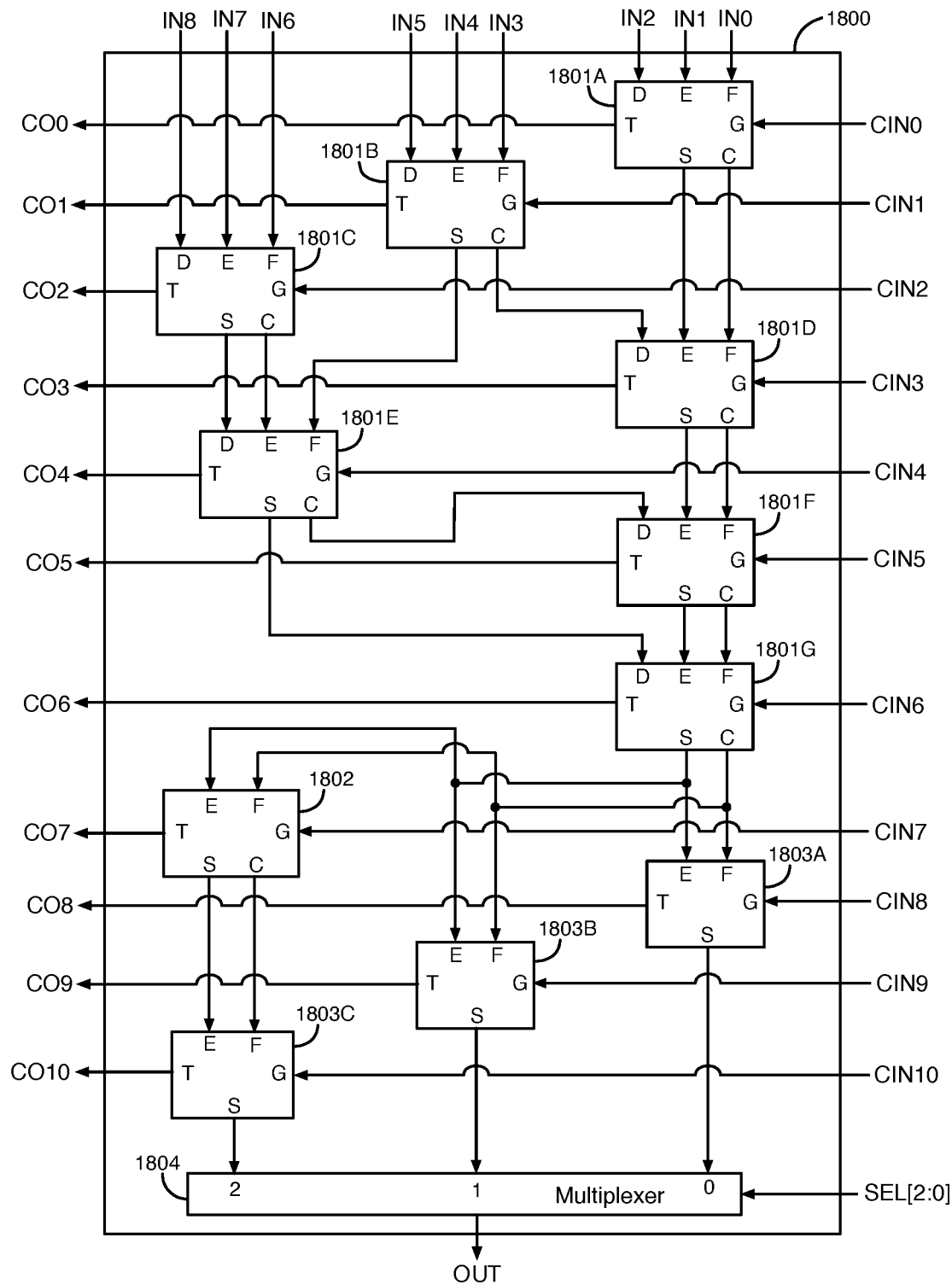
FIG. 18 illustrates a divider circuit.
Figure 20B:
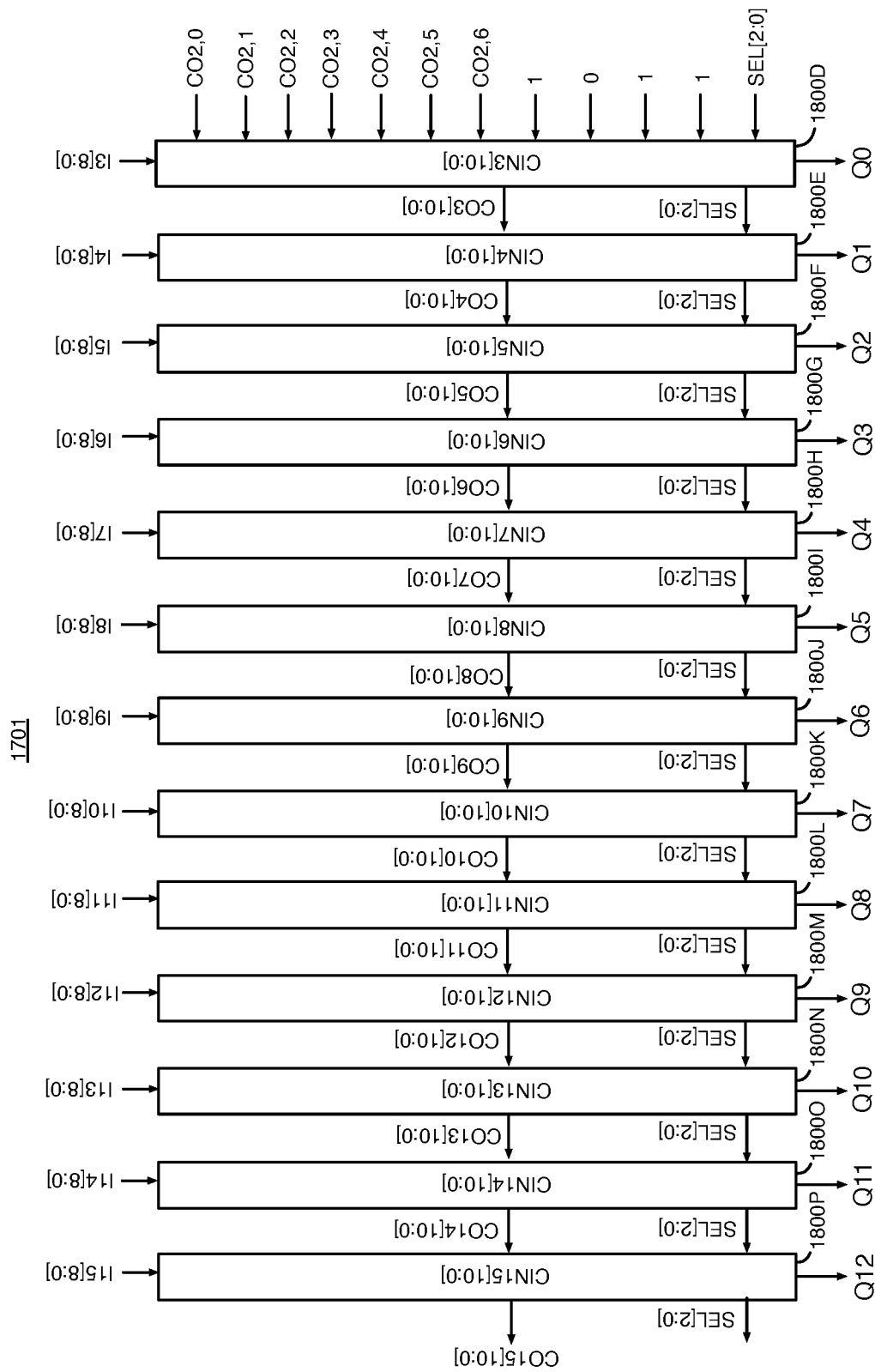
Figure 20C:
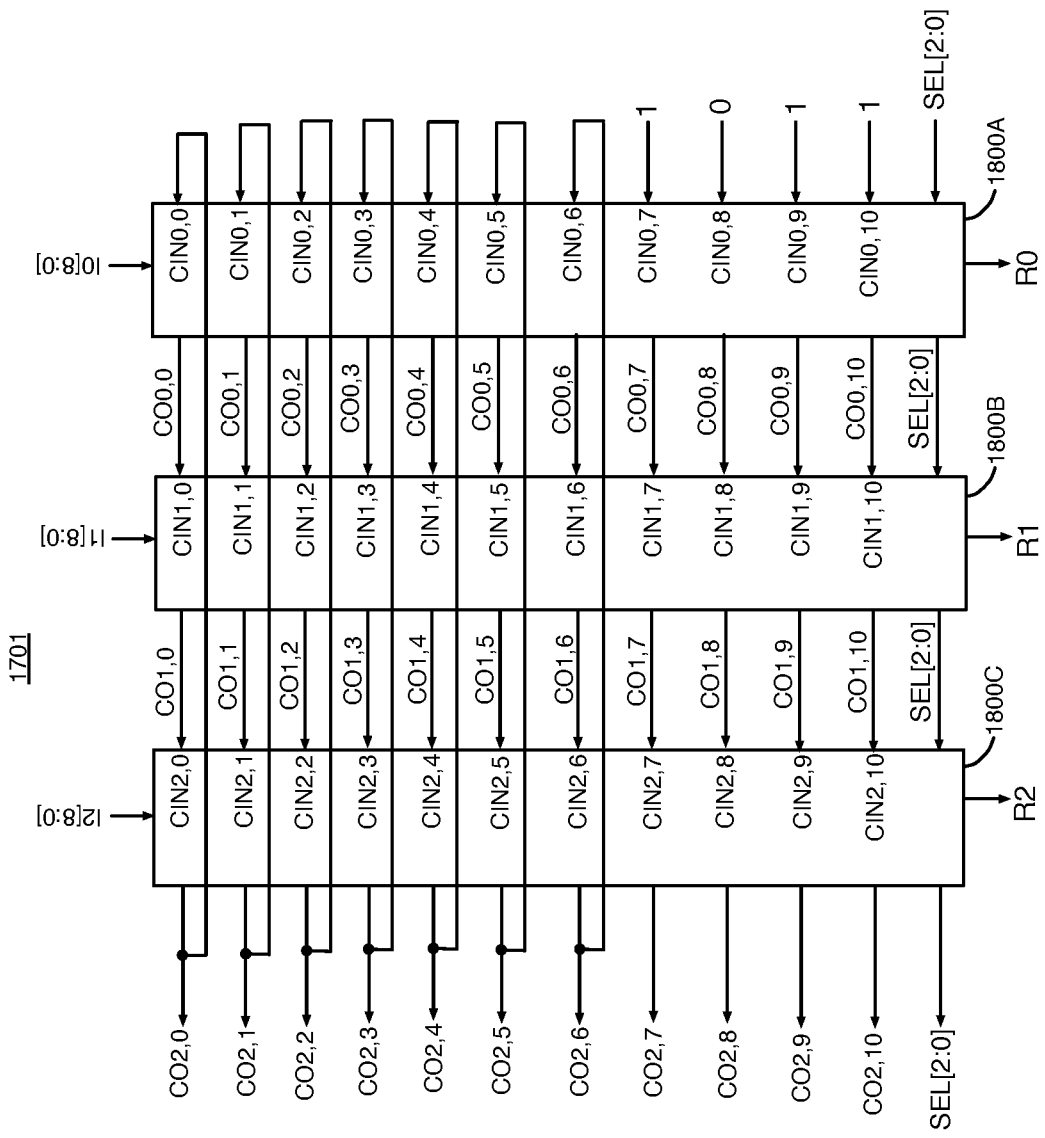

FIG. 18 illustrates a divider circuit 1800. Divide by K circuit 1701 in FIG. 17 includes multiple divider circuits 1800, as shown in FIGS. 20A-20C, which are described below. As shown in FIG. 18, divider circuit 1800 includes logic circuits 1801A-1801G, 1802, 1803A-1803C, and multiplexer circuit 1804. Logic circuits 1801A-1801G, 1802, and 1803A-1803C receive carry input signals CIN0-CIN10 at their G inputs, respectively. Input signals IN0-IN8 are provided to the F, E, and D inputs of logic circuit 1801A, to the F, E, and D inputs of logic circuit 1801B, and to the F, E, and D inputs of logic circuit 1801C, respectively. Output signals generated at the S and C outputs of logic circuits 1801A-1801G and 1802 are provided to D, E, and F inputs of logic circuits 1801D-1801G, 1802, and 1803A-1803C, as shown in FIG. 18.

The output signals generated at the S outputs of logic circuits 1803A-1803C are provided to the 0-2 inputs, respectively, of multiplexer circuit 1804. Three select signals SEL[2:0] are provided to select inputs of multiplexer circuit 1804. Multiplexer circuit 1804 selects one of the output signals from the S outputs of logic circuits 1803A-1803C as output signal OUT based on select signals SEL[2:0]. Carry output signals CO0-CO10 are generated at the T outputs of logic circuits 1801A-1801G, 1802, and 1803A-1803C, respectively.

Figure 19A:
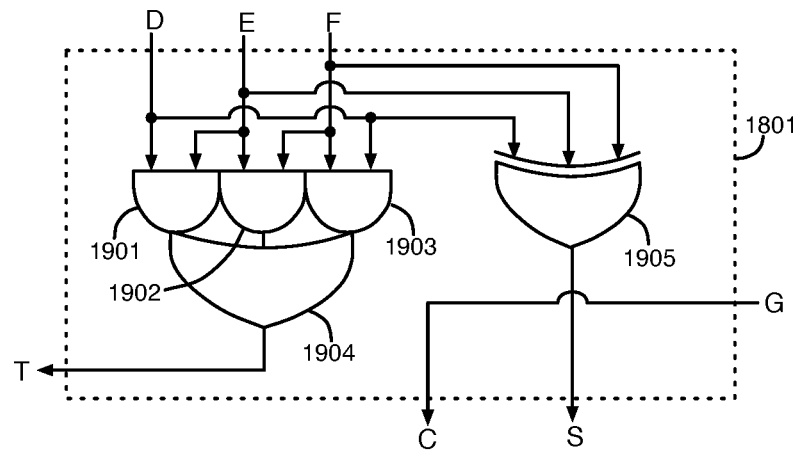
FIGS. 19A-19C illustrate logic circuits in the divider circuit of FIG. 18.

FIG. 19A illustrates a logic circuit 1801. Each of the logic circuits 1801A-1801G shown in FIG. 18 has the structure of logic circuit 1801 shown in FIG. 19A. Logic circuit 1801 includes AND gates 1901-1903, OR gate 1904, and XOR gate 1905. Input signals at the D, E, and F inputs of logic gate 1801 are provided to inputs of AND gates 1901-1903 and to the inputs of XOR gate 1905 as shown in FIG. 19A. The output signals of AND gates 1901-1903 are provided to inputs of OR gate 1904. The output signal of OR gate 1904 is provided to the T output of logic circuit 1801. The output signal of XOR gate 1905 is provided to the S output of logic circuit 1801. The signal at the G input of logic circuit 1801 is provided to the C output of logic circuit 1801.

Figure 19B:
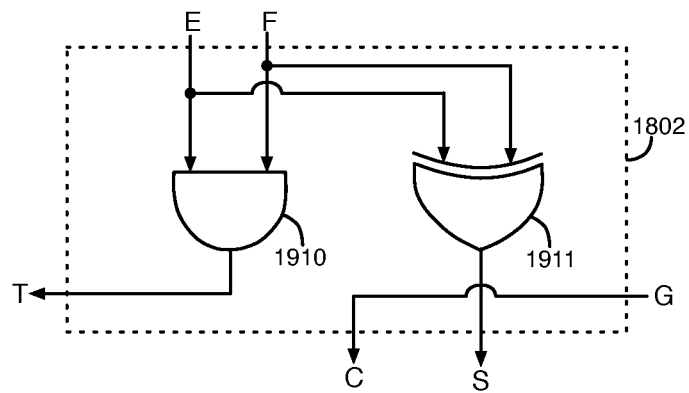

FIG. 19B illustrates details of logic circuit 1802 shown in FIG. 18. Logic circuit 1802 includes AND gate 1910 and XOR gate 1911. Input signals at the E and F inputs of logic circuit 1802 are provided to inputs of AND gate 1910 and to inputs of XOR gate 1911. The output signal of AND gate 1910 is provided to the T output of logic circuit 1802. The output signal of XOR gate 1911 is provided to the S output of logic circuit 1802. The input signal at the G input of logic circuit 1802 is provided to the C output of logic circuit 1802.

Figure 19C:
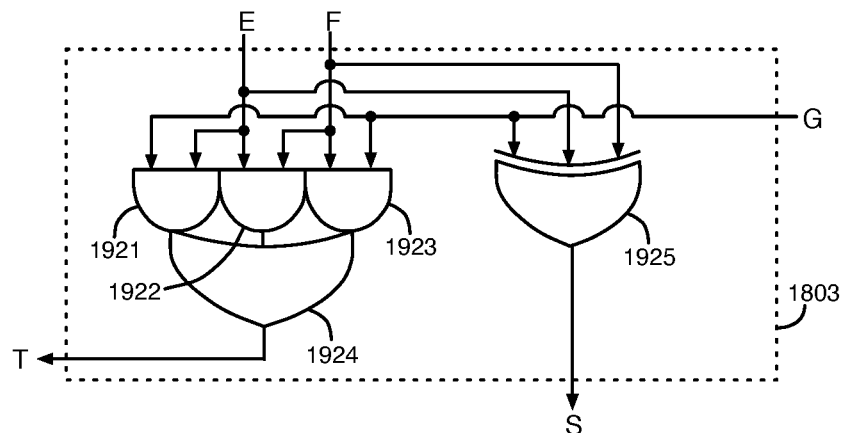

FIG. 19C illustrates a logic circuit 1803. Each of the logic circuits 1803A-1803C shown in FIG. 18 has the structure of logic circuit 1803 shown in FIG. 19C. Logic circuit 1803 includes AND gates 1921-1923, OR gate 1924, and XOR gate 1925. Input signals at the E, F, and G inputs of logic circuit 1803 are provided to inputs of AND gates 1921-1923 and to inputs of XOR gate 1925 as shown in FIG. 19C. The output signals of AND gates 1921-1923 are provided to inputs of OR gate 1924. The output signal of OR gate 1924 is provided to the T output of logic circuit 1803. The output signal of XOR gate 1925 is provided to the S output of logic circuit 1803.

FIGS. 20A-20C illustrate details of divide by K circuit 1701 shown in FIG. 17. Divide by K circuit 1701 includes divider circuits 1800A-1800C shown in FIG. 20C, divider circuits 1800D-1800P shown in FIG. 20B, and divider circuits 1800Q-1800Z and 1800AA-1800DD shown in FIG. 20A. Each of divider circuits 1800A-1800Z and 1800AA-1800DD shown in FIGS. 20A-20C has the structure of divider circuit 1800 shown in FIG. 18.

Input signals I0[8:0]-I129[8:0] are provided to inputs of divider circuits 1800A-1800Z and 1800AA-1800DD, respectively. Input signals I0[8:0]-I129[8:0] shown in FIGS. 20A-20C correspond to the input signals IN0-IN8 shown in FIG. 18 in divider circuits 1800A-1800Z and 1800AA-1800DD, respectively. Input signals I0[8:0]-I129[8:0] are based on signals PHY1, which indicate the physical address for the read or write transaction. Table 1 below shows examples of the input signals I0[8:0]-I129[8:0] for an embodiment in which K equals 7 and divide by K circuit 1701 divides the physical address by 7 to generate signals R0-R2 and Q0-Q26. In this embodiment, signals PHY1 have 27 signals that are referred to as signals P4-P30 in Table 1.

TABLE 1

| | IN0 | IN1 | IN2 | IN3 | IN4 | IN5 | IN6 | IN7 | IN8 |
|---|---|---|---|---|---|---|---|---|---|
| I0  | P4 | P7 | P10 | P13 | P16 | P19 | P22 | P25 | P28 |
| I1  | P5 | P8 | P11 | P14 | P17 | P20 | P23 | P26 | P29 |
| I2  | P6 | P9 | P12 | P15 | P18 | P21 | P24 | P27 | P30 |
| I3  | 0  | P7 | P10 | P13 | P16 | P19 | P22 | P25 | P28 |
| I4  | 0  | P8 | P11 | P14 | P17 | P20 | P23 | P26 | P29 |
| I5  | 0  | P9 | P12 | P15 | P18 | P21 | P24 | P27 | P30 |
| I6  | 0  | 0  | P10 | P13 | P16 | P19 | P22 | P25 | P28 |
| I7  | 0  | 0  | P11 | P14 | P17 | P20 | P23 | P26 | P29 |
| I8  | 0  | 0  | P12 | P15 | P18 | P21 | P24 | P27 | P30 |
| I9  | 0  | 0  | 0  | P13 | P16 | P19 | P22 | P25 | P28 |
| I10 | 0  | 0  | 0  | P14 | P17 | P20 | P23 | P26 | P29 |
| I11 | 0  | 0  | 0  | P15 | P18 | P21 | P24 | P27 | P30 |
| I12 | 0  | 0  | 0  | 0  | P16 | P19 | P22 | P25 | P28 |
| I13 | 0  | 0  | 0  | 0  | P17 | P20 | P23 | P26 | P29 |
| I14 | 0  | 0  | 0  | 0  | P18 | P21 | P24 | P27 | P30 |
| I15 | 0  | 0  | 0  | 0  | 0  | P19 | P22 | P25 | P28 |
| I16 | 0  | 0  | 0  | 0  | 0  | P20 | P23 | P26 | P29 |
| I17 | 0  | 0  | 0  | 0  | 0  | P21 | P24 | P27 | P30 |
| I18 | 0  | 0  | 0  | 0  | 0  | 0  | P22 | P25 | P28 |
| I19 | 0  | 0  | 0  | 0  | 0  | 0  | P23 | P26 | P29 |
| I20 | 0  | 0  | 0  | 0  | 0  | 0  | P24 | P27 | P30 |
| I21 | 0  | 0  | 0  | 0  | 0  | 0  | 0  | P25 | P28 |
| I22 | 0  | 0  | 0  | 0  | 0  | 0  | 0  | P26 | P29 |
| I23 | 0  | 0  | 0  | 0  | 0  | 0  | 0  | P27 | P30 |
| I24 | 0  | 0  | 0  | 0  | 0  | 0  | 0  | 0  | P28 |
| I25 | 0  | 0  | 0  | 0  | 0  | 0  | 0  | 0  | P29 |
| I26 | 0  | 0  | 0  | 0  | 0  | 0  | 0  | 0  | P30 |
| I27 | 0  | 0  | 0  | 0  | 0  | 0  | 0  | 0  | 0  |
| I28 | 0  | 0  | 0  | 0  | 0  | 0  | 0  | 0  | 0  |
| I29 | 0  | 0  | 0  | 0  | 0  | 0  | 0  | 0  | 0  |

Carry input signals CIN0,0-CIN0,10, CIN1,0-CIN1,10, and CIN2,0-CIN2,10 shown in FIG. 20C correspond to carry input signals CIN0-CIN10 shown in FIG. 18 in divider circuits 1800A-1800C, respectively. Carry input signals CIN3[10:0]-CIN29[10:0] shown in FIGS. 20A-20B correspond to carry input signals CIN0-CIN10 shown in FIG. 18 in divider circuits 1800D-1800Z and 1800AA-1800DD, respectively.

Carry output signals CO0,0-CO0,10, CO1,0-CO1,10, and CO2,0-CO2,10 in FIG. 20C correspond to carry output signals CO0-CO10 shown in FIG. 18 in divider circuits 1800A-1800C, respectively. Carry output signals CO3[10:0]-CO29[10:0] in FIGS. 20A-20B correspond to carry output signals CO0-CO10 shown in FIG. 18 in divider circuits 1800D-1800Z and 1800AA-1800DD, respectively.

Carry output signals CO2,0-CO2,6 of divider circuit 1800C are fed back to inputs of divider circuit 1800A as carry input signals CIN0,0-CIN06, respectively, as shown in FIG. 20C. Carry input signals CIN0,7-CIN0,10 have fixed digital values of 1, 0, 1, and 1, respectively. Carry output signal CO2,7 is not provided as an input signal to any of divider circuits 1800A-1800Z or 1800AA-1800DD. Carry input signals CIN3,7, CIN3,8, CIN3,9, and CIN3,10 of divider circuit 1800D have fixed digital values of 1, 0, 1, and 1, respectively.

The carry output signals CO0,0-CO0,10 of divider circuit 1800A are provided to inputs of divider circuit 1800B as carry input signals CIN1,0-CIN1,10, respectively. The carry output signals CO1,0-CO1,10 of divider circuit 1800B are provided to inputs of divider circuit 1800C as carry input signals CIN2,0-CIN2,10, respectively. The carry output signals CO2,0-CO2,6 of divider circuit 1800C are provided to inputs of divider circuit 1800D as carry input signals CIN3,0-CIN3,6, respectively. The carry output signals CO3[10:0]-CO28[10:0] of divider circuits 1800D-1800Z and 1800AA-1800CC are provided to inputs of divider circuits 1800E-1800Z and 1800AA-1800DD as carry input signals CIN4[10:0]-CIN29[10:0], respectively.

Select signals SEL[2:0] are provided to inputs of multiplexer circuit 1804 in each of divider circuits 1800A-1800Z and 1800AA-1800DD. Select signals SEL[2:0] include 3 select signals SEL0, SEL1, and SEL0. Select signal SEL0 is generated by taking the logical inverse of the carry output signal CO2,8 of divider circuit 1800C. Select signals SEL1-SEL2 are generated based on equations (1)-(2) shown below.

$$\text{SEL1} = CO2,8 * (CO2,9 + /CO2,10) \qquad (1)$$

$$\text{SEL2} = CO2,8 * /CO2,9 * CO2,10 \qquad (2)$$

In equations (1)-(2), the * operator refers to a Boolean AND function, and the +operator refers to a Boolean OR function. In equation (1), /CO2,10 refers to the logical inverse of the carry output signal CO2,10 of divider circuit 1800C. In equation (2), /CO2,9 refers to the logical inverse of the carry output signal CO2,9 of divider circuit 1800C.

Output signals R0-R2 and Q0-Q26 shown in FIGS. 20A-20C correspond to output signal OUT in FIG. 18 in divider circuits 1800A-1800Z and 1800AA-1800DD, respectively. Output signals R0-R2 are the remainder of the division performed by divide by K circuit 1701. Output signals Q0-Q26 are the quotient of the division performed by divide by K circuit 1701.

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. A device comprising:
   at least one memory device including
      a first bank group of memory storage locations;

a second bank group of memory storage locations;
interface circuitry coupled to a common bus, the interface circuitry responsive to a memory access command received via the common bus to select one of the first bank group of memory storage locations or the second bank group of memory storage locations for a memory access, the selection identified by a unique bank group address;
wherein access to the first bank group of storage locations involves an access for first data; and
wherein access to the second bank group of storage locations involves an access for first tag information associated with the first data.

2. The according to claim 1, wherein the interface circuitry includes a first interface circuit dedicated to the first bank group, and a second interface circuit dedicated to the second bank group.

3. The device according to claim 2, wherein:
the first interface circuit includes a first address interface to receive first bank group address information and a first data interface; and
the second interface circuit includes a second address interface to receive second bank group address information and a second data interface.

4. The device according to claim 1, wherein:
the first tag information includes information at least partially identifying the location of the data.

5. The device according to claim 1, wherein the storage locations comprise dynamic random access memory (DRAM) storage locations.

6. The device according to claim 1, wherein each bank group includes multiple banks, each bank being selectable via a bank address.

7. The device according to claim 1, wherein:
a subsequent access to the first bank group of storage locations involves an access for second tag information; and
a subsequent access to the second bank group of storage locations involves an access for second data associated with the second tag information.

8. An integrated circuit (IC) chip comprising:
means for receiving a memory access command;
means for selecting one of a first bank group of memory storage locations or a second bank group of memory storage locations for a memory access in response to the memory access command, the selecting based on a unique bank group address;
wherein the means for selecting the first bank group of storage locations is responsive to an access for first data; and
wherein the means for selecting the second bank group of storage locations is responsive to an access for first tag information associated with the first data.

9. The IC chip according to claim 8, wherein the storage locations comprise dynamic random access memory (DRAM) storage locations.

10. The IC chip according to claim 8, wherein:
the first tag information includes information at least partially identifying the location of the data.

11. The IC chip according to claim 8, wherein:
the means for selecting the first bank group comprises a first interface circuit dedicated to the first bank group; and
the means for selecting the second bank group comprises a second interface circuit dedicated to the second bank group.

12. The IC chip according to claim 11, wherein:
the first interface circuit selects the first bank group in response to receiving first bank group address information specifying the first bank group; and
the second interface circuit selects the second bank group in response to receiving second bank group address information specifying the second bank group.

13. The IC chip according to claim 8, wherein each bank group includes multiple banks, the method further comprising:
means for selecting a given bank within each bank group via a unique bank address.

14. The IC chip according to claim 8, further comprising:
means for receiving a second access command;
means for subsequently accessing the first bank group of storage locations for second tag information; and
means for subsequently accessing the second bank group of storage locations for second data associated with the second tag information.

15. A method of operation in a device having at least one memory device coupled to a common bus, the method comprising:
receiving a memory access command via the common bus,
in response to the memory access command, selecting one of a first bank group of memory storage locations or a second bank group of memory storage locations for a memory access, the selecting based on a unique bank group address;
wherein selecting the first bank group of storage locations is based on an access for first data; and
wherein selecting the second bank group of storage locations is based on an access for first tag information associated with the first data.

16. The method according to claim 15, wherein:
the first tag information includes information at least partially identifying the location of the data.

17. The method according to claim 15, wherein:
the selecting of the first bank group is carried out by a first interface circuit dedicated to the first bank group; and
the selecting of the second bank group is carried out by a second interface circuit dedicated to the second bank group.

18. The method according to claim 17, wherein:
the selecting of the first bank group is responsive to the first interface circuit receiving first bank group address information specifying the first bank group; and
the selecting of the second bank group is responsive to the second interface circuit receiving second bank group address information specifying the second bank group.

19. The method according to claim 15, further comprising:
subsequently accessing the first bank group of storage locations for second tag information; and
subsequently accessing the second bank group of storage locations for second data associated with the second tag information.

20. The method according to claim 15, wherein each bank group includes multiple banks, the method further comprising:
selecting a given bank within each bank group via a unique bank address.

* * * * *